(12) United States Patent
Nakamura et al.

(10) Patent No.: US 12,254,161 B2
(45) Date of Patent: Mar. 18, 2025

(54) TOUCH PANEL DEVICE

(71) Applicant: FUJITSU COMPONENT LIMITED, Tokyo (JP)

(72) Inventors: Yuta Nakamura, Tokyo (JP); Yutaka Ueno, Tokyo (JP); Masaya Morohashi, Tokyo (JP); Takuya Ozawa, Tokyo (JP); Hideyuki Hagihara, Tokyo (JP); Yuji Makiuchi, Tokyo (JP)

(73) Assignee: FUJITSU COMPONENT LIMITED, Tokyo (JP)

( * ) Notice: Subject to any disclaimer, the term of this patent is extended or adjusted under 35 U.S.C. 154(b) by 0 days.

(21) Appl. No.: 18/594,269

(22) Filed: Mar. 4, 2024

(65) Prior Publication Data
US 2024/0201818 A1 Jun. 20, 2024

Related U.S. Application Data

(62) Division of application No. 17/478,296, filed on Sep. 17, 2021, now Pat. No. 11,947,766.

(30) Foreign Application Priority Data

Nov. 2, 2020 (JP) ................................ 2020-183690
Dec. 24, 2020 (JP) ................................ 2020-215062
Jul. 26, 2021 (JP) ................................ 2021-121591

(51) Int. Cl.
*G06F 3/045* (2006.01)
*G06F 3/041* (2006.01)
*H03K 17/96* (2006.01)

(52) U.S. Cl.
CPC .......... *G06F 3/045* (2013.01); *G06F 3/04164* (2019.05); *H03K 17/9645* (2013.01)

(58) Field of Classification Search
CPC .. G06F 3/045; G06F 3/04164; G06F 3/04166; G06F 3/04186; G06F 3/0416; H03K 17/9645; H03K 17/9647
See application file for complete search history.

(56) References Cited

U.S. PATENT DOCUMENTS 6,088,024 A 7/2000 Yamagata
2009/0184931 A1 7/2009 Yang
(Continued)

FOREIGN PATENT DOCUMENTS

JP 11-003168 1/1999
JP 2002-023955 1/2002
(Continued)

OTHER PUBLICATIONS

Chinese Office Action issued in counterpart Chinese Application No. 202111263851.1 dated Jun. 17, 2024.
(Continued)

*Primary Examiner* — Patrick N Edouard
*Assistant Examiner* — Joseph P Fox
(74) *Attorney, Agent, or Firm* — STAAS & HALSEY LLP

(57) ABSTRACT

A touch panel device includes a first conductive film having first and second regions, at least a part of the first conductive film between the first and the second regions being removed, a second conductive film laminated on the first conductive film across a gap, first and second terminals that output signals, a first electrode electrically connected to the first terminal, and a second electrode facing the first electrode across the first region. A switch may electrically connect the first conductive film to the second conductive film, in the second region.

2 Claims, 41 Drawing Sheets

(56) References Cited

U.S. PATENT DOCUMENTS

| | | |
|---|---|---|
| 2009/0314551 A1 | 12/2009 | Nakajima |
| 2011/0267301 A1 | 11/2011 | Shimizu |
| 2012/0268421 A1 | 10/2012 | Suetomi |

FOREIGN PATENT DOCUMENTS

| | | |
|---|---|---|
| JP | 2005-251105 | 9/2002 |
| JP | 2009-048559 | 3/2009 |
| JP | 2019-086811 | 6/2019 |

OTHER PUBLICATIONS

U.S. Restriction Requirement issued in U.S. Appl. No. 17/478,296 dated Nov. 16, 2022.
U.S. Non-Final Office Action issued in U.S. Appl. No. 17/478,296 dated Jan. 25, 2023.
U.S. Final Office Action issued in U.S. Appl. No. 17/478,296 dated Jul. 26, 2023.
U.S. Advisory Action issued in U.S. Appl. No. 17/478,296 dated Oct. 12, 2023.
U.S. Notice of Allowance issued in U.S. Appl. No. 17/478,296 dated Dec. 5, 2023.
U.S. Appl. No. 17/478,296, filed Sep. 17, 2021, Yuta Nakamura et al., Fujitsu Component Limited.

TOUCH PANEL DEVICE

CROSS-REFERENCE TO RELATED APPLICATION

This application is a divisional of U.S. patent application Ser. No. 17/478,296, filed Sep. 17, 2021 which is based upon and claims the benefit of priority of the prior Japanese Patent Applications No. 2020-183690 filed on Nov. 2, 2020, No. 2020-215062 filed on Dec. 24, 2020, and No. 2021-121591 filed on Jul. 26, 2021, the entire contents of which are all incorporated herein by reference.

FIELD

A certain aspect of the embodiments is related to a touch panel device.

BACKGROUND

There is known a four-wire touch panel using a pair of conductive films facing each other, and having a touch input region and switches such as buttons (e.g., Patent Document 1: Japanese Laid-open Patent Publication No. 2009-48559, Patent Document 2: Japanese Laid-open Patent Publication No. 2005-251105, and Patent Document 3: Japanese Laid-open Patent Publication No. 2002-23955). It is also known that the touch input region and the switches are connected in series (for example, Patent Document 1).

SUMMARY

According to an aspect of the present invention, there is provided a touch panel device including: a first conductive film having a first region and a second region, at least a part of the first conductive film between the first region and the second region being removed; a second conductive film laminated on the first conductive film across a gap; a first terminal and a second terminal that output signals from the first conductive film; a first electrode provided on the first conductive film and electrically connected to the first terminal; a second electrode provided on the first conductive film and facing the first electrode across the first region; a first resistor provided on the first conductive film in the second region and having a pair of electrodes, the pair of electrodes facing each other across a first resistance region in the first conductive film, one of the pair of electrodes being electrically connected to the second electrode, the other of the pair of electrodes being electrically connected to the second terminal; and a first switch electrically connecting the first conductive film to the second conductive film, in the second region.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

By connecting the touch input region and the switches in series as in Patent Document 1, it is possible to reduce the number of routing circuits for the switches. However, in Patent Document 1, a resistor is not connected between an electrode in the touch input region, and the switch. Therefore, a difference in potential between a conductive film in the touch input region and the switch is small, so that the input to the touch input region and the input to the switch might be erroneously detected. As an example of suppressing this false detection, the switches and the resistors are connected in series with the conductive film in the touch input region on both of the upper and lower substrates. For this reason, wirings for connecting the conductive film and the switches, and the resistors are provided on both of the upper and lower substrates. In this way, the cost for suppressing the false detection increases.

It is an object of the present disclosure to provide a touch panel device capable of reducing the cost for suppressing the false detection.

Hereinafter, a description will be given of the present embodiments of the present disclosure with reference to the drawings.

First Embodiment

Figure 1:
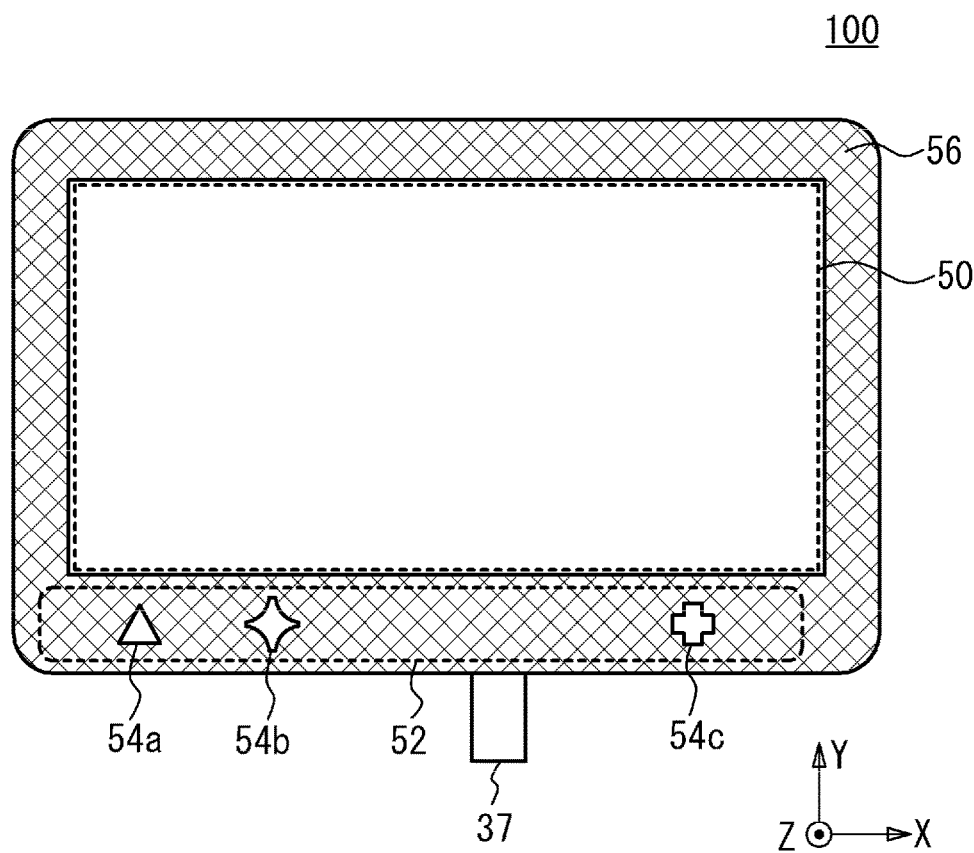
FIG. 1 is a plan view of a touch panel according to a first embodiment.

FIG. 1 is a plan view of a touch panel according to a first embodiment. Hereinafter, a direction in which a long side of a region 50 extends is an X direction (i.e., first direction), a direction in which a short side of the region 50 extends is a Y direction (i.e., an arrangement direction, or a second direction), a normal direction of the region 50 is a Z direction, and a +Z direction is upward. A touch panel 100 includes a frame portion 56. An image is displayed on a region surrounded by the frame portion 56. By touching any part of the region 50 with a contacted portion such as a finger, a user can input contact coordinates of the region 50 to a device including the touch panel 100. A region 52 is provided in the frame portion 56. The region 52 is provided with buttons 54a to 54c (i.e., switch). When the user touches any of the buttons 54a to 54c, the information about which of the buttons 54a to 54c is touched is input to the device including the touch panel 100. A FPC (Flexible printed circuits) 37 outputs a signal from the touch panel 100.

Figure 2A:
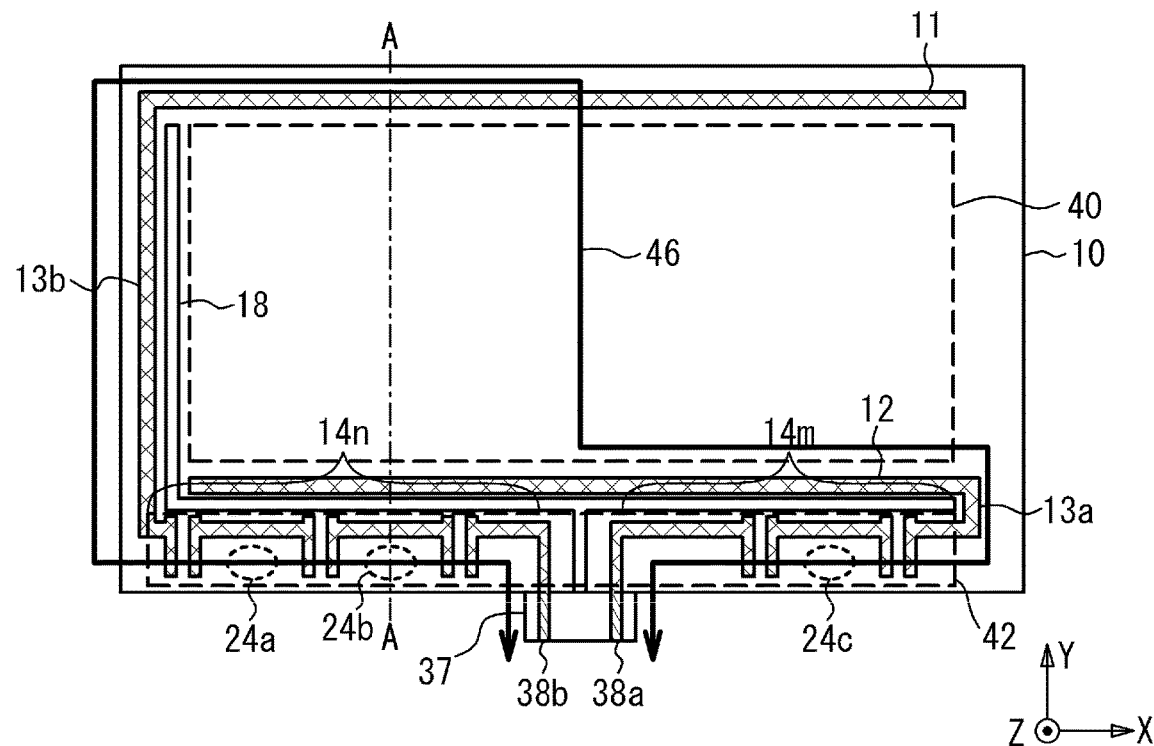
FIGS. 2A and 2B are plan views of a conductive film according to the first embodiment.
Figure 2B:
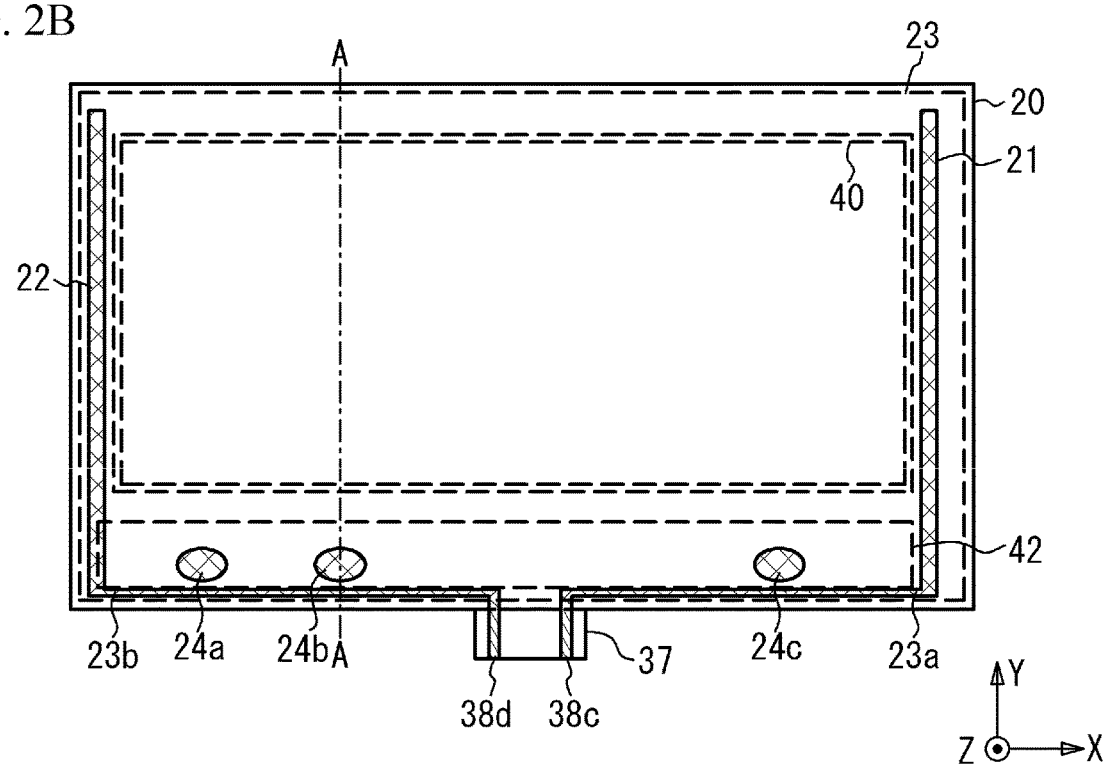
Figure 3:
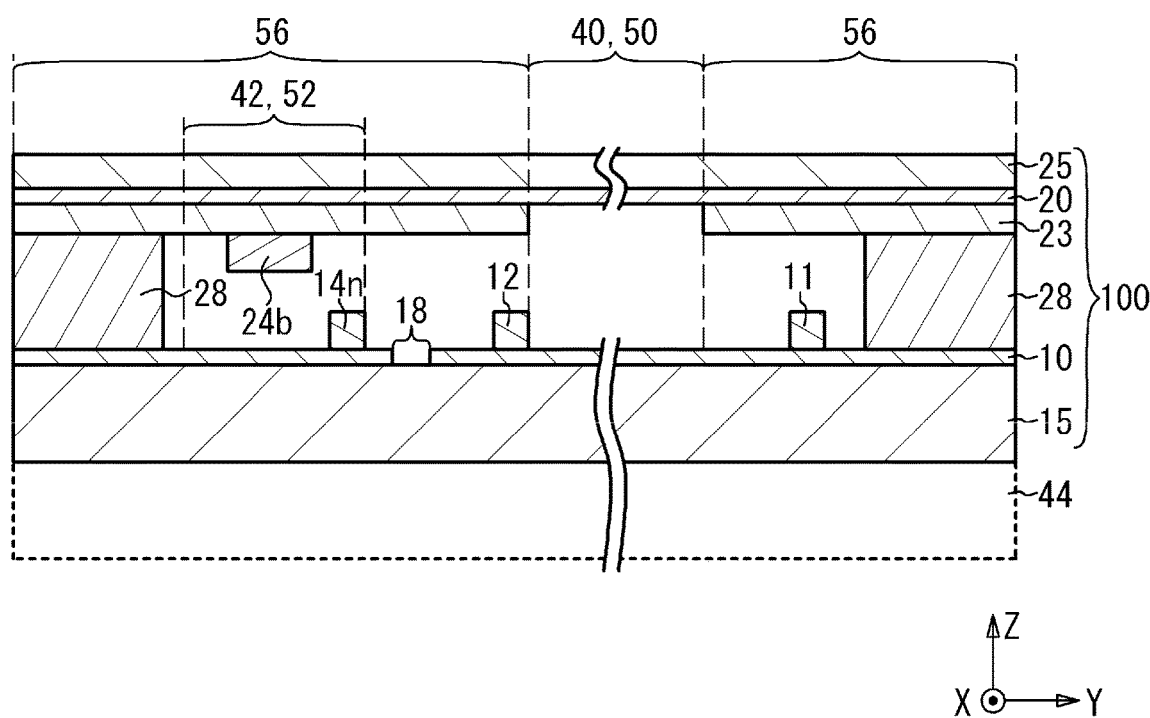
FIG. 3 is a cross-sectional view taken along line A-A of FIGS. 2A and 2B.

FIGS. 2A and 2B are plan views of a conductive film according to the first embodiment. FIG. 3 is a cross-sectional view taken along line A-A of FIGS. 2A and 2B. The regions 50 and 52 in FIG. 1 correspond to regions 40 and 42 in FIG. 2, respectively. The conductive film 10 (i.e., a first conductive film) is provided on an upper surface of a substrate 15. The regions 40 and 42 are arranged in the Y direction. Electrodes 11, 12, 13a, 13b, 14m and 14n are provided on an upper surface of the conductive film 10. The FPC 37 is provided with a terminal 38a (i.e., a first terminal) and a terminal 38b (i.e., a second terminal).

An electrode 11 (i.e., a second electrode) extends in the X direction along a +Y side of the conductive film 10. An electrode 12 is provided between the regions 40 and 42 and extends in the X direction. The electrode 12 (i.e., a first electrode) faces the electrode 11 in the Y direction, and the electrodes 11 and 12 are provided so as to sandwich the region 40 (i.e., a first region). The electrodes 14m and 14n are provided in the region 42 (i.e., a second region). The electrode 14m includes a plurality of electrodes described later, one end of the electrode 14m is connected to the terminal 38a, and the other end of the electrode 14m is connected to the electrode 12 via the electrode 13a. The electrode 14n includes a plurality of electrodes described later, one end of the electrode 14n is connected to the terminal 38b, and the other end of the electrode 14n is connected to the electrode 11 via the electrode 13b. A slit 18 in which the conductive film 10 is removed is provided between the regions 40 and 42, between the region 40 and the electrode 13b, and between the electrodes 14m and 14n. The slit 18 is formed by, for example, irradiating a laser beam. When a voltage is applied between the terminals 38a and 38b, a current flows to the terminal 38b through the terminal 38a, the electrode 14m, the electrode 13a, the electrode 12, the region 40, the electrode 11, the electrode 13b and the electrode 14n, as illustrated in a series path 46 with bold arrows.

A substrate 25 is provided above the substrate 15. A conductive film 20 (i.e., a second conductive film) is provided on a lower surface of the substrate 25. The conductive film 20 is laminated with at least regions 40 and 42 of the conductive film 10 with a gap interposed therebetween. A decorative layer 23 is provided on the lower surface of the conductive film 20. The decorative layer 23 corresponds to the frame portion 56 in FIG. 1. Electrodes 21, 22, 23a, 23b and 24a to 24c are provided on the lower surface of the decorative layer 23. The FPC 37 is provided with terminals 38c and 38d. The electrodes 21 and 22 extend in the Y direction and are provided so as to sandwich the region 40. The electrode 21 is provided along the side in the +Z direction of the conductive film 20, and the electrode 22 is provided along the side in the −X direction of the conductive film 20. The terminal 38c is connected to the electrode 21 via the electrode 23a. The terminal 38d is connected to the electrode 22 via the electrode 23b.

The peripheral edge of the conductive film 10 and the peripheral edge of the decorative layer 23 are joined by a bonding layer 28. The bonding layer 28 is a resin such as double-sided tape. The bonding layer 28 may be a double-sided tape that bonds an insulating layer provided on the upper surface of the conductive film 10 and an insulating layer provided on the lower surface of the decorative layer 23. The bonding layer 28 forms a gap between the conductive films 10 and 20 and between the conductive film 10 and the decorative layer 23. The substrate 15 is, for example, a glass substrate which is transparent and has rigidity. The substrate 25 is, for example, a resin film such as PET (Polyethylene terephthalate), which is transparent and has flexibility. Each of the conductive films 10 and 20 is, for example, an ITO (Indium Tin Oxide) which is transparent and have conductivity. The electrodes 11, 12, 13a, 13b, 14m, 14n, 21, 22, 23a and 23b are metal layers such as a silver layer, a gold layer or a copper layer, and are made of materials having a higher electrical conductivity than the conductive films 10 and 20. The electrodes 24a to 24c are made of a conductive material such as a metal layer or carbon, and a material having an electric conductivity close to or higher than the electric conductivity of the conductive films 10 and 20. When the electrodes 24a to 24c are made of a silver layer or the like, there is a concern that migration may occur. This concern can be eliminated by forming the electrodes 24a to 24c with carbon. The decorative layer 23 is a resin containing carbon, for example, is opaque, and has flexibility and conductivity. The upper surface of the decorative layer 23 is decorated with characters, symbols, patterns, and the like.

A display 44 is provided below the substrate 15, for example. When the user views the touch panel 100 from above, the image of the display 44 can be visually recognized in the regions 40 and 50. In the regions 42 and 52, the upper surface of the decorative layer 23 can be visually recognized. The electrodes 11, 12, 13a, 13b, 14m, 14n, 21, 22, 23a and 23b are hidden behind the decorative layer 23 and cannot be visually recognized. Since the substrate 25 is flexible, when the user touches the upper surface of the substrate 25 in the region 40, the conductive films 10 and 20 come into contact with each other. When the user touches any of the buttons 54a to 54c in the region 52 of FIG. 1, the conductive film 10 and any of the electrodes 24a to 24c come into contact with each other.

Figure 4:
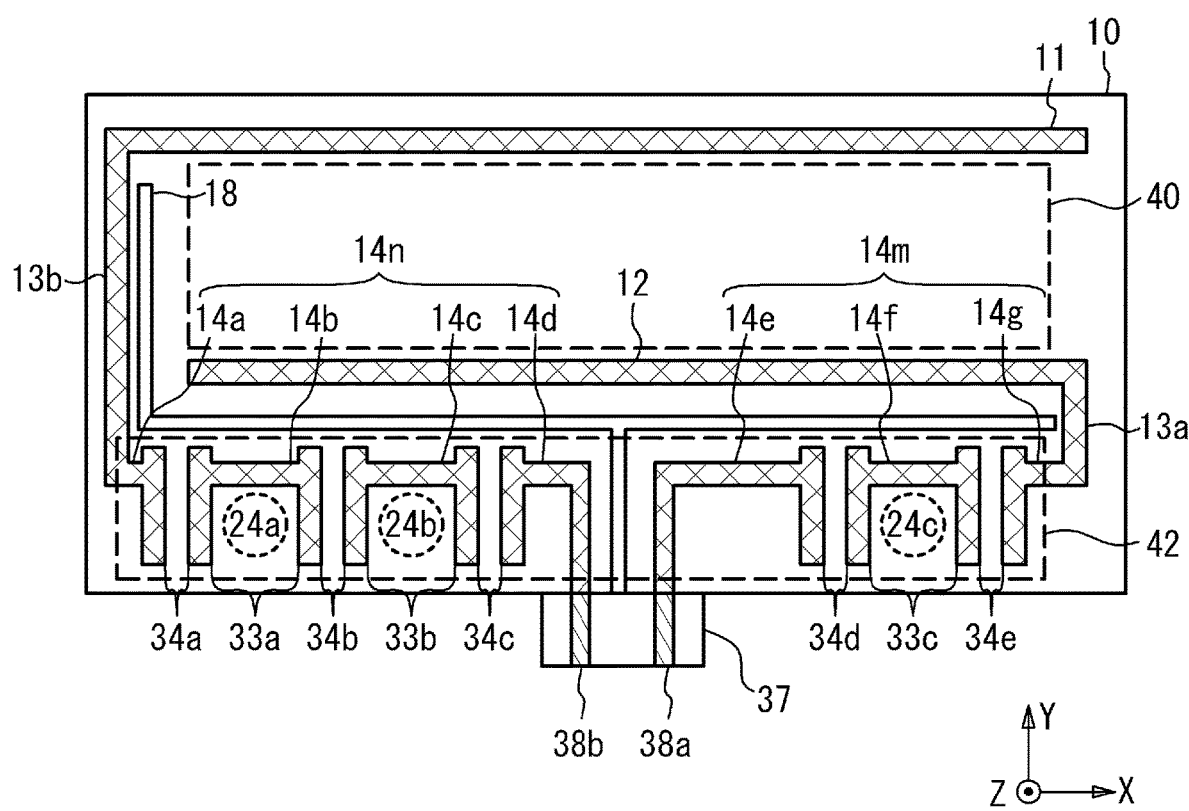
FIG. 4 is an enlarged plan view illustrating a vicinity of a region 42 of a conductive film 10.

FIG. 4 is an enlarged plan view illustrating a vicinity of the region 42 of the conductive film 10 according to the first embodiment. In FIG. 4, the vicinity of the region 42 is enlarged in the Y direction as compared with FIG. 2A. As illustrated in FIG. 4, the electrode 14n include electrodes 14a to 14d which are electrically connected via the conductive film 10. The electrode 14m include electrodes 14e to 14g which are electrically connected via the conductive film 10. Gaps 34a, 34b, 34c, 34d, and 34e are provided between the electrodes 14a and 14b, between the electrodes 14b and 14c, between the electrodes 14c and 14d, between the electrodes 14e and 14f, and between the electrodes 14f and 14g, respectively. Regions between gaps 34a and 34b, between gaps 34b and 34c, and between gaps 34d and 34e are regions 33a, 33b, and 33c, respectively. The current flowing between the terminals 38a and 38b flows through the conductive film 10 at the gaps 34a to 34e. Therefore, a voltage drop occurs due to a resistance component of the conductive film 10. Since the resistance components of the electrodes 14a to 14g are sufficiently lower than the resistance component of the conductive film 10, the voltage drop hardly occurs in the electrodes 14a to 14g. In the regions 33a to 33c, the locations where the electrodes 24a to 24c come into contact with the conductive film 10 are surrounded by three sides of the electrodes 14b, 14c and 14f, respectively. The potentials of the conductive film 10 surrounded by the electrodes 14b, 14c and 14f are approximately the potentials of the electrodes 14b, 14c and 14f, respectively. When the buttons 54a to 54c of FIG. 1 are pressed, the electrodes 24a to 24c come into contact with the conductive film 10 in the regions 33a to 33c. The electrodes 24a to 24c may come into contact with the electrodes 14b, 14c and 14f, respectively.

Figure 5:
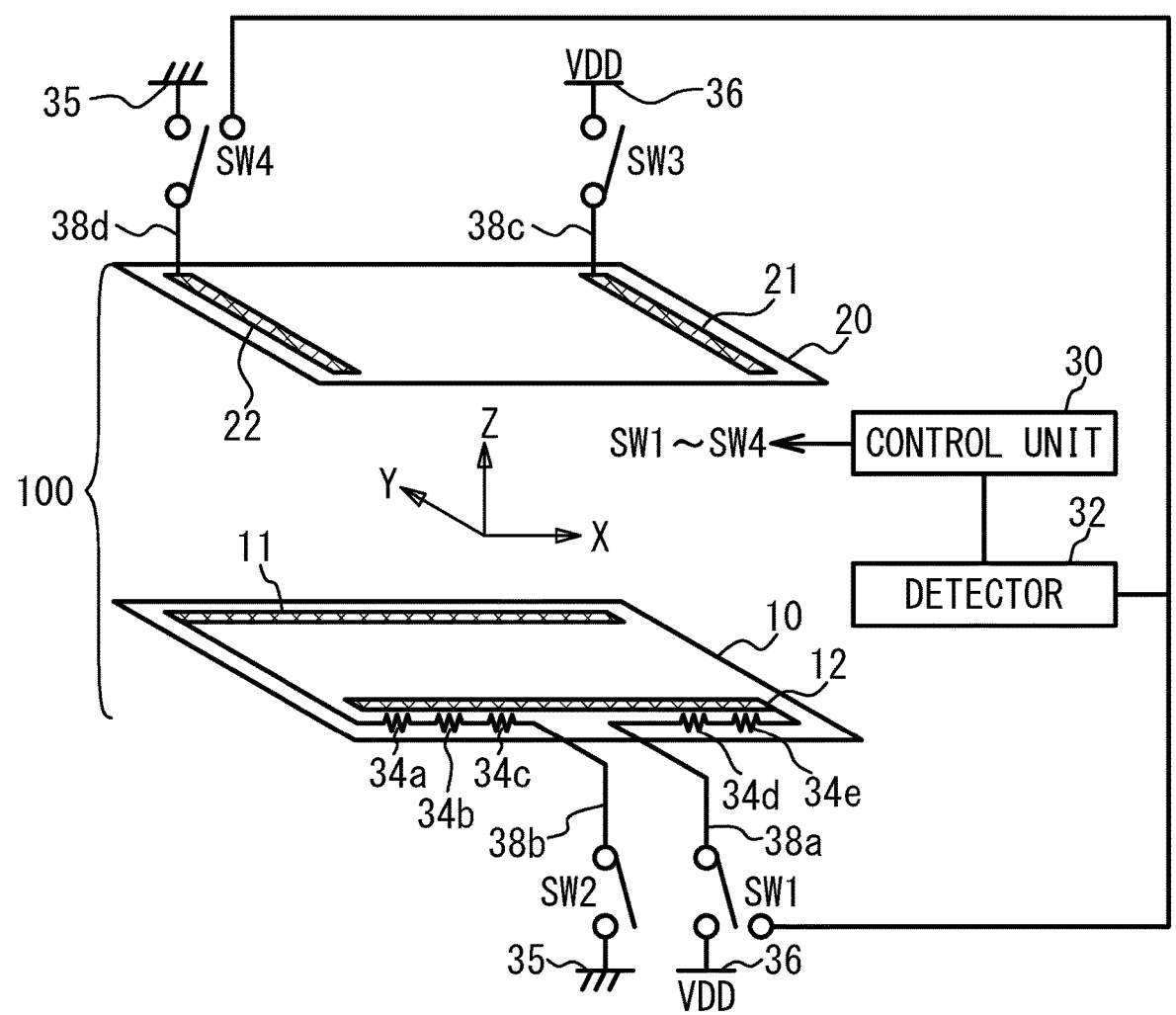
FIG. 5 is a schematic diagram of the touch panel device according to the first embodiment.

FIG. 5 is a schematic diagram of the touch panel device according to the first embodiment. As illustrated in FIG. 5, a touch panel device 102 includes the touch panel 100, a control unit 30, switches SW1 to SW4, and a detector 32. The control unit 30, the switches SW1 to SW4, and the detector 32 are provided, for example, below the display 44 in FIG. 3 (along the −Z direction). The terminals 38a to 38d are connected to the switches SW1 to SW4, respectively. The switch SW1 connects the terminal 38a to any one of a power supply 36 of the potential VDD and the detector 32. The switch SW2 connects the terminal 38b to a ground 35. The switch SW3 connects the terminal 38c to the power supply 36. The switch SW4 connects the terminal 38d to any one of the ground 35 and the detector 32. The detector 32 detects the voltages of the terminals 38a and 38d. The control unit 30 controls the switches SW1 to SW4 to acquire a voltage value detected from the detector 32. The control unit 30 detects the X and Y coordinates of the position (i.e., touch position) where the user touches the upper surface of the substrate 25 in the region 40, and the touch of the buttons 54a to 54c, based on the voltage value detected by the detector 32. The control unit 30 is, for example, a processor such as a CPU (Central Processing Unit), and functions as a detection unit or a detector in cooperation with software.

A detection method of the touch position will be described. First, the detection of the Y coordinate of the touch position in the region 40 and the detection of the touch of the buttons 54a to 54c will be described. The control unit 30 causes the switch SW1 to connect the terminal 38a to the power supply 36, the switch SW2 to connect the terminal 38b to the ground 35, the switch SW3 to float the terminal 38c, and the switch SW4 to connect the terminal 38d to the detector 32.

Figure 6:
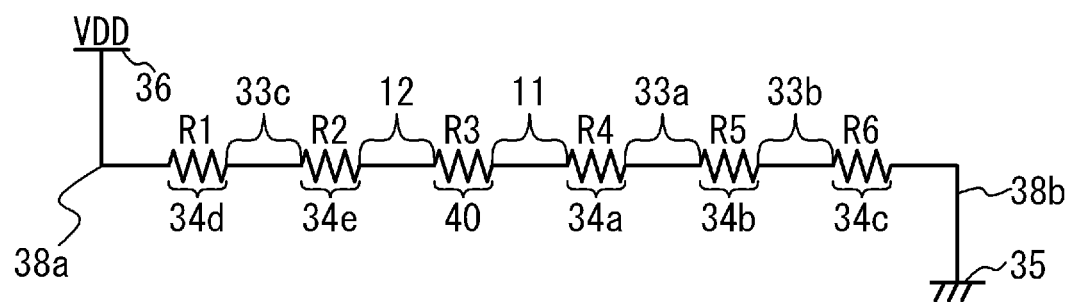
FIG. 6 is a diagram illustrating an equivalent circuit of the conductive film 10 according to the first embodiment.

FIG. 6 is a diagram illustrating an equivalent circuit of the conductive film 10 according to the first embodiment. FIG. 6 illustrates the equivalent circuit of the series path 46 from the terminal 38a to the terminal 38b in FIG. 2A. As illustrated in FIG. 6, resistors R1 to R6 are connected in series between the power supply 36 and the ground 35. The resistors R1, R2, R3, R4, R5 and R6 correspond to the resistance components of the conductive film 10 in the gaps 34d and 34e, the region 40, and the gaps 34a, 34b and 34c, respectively. A line between the power supply 36 and the resistor R1 corresponds to the terminal 38a, a line between the resistors R1 and R2 corresponds to the electrode 14f and the region 33c, a line between the resistors R2 and R3 corresponds to the electrode 12, and a line between the resistors R3 and R4 corresponds to the electrode 11. A line between the resistors R4 and R5 corresponds to the electrode 14b and the region 33a, a line between the resistors R5 and R6 corresponds to the electrode 14c and the region 33b, and a line between the resistor R6 and the ground corresponds to the terminal 38b.

Figure 7:
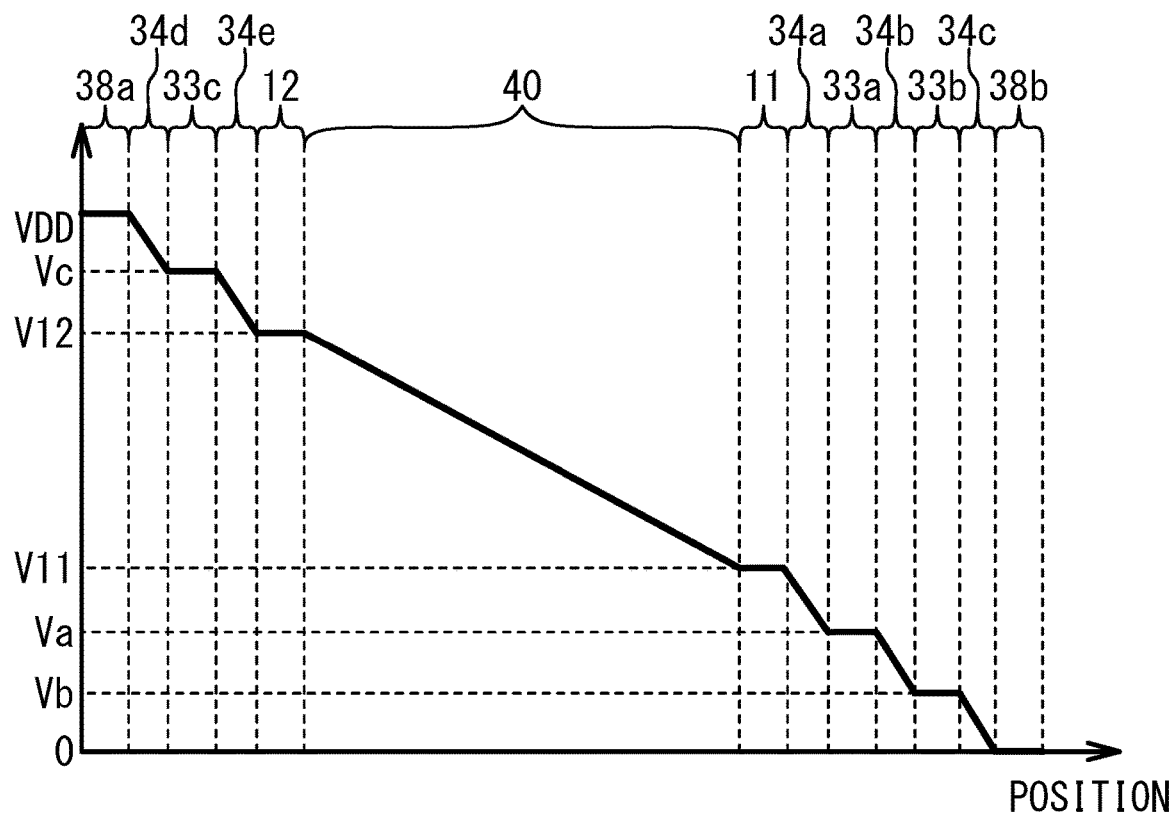
FIG. 7 is a diagram illustrating an electric potential with respect to a position in a series path in the first embodiment.

FIG. 7 is a diagram illustrating an electric potential with respect to a position in the series path in the first embodiment. As illustrated in FIG. 7, the potential of the terminal 38a is VDD, and the potential of the terminal 38b is 0V. Since an electrical conductivity of the conductive film 10 is much lower than that of the electrodes 11, 12, 13a, 13b and 14a-14g (for example, the former is equal to or less than $1/100$ of the latter), the voltage drop occurs mostly in the region 40 and the gaps 34a to 34e, and the voltage drop hardly occurs in the electrode 11, 12, the regions 33a to 33c and the terminals 38a and 38b. The potentials of the terminal 38a, the region 33c, the electrodes 12 and 11, the regions 33a and 33b, and the terminal 38b are VDD, Vc, V12, V11, Va, Vb and 0V, respectively.

Figure 8:
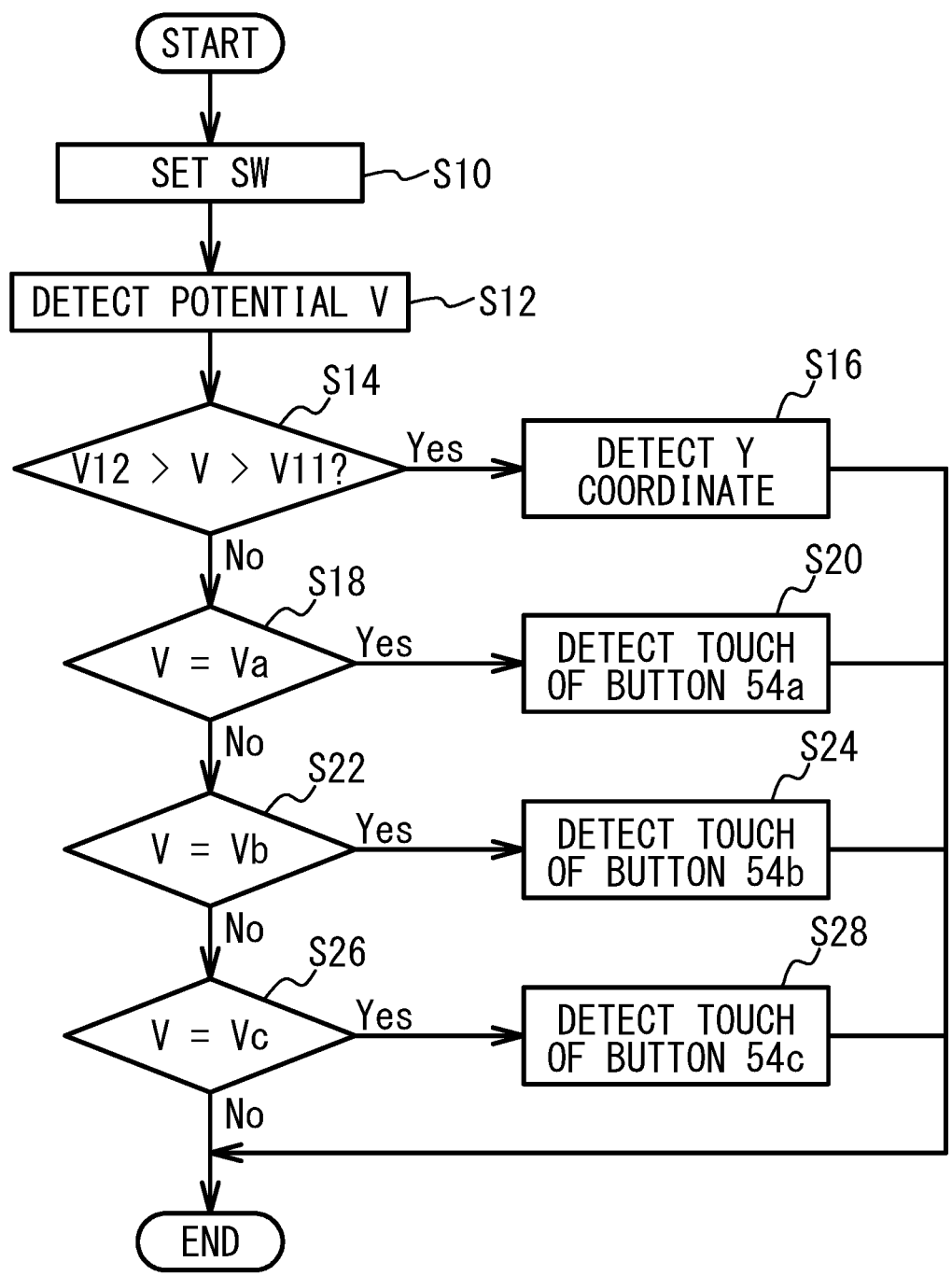
FIG. 8 is a flowchart illustrating a process of a control unit according to the first embodiment.

FIG. 8 is a flowchart illustrating a process of the control unit according to the first embodiment. As illustrated in FIG. 8, the control unit 30 sets the switches SW1 to SW4 (S10). Thereby, the terminals 38a and 38b are connected to the power supply 36 and the ground 35, respectively. The electrodes 21 and 22 are connected to the floating and the detector 32, respectively. The control unit 30 causes the detector 32 to detect the voltage of the electrode 22 (the potential V of the conductive film 20), and acquires the detection result from the detector 32 (S12). The control unit 30 determines whether the potential V is lower than the potential V12 and higher than the potential V11 (S14). When the determination of S14 is Yes, the control unit 30 detects the Y coordinate of the touch position in the region 40 based on the potential V (S16).

When the determination of S14 is No, the control unit 30 determines whether the potential V is the potential Va or within an error range of the potential Va (S18). When the determination of S18 is Yes, the control unit 30 determines that the button 54a is touched (S20). When the determination of S18 is No, the control unit 30 determines whether the potential V is the potential Vb or within an error range of the potential Vb (S22). When the determination of S22 is Yes, the control unit 30 determines that the button 54b is touched (S24). When the determination of S22 is No, the control unit 30 determines whether the potential V is the potential Vc or within an error range of the potential Vc (S26). When the determination of S26 is Yes, the control unit 30 determines that the button 54c is touched (S28). When the determination of S26 is No, the process is completed. Here, the order of steps S14, S18, S22 and S26 can be set freely. The potentials V11, V12, Va, Vb, and Vc are predetermined values that are set as the potentials of the electrodes 11 and 12 and the regions 33a-33c when the terminals 38a and 38b are set to VDD and 0V, respectively.

Next, the detection of the X coordinate of the touch position in the region 40 will be described. The control unit 30 causes the switch SW1 to connect the terminal 38a to the detector 32, the switch SW2 to float the terminal 38b, the switch SW3 to connect the terminal 38c to the power supply 36, and the switch SW4 to connect the terminal 38d to the ground 35. Thereby, the voltage of the conductive film 20 decreases linearly from the electrode 21 to the electrode 22. The control unit 30 can detect the X coordinate of the touch position in the region 40 based on the potential detected by the detector 32.

According to the first embodiment, one end of the resistor R4 (i.e., first resistor) is connected to the electrode 11, and one end of the resistor R5 (i.e., third resistor) is connected to the terminal 38b via the resistor R6, as illustrated in FIG. 6. In the button 54a (i.e., first switch) of FIG. 1 and the region 33a of FIG. 4, the conductive film 10 and the conductive film 20 located between the other end of the resistor R4 (e.g. gap 34a) and the other end of the resistor R5 (e.g. gap 34b) can be electrically connected. In this way, the region 40, the resistor R4, the region 33a, and the resistor R5 are connected in series between the terminals 38a and 38b. Thereby, by providing the two terminals 38a and 38b, it is possible to detect the Y coordinate in the region 40 and the on/off of the button 54a. Since only two terminals 38a and 38b can be used to electrically connect to the electrodes 11, 12 and 14a to 14g, the cost can be reduced. If the resistor R4 is provided between the electrode 11 and the button 54a, it is possible to reliably detect whether the input is the touch input of the region 40 or the on/off of the button 54a.

In Patent Document 1, a resistor is not electrically connected between the electrode in the touch input region and the switch. That is, the resistor corresponding to the resistor R4 in FIG. 6 is not provided. Therefore, a difference between potentials detected from the conductive film 20 in the case where the touch position of the region 40 is near the electrode 11 and the case where the button 54a is touched is small, and there is a possibility of false detection. In Patent Document 1, wirings and resistors are provided in the vicinity of the conductive film on both of the upper and lower substrates in order to suppress the false detection. However, if the wirings and the resistors are provided on the upper and lower substrates, the cost increases. In the first embodiment, the resistance R4 is provided on the conductive film 10, so that the potentials of the conductive film 10 in the regions 40 and 33a are different from each other, as illustrated in FIG. 7. This eliminates the need for the wirings and the resistors on the lower surface of the substrate 25, as illustrated in FIG. 2B. Therefore, the cost can be reduced.

As illustrated in FIGS. 4 and 6, the resistor R4 is provided on the conductive film 10 and includes a pair of electrodes 14a and 14b facing each other across the region of the gap 34a (i.e., first resistance region) in the conductive film 10. The electrode 14a is electrically connected to the electrode 11. The resistor R5 is provided on the conductive film 10 and includes a pair of electrodes 14b and 14c facing each other across the region of the gap 34b (i.e., third resistance region) in the conductive film 10. The electrode 14c is electrically connected to the terminal 38b via the region of the gap 34c (i.e., resistor R6). Further, the resistance R2 (i.e., second resistance) is provided on the conductive film 10 and includes a pair of electrodes 14f and 14g facing each other across the region of the gap 34e (i.e., second resistance region) in the conductive film 10. The electrode 14g is electrically connected to the electrode 12, and the electrode 14f is electrically connected to the terminal 38a through the region of gap 34d (i.e., resistance R1). Thus, the resistors R4 and R2 are formed using the conductive film 10 and the electrodes 14a to 14g, so that the cost can be reduced compared to the case where the switches and the resistors are separately provided, as in Patent Document 1.

The control unit 30 applies a voltage between the terminals 38a and 38b as in S10 of FIG. 8. When the potential V of the conductive film 20 is closer to the potential VDD of the terminal 38a than the potential V11 of the electrode 11 and lower than the potential V12 of the electrode 12 as in S14 and S16, the control unit 30 detects the contact position (touch position) of the conductive films 10 and 20 in the Y direction in the region 40 based on the potential V of the conductive film 20. Thereby, the Y coordinate of the touch position can be detected. When the potential V of the conductive film 20 is closer to the potential 0V of the terminal 38b than the potential V11 as in S18 to S24, the control unit 30 detects the on/off of the buttons 54a and 54b based on the potential of the conductive film 20. When the potential V of the conductive film 20 is closer to the potential VDD than the potential V12 as in S26 to S28, the control unit 30 detects the on/off of the button 54c based on the potential of the conductive film 20. That is, the control unit 30 can detect whether the buttons 54a, 54b and 54c are on or off. Thereby, the touch of the buttons 54a, 54b and 54c can be detected. Here, predetermined values corresponding to the potentials of the electrodes 11 and 12 can be used as the potentials of the electrodes 11 and 12 in FIG. 8. Three or more buttons 54a to 54c may be provided. Further, the button 54c may be provided on a left side of the terminal 38b of FIG. 4 in the region 42.

As illustrated in FIG. 2A, the slit 18 in which the conductive film 10 is not provided is provided between the electrode 12 and the electrodes 14n and 14m, and between the region 40 and the electrode 13b. Thereby, the buttons 54a to 54c can be provided between the terminals 38a and 38b. The current flowing between the terminals 38a and 38b via the series path 46 in FIG. 2A should be sufficiently larger than the current flowing other than the series path 46, for example, the current flowing between the electrode 12 and the electrodes 14n and 14m. If the conductive film 20 is provided with a slit, the appearance seen from above is impaired. For example, when the slit is provided by using a laser beam, the slit is provided in the decorative layer 23 and the conductive film 20 at the same time. In this case, the appearance seen from above is impaired. Therefore, it is preferable that the conductive film 10 is provided with a configuration such as resistors R1, R2, and R4 to R6 that require the slit 18 to be provided. The slit 18 and the electrodes 11, 12, 13a, 13b, 14n and 14m provided in the conductive film 10 overlap with the decorative layer 23. Thereby, the slit 18 and the electrodes cannot be visually recognized when viewed from above, and the appearance is improved.

A total resistance value of the resistors R1, R2, and R4 to R6 is preferably equal to or less than the resistance value of the resistor R3 (i.e., region 40). Thereby, a difference between the potential V11 of the electrode 11 and the potential V12 of the electrode 12 in FIG. 7 can be increased. Therefore, the detection accuracy of the Y coordinate in the region 40 can be improved. On the other hand, a total resistance value of the resistors R1, R2, and R4 to R6 is preferably ¹⁄₁₀ or more of the resistance value of the resistor R3. This is because if the difference between the potentials V11 and V12 is too large, the detection accuracy of the buttons 54a to 54c decreases. Therefore, the total resistance value of the resistors R1, R2, and R4 to R6 is preferably equal to or less than the resistance value of the resistor R3, and ¹⁄₁₀ or more of the resistance value of the resistor R3.

First Variation

Figure 9:
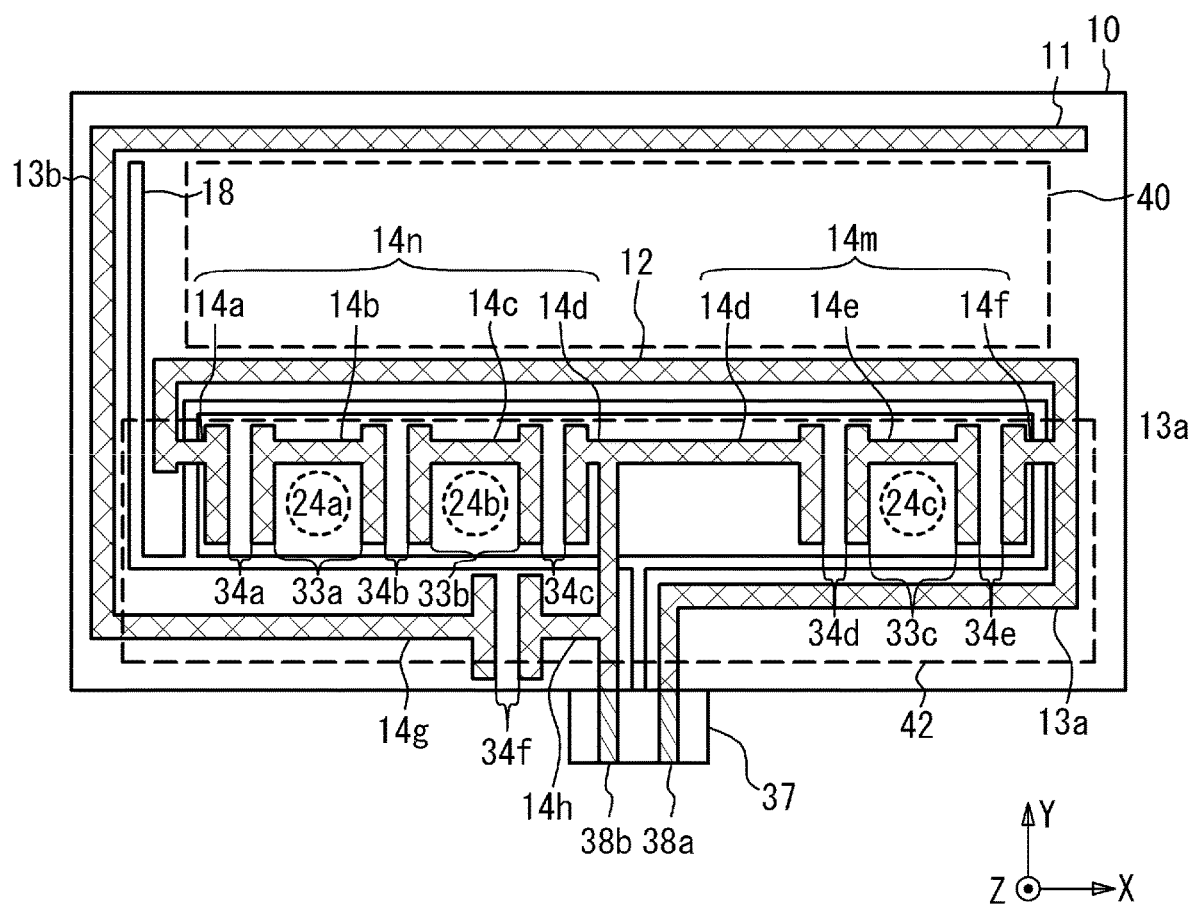
FIG. 9 is an enlarged plan view illustrating of a vicinity of the region 42 according to a first variation of the first embodiment.

FIG. 9 is an enlarged plan view illustrating of a vicinity of the region 42 of the conductive film 10 according to a first variation of the first embodiment. As illustrated in FIG. 9, the electrode 14n and the electrode 14m are connected in parallel between the electrode 12 and the terminal 38b. In the electrode 14n, the electrode 14a, the gap 34a, the electrode 14b, the gap 34b, the electrode 14c, the gap 34c and the electrode 14d are connected in series between the electrode 12 and the terminal 38b. In the electrode 14m, the electrode 14f, the gap 34e, the electrode 14e, the gap 34d and the electrode 14d are connected in series between the electrode 12 and the terminal 38a. The electrode 14g, a gap 34f and an electrode 14h are connected in series between the electrode 13b connected to the electrode 11, and the terminal 38b. The regions surrounded by the electrodes 14b, 14c and 14e are regions 33a, 33b and 33c, respectively. The conductive film 10 has the slit 18 surrounding the electrodes 14n and 14m. Other configurations are the same as those in FIG. 4 of the first embodiment, and the description thereof will be omitted. The plan view of the conductive film 20 is the same as that of FIG. 2B of the first embodiment.

Figure 10:
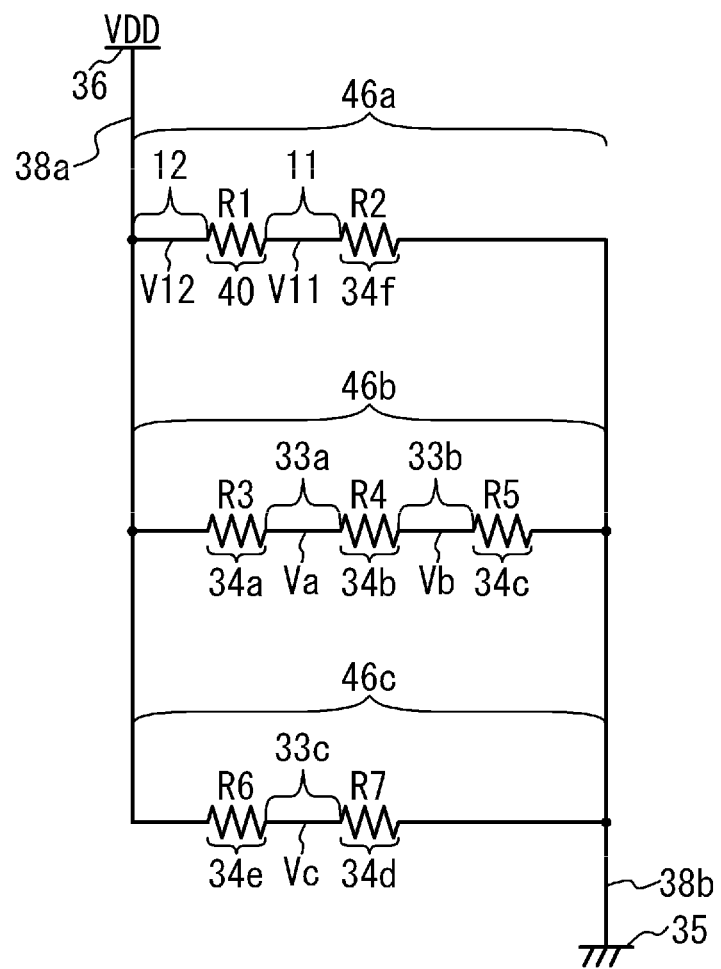
FIG. 10 is a diagram illustrating an equivalent circuit of the conductive film 10 according to the first variation of the first embodiment.

FIG. 10 is a diagram illustrating an equivalent circuit of the conductive film 10 according to the first variation of the first embodiment. As illustrated in FIG. 10, three paths 46a to 46b are connected in parallel between the power supply 36 and the ground 35. In the path 46a, the resistors R1 and R2 are connected in series. In the path 46b, the resistors R3 to R5 are connected in series. In the path 46c, the resistors R6 and R7 are connected in series. The resistors R1, R2, R3, R4, R5, R6 and R7 correspond to the resistance components of the conductive film 10 in the regions 40 and gaps 34f, 34a, 34b, 34c, 34e and 34d, respectively. A line between the power supply 36 and the resistor R1 corresponds to the electrode 12, a line between the resistors R1 and R2 corresponds to the electrode 11, a line between the resistors R3 and R4 corresponds to the region 33a, a line between the resistors R4 and R5 corresponds to the region 33b, and a line between the resistors R6 and R7 corresponds to the region 33c.

It is assumed that the potentials of the electrodes 12, 11, and the regions 33a, 33b, and 33c are the potentials V12, V11, Va, Vb, and Vc, respectively. At this time, the resistance values of the resistors R2 to R7 are set so that the potentials Va, Vb, and Vc are lower than the potentials V11 and the potentials Va to Vc differ from each other by a manufacturing error and a measurement error or more. The control unit 30 operates in the same manner as the flowchart in FIG. 8 of first embodiment, so that it can detect the Y coordinate in the region 40 and the on/off of the buttons 54a to 54c.

Second Variation

Figure 11:
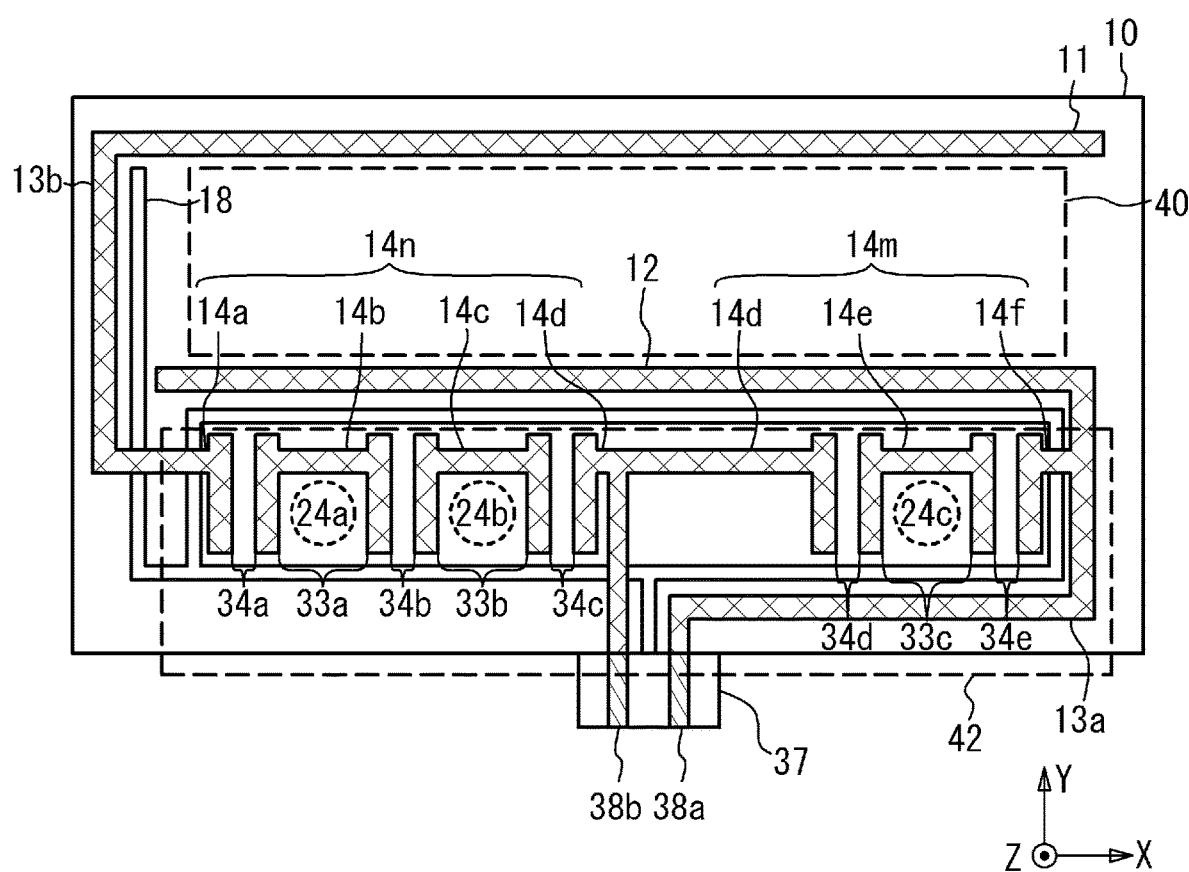
FIG. 11 is an enlarged plan view illustrating of a vicinity of the region 42 according to a second variation of the first embodiment.

FIG. 11 is an enlarged plan view illustrating of a vicinity of the region 42 of the conductive film 10 according to a second variation of the first embodiment. As illustrated in FIG. 11, the electrode 14n is electrically connected between the electrode 13b connected to the electrode 11, and the terminal 38b, and the electrode 14m is electrically connected between the electrode 12 and the terminal 38b. In the electrode 14n, the electrode 14a, the gap 34a, the electrode 14b, the gap 34b, the electrode 14c, the gap 34c and the electrode 14d are connected in series between the electrode 13b and the terminal 38b. In the electrode 14m, the electrode 14f, the gap 34e, the electrode 14e, the gap 34d and the electrode 14d are connected in series between the electrode 12 and the terminal 38a. The regions surrounded by the electrodes 14b, 14c and 14e are the regions 33a, 33b and 33c, respectively. The conductive film 10 includes the slit 18 surrounding the electrodes 14n and 14m. Other configurations are the same as those in FIG. 4 of the first embodiment, and the description thereof will be omitted. The plan view of the conductive film 20 is the same as that of FIG. 2B of the first embodiment.

Figure 12:
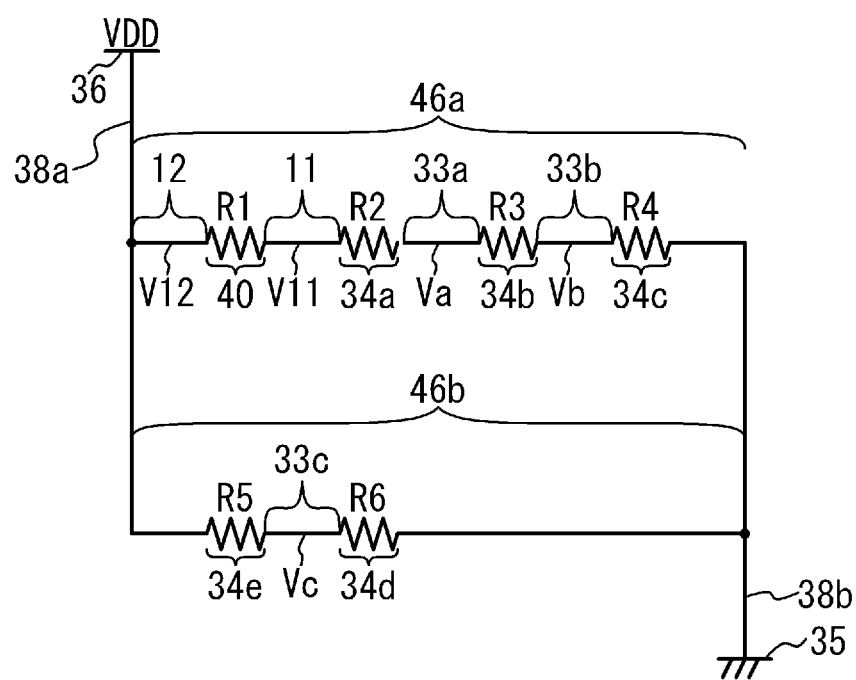
FIG. 12 is a diagram illustrating an equivalent circuit of the conductive film 10 according to the second variation of the first embodiment.

FIG. 12 is a diagram illustrating an equivalent circuit of the conductive film 10 according to the second variation of the first embodiment. As illustrated in FIG. 12, two paths 46a and 46b are connected in parallel between the power supply 36 and the ground 35. In the path 46a, the resistors R1 to R4 are connected in series. In the path 46b, the resistors R5 and R6 are connected in series. The resistors R1, R2, R3, R4, R5 and R6 correspond to the resistance components of the conductive film 10 in the region 40 and the gaps 34a, 34b, 34c, 34e and 34d, respectively. A line between the power supply 36 and the resistors R1 corresponds to the electrode 12, a line between the resistors R1 and R2 corresponds to the electrode 11, a line between the resistors R2 and R3 corresponds to the region 33a, a line between the resistors R2 and R3 corresponds to the region 33b, and a line between resistors R5 and R6 corresponds to the region 33c.

It is assumed that the potentials of the electrodes 12, 11, and the regions 33a, 33b, and 33c are the potentials V12, V11, Va, Vb, and Vc, respectively. At this time, the resistance values of the resistors R2 to R6 are set so that the potentials Va, Vb, and Vc are lower than the potentials V11 and the potentials Va to Vc differ from each other by the manufacturing error and the measurement error or more. The control unit 30 operates in the same manner as the flowchart in FIG. 8 of first embodiment, so that it can detect the Y coordinate in the region 40 and the on/off of the buttons 54a to 54c.

Third Variation

Figure 13:
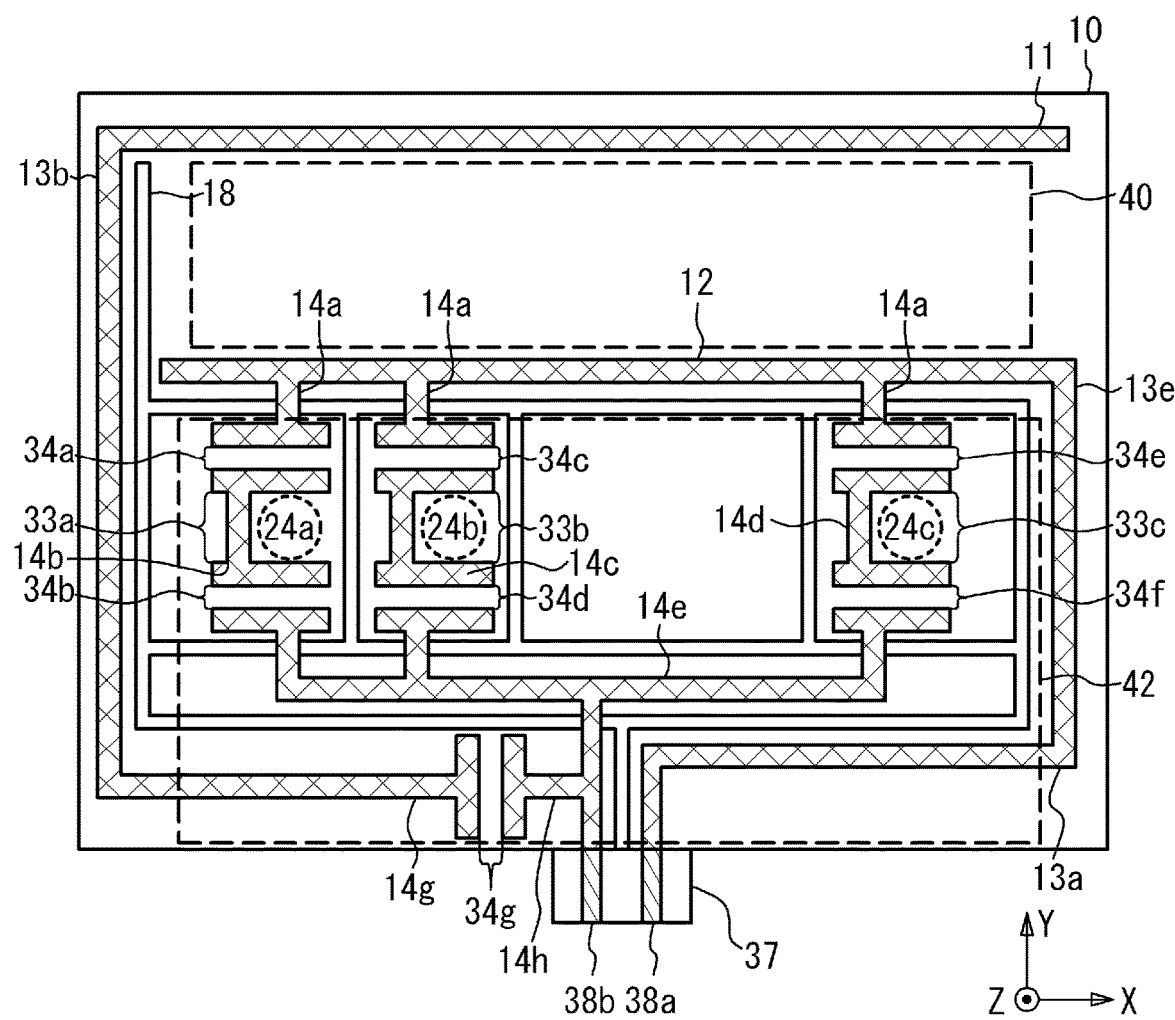
FIG. 13 is an enlarged plan view illustrating of a vicinity of the region 42 according to a third variation of the first embodiment.

FIG. 13 is an enlarged plan view illustrating of a vicinity of the region 42 of the conductive film 10 according to a third variation of the first embodiment. As illustrated in FIG. 13, the electrodes 14b to 14d are connected in parallel between the electrode 14a connected to the electrode 12 and the electrode 14e connected to the terminal 38b. The gaps 34a and 34b are provided between the electrodes 14a and 14b and between the electrodes 14b and 14e, respectively. The gaps 34c and 34d are provided between the electrodes 14a and 14c and between the electrodes 14c and 14e, respectively. The gaps 34e and 34f are provided between the electrodes 14a and 14d and between the electrodes 14d and 14e, respectively. The regions surrounded by the electrodes 14b, 14c and 14d are the regions 33a, 33b and 33c, respectively. The conductive film 10 includes the slit 18 surrounding each of the regions 33a to 33c. Other configurations are the same as those in FIG. 9 of the first variation of the first embodiment, and the description thereof will be omitted. The plan view of the conductive film 20 is the same as that of FIG. 2B of the first embodiment.

Figure 14:
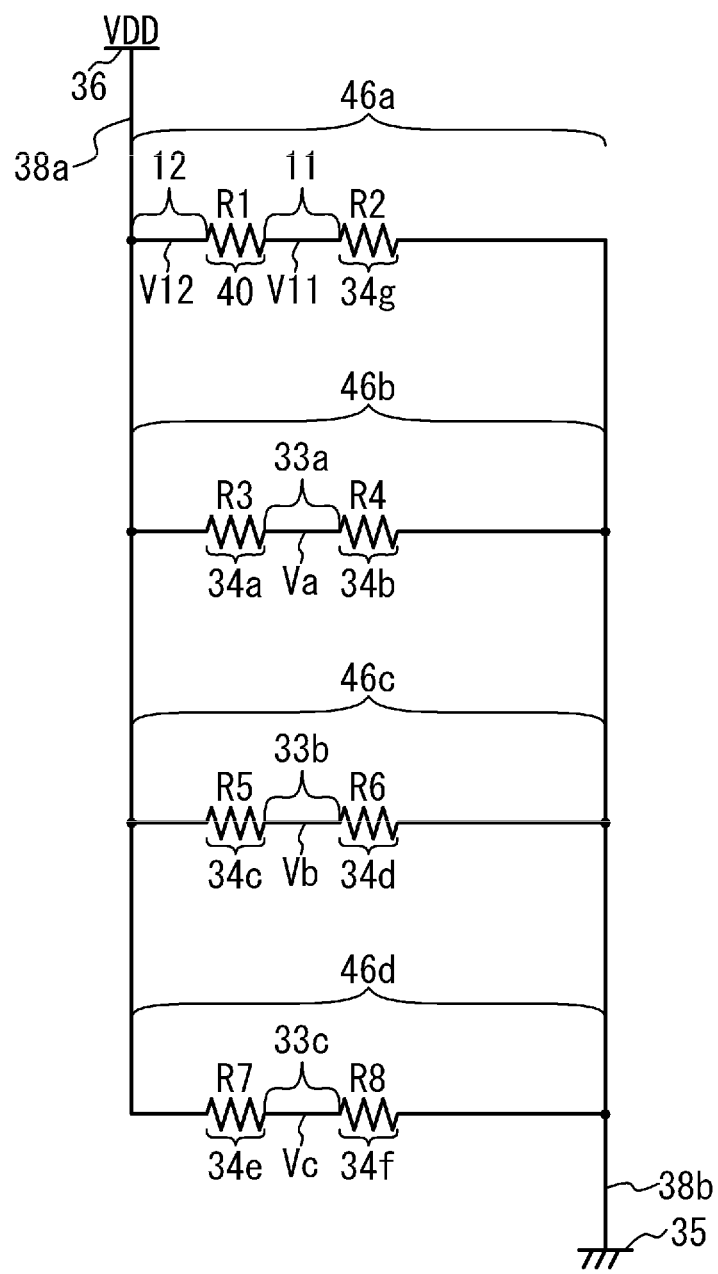
FIG. 14 is a diagram illustrating an equivalent circuit of the conductive film 10 according to the third variation of the first embodiment.

FIG. 14 is a diagram illustrating an equivalent circuit of the conductive film 10 according to the third variation of the first embodiment. As illustrated in FIG. 14, four paths 46a to 46d are connected in parallel between the power supply 36 and the ground 35. In the path 46a, the resistors R1 and R2 are connected in series. In the path 46b, the resistors R3 and R4 are connected in series. In the path 46c, the resistors R5 and R6 are connected in series. In the path 46d, the resistors R7 and R8 are connected in series. The resistors R1, R2, R3, R4, R5, R6, R7 and R8 correspond to the resistance components of the conductive film 10 in the region 40 and the gaps 34g, 34a, 34b, 34c, 34d, 34e and 34f, respectively. A line between the power supply 36 and the resistors R1 corresponds to the electrode 12, a line between the resistors R1 and R2 corresponds to the electrode 11, a line between the resistors R3 and R4 corresponds to the region 33a, a line between the resistors R5 and R6 corresponds to the region 33b, and a line between resistors R7 and R8 corresponds to the region 33c.

It is assumed that the potentials of the electrodes 12, 11, and the regions 33a, 33b, and 33c are the potentials V12, V11, Va, Vb, and Vc, respectively. At this time, the resistance values of the resistors R2 to R8 are set so that the potentials Va, Vb, and Vc are lower than the potentials V11 and the potentials Va to Vc differ from each other by the manufacturing error and the measurement error or more. The control unit 30 operates in the same manner as the flowchart in FIG. 8 of first embodiment, so that it can detect the Y coordinate in the region 40 and the on/off of the buttons 54a to 54c.

As illustrated in FIG. 10 of the first variation of the first embodiment, one end of the resistor R2 is connected to the electrode 11, and the other end thereof is connected to the terminal 38b (i.e., second terminal). One end of the resistor R3 (i.e., fourth resistor) is connected to the terminal 38a (i.e., first terminal). One end of the resistor R4 is connected to the terminal 38b. In the button 54a of FIG. 1 and the region 33a of FIG. 9, the conductive film 10 and the conductive film 20 located between the other end of the resistor R3 (i.e., gap 34a) and the other end of the resistor R4 (i.e., gap 34b) can be electrically connected. As illustrated in FIG. 10, the path 46a provided with the electrode 12, the region 40, the electrode 11 and the resistor R1 (i.e., first resistor), and the path 46b provided with the resistor R3, the region 33a and the resistor R4 are connected in parallel between the terminals 38a and 38b. Thereby, by providing the two terminals 38a and 38b, it is possible to detect the Y coordinate in the region 40 and the on/off of the button 54a. Since only two terminals 38a and 38b can be used to electrically connect to the electrodes 11, 12 and 14a to 14g, the cost can be reduced. Further, it is not necessary to provide the wirings and the resistors on the upper and lower substrates as in Patent Document 1. Therefore, the cost can be further reduced. If the resistor R3 is provided between the terminal 38a and the button 54a, the on/off of the button 54a can be detected.

Further, the resistor R2 is provided on the conductive film 10, and includes a pair of electrodes 14g and 14h facing each other across the region of the gap 34f in the conductive film 10. The electrode 14g is connected to the electrode 11, and the electrode 14h is connected to the terminal 38b. The resistor R3 is provided on the conductive film 10, and includes a pair of electrodes 14a and 14b facing each other across the region (i.e., fourth resistance region) of the gap 34a in the conductive film 10. The electrode 14a is connected to the terminal 38a. The resistor R4 is provided on the conductive film 10, and includes a pair of electrodes 14b and 14c that face each other across the region of the gap 34b in the conductive film 10. The electrode 14c is connected to the terminal 38b. Thus, the resistors R1 to R3 are formed using the conductive film 10 and the electrodes 14a to 14c, 14g and 14h, so that the cost can be reduced compared to the case where the switches and the resistors are separately provided, as in Patent Document 1.

When a voltage is applied between the terminals 38a and 38b, the resistance values of the resistors R1 to R4 are designed so that the potential Va of the conductive film 10 in the region 33a is closer to the potential of the terminals 38b than the potential V11 of the electrode 11. Thereby, the Y coordinate of the touch position and the touch of the button 54a can be detected using the same method as in FIG. 8 of the first embodiment. When two or more switches are provided, the buttons 54b and 54c may be provided in series with or in parallel with the buttons 54a.

Figure 39:
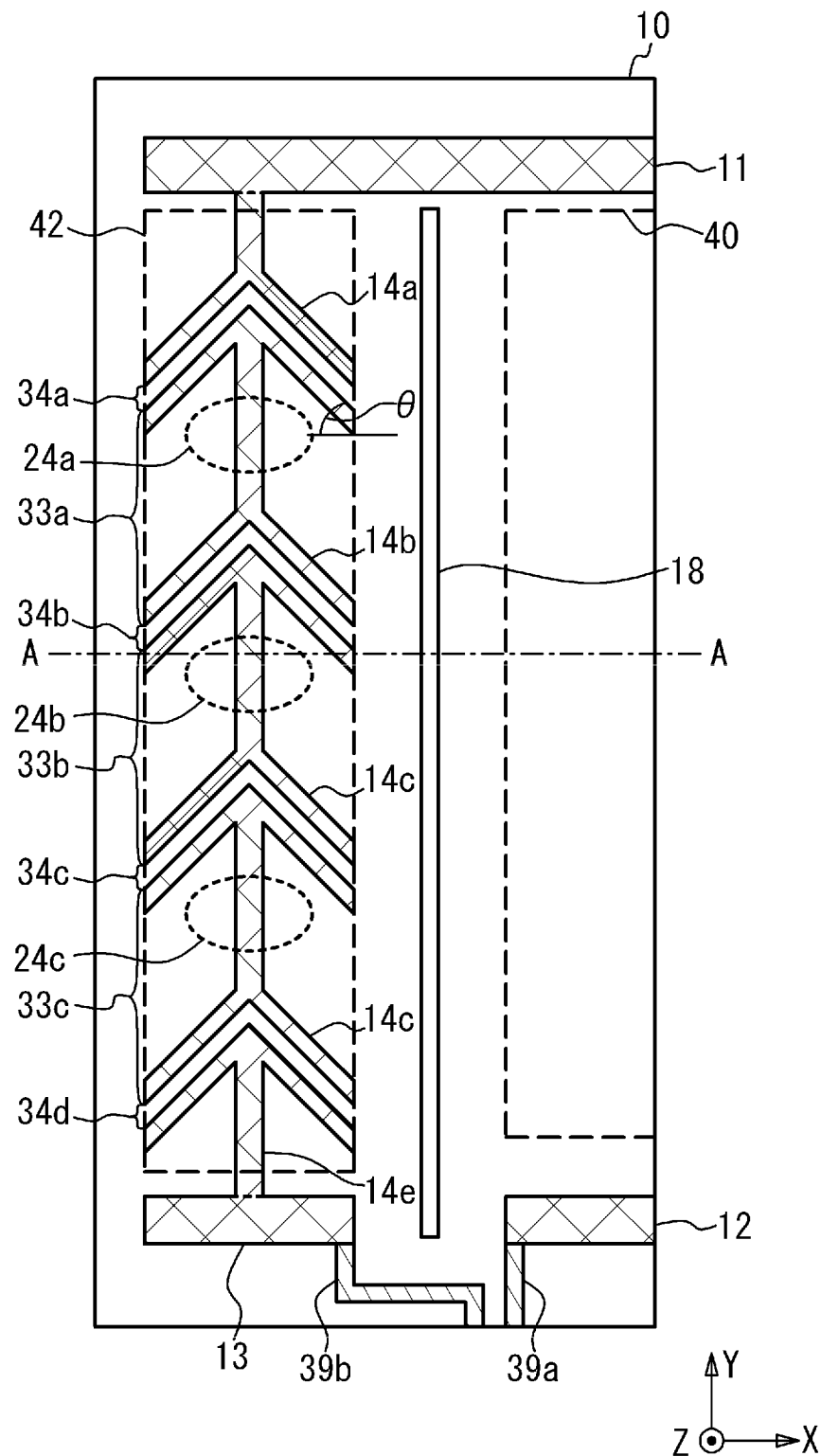
FIG. 39 is an enlarged plan view of the touch panel according to a first variation of the sixth embodiment.

As in the first embodiment and the first to third variations thereof, the resistors R1 to R8 other than the region 40 are provided on the conductive film 10, and include pairs of electrodes facing each other across the regions of the gaps 34a to 34g in the conductive film 10, respectively. In this way, the resistors are formed using the conductive film 10, so that the cost can be reduced. The resistance values of the resistors R1 to R8 can be freely designed by changing the width and the length of the gaps 34a to 34g. When the resistance values of the resistors R1 to R7 are set low, the widths of the gaps 34a to 34g in the direction in which the current flows are reduced. However, a minimum width is determined by the manufacturing accuracy and is 0.2 mm as one example. Increasing the lengths of the gaps 34a to 34g can reduce the resistance values of resistors R1 to R8. However, for example, in FIG. 4 of the first embodiment, increasing the lengths of the gaps 34a to 34e increases the dimension of the region 42 in the Y direction. Therefore, the dimension of the frame portion 56 in FIG. 1 in the Y direction becomes large. Therefore, the extending direction of the gaps 34a to 34g is tilted from the direction in which the current flows. Thereby, the resistance values of the gaps 34a to 34g can be reduced. An angle between the extending direction of the gaps 34a to 34g and the Y direction is preferably 30 degrees or more, and preferably 45 degrees or less. The planar shape of the gaps 34a to 34g may be a straight line inclined with respect to the Y direction, or may be a W shape. The planar shape of the gaps 34a to 34g may also be a V shape, as illustrated in FIG. 39 described later.

Second Embodiment

Figure 15:
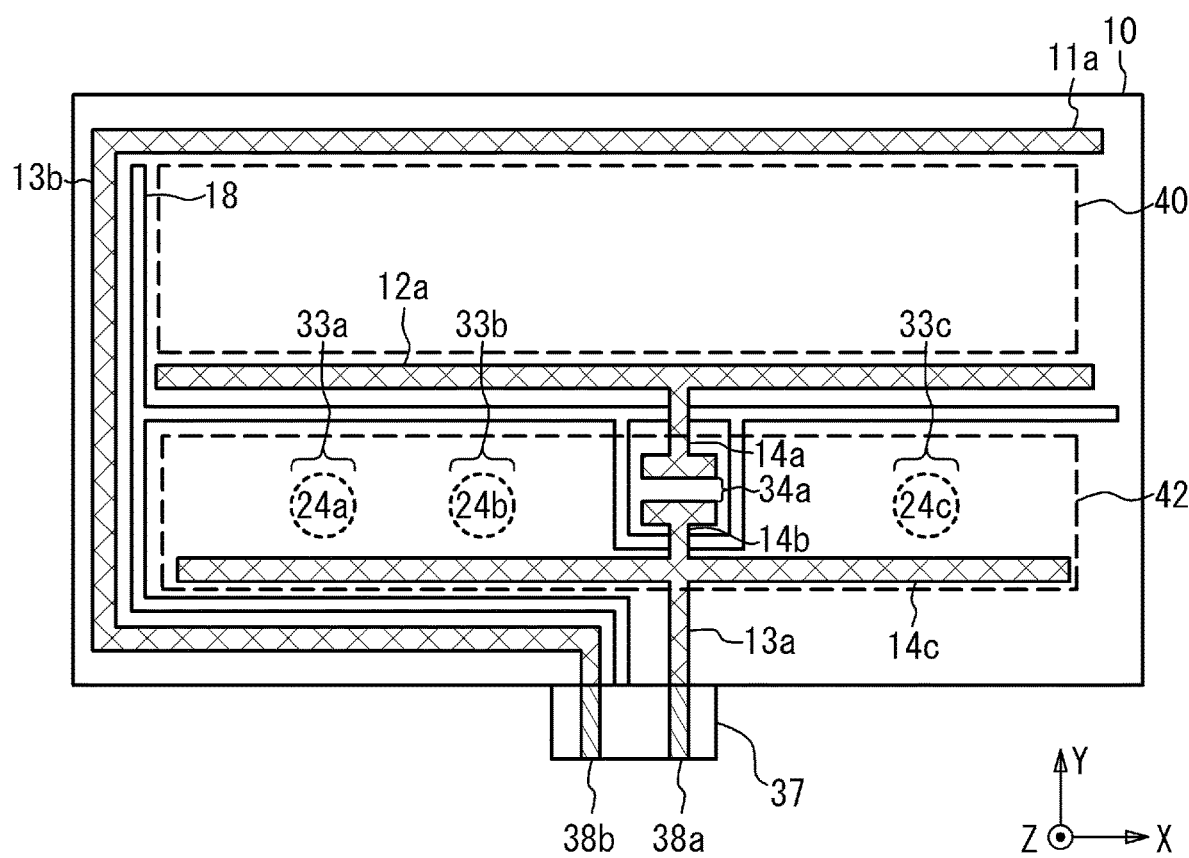
FIG. 15 is an enlarged plan view illustrating of a vicinity of the region 42 according to a second embodiment.

FIG. 15 is an enlarged plan view illustrating of a vicinity of the region 42 of the conductive film 10 according to a second embodiment. As illustrated in FIG. 15, an electrode 11a (i.e., first electrode) and an electrode 12a (i.e., third electrode) extend in the X direction (i.e., first direction), and face each other across the region 40 (i.e., first region) in the Y direction (i.e., second direction). The electrode 11a is connected to the terminal 38b (i.e., first terminal) via the electrode 13b. The electrode 14a, the gap 34a, and the electrode 14b are connected in series between the electrode 12a, and the electrode 13a electrically connected to the terminal 38a (i.e., second terminal). The electrode 14c is connected to the electrode 13a. In the region 42, the electrode 14c extends in the X direction. The slit 18 is provided in the conductive film 10 in a third region between the regions 40 and 42. Thereby, the potential of the conductive film 10 in the region 42 becomes substantially the same as the potential of the electrode 14c. The regions 33a to 33c in contact with the electrodes 24a to 24c are provided in the region 42. The regions 33a to 33c are arranged in the X direction. The conductive film 10 includes the slit 18 surrounding the gap 34a and the electrodes 14a and 14b. Other configurations are the same as those in FIG. 4 of the first embodiment, and the description thereof will be omitted. The plan view of the conductive film 20 is the same as that of FIG. 2B of the first embodiment.

Figure 16:
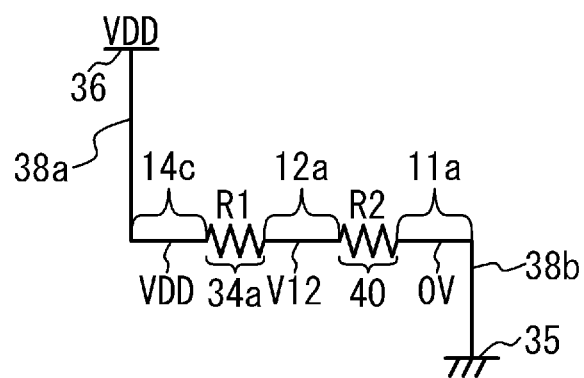
FIG. 16 is a diagram illustrating an equivalent circuit of the conductive film 10 according to the second embodiment.

FIG. 16 is a diagram illustrating an equivalent circuit of the conductive film 10 according to the second embodiment. As illustrated in FIG. 16, the resistors R1 and R2 are connected in series between the power supply 36 and the ground 35. The resistors R1 and R2 correspond to the resistance components of the conductive film 10 in the gap 34a and the region 40, respectively. A line between the power supply 36 and the resistor R1 corresponds to the electrode 14c, a line between the resistors R1 and R2 corresponds to the electrode 12a, and a line between the resistor R2 and the ground 35 corresponds to the electrode 11a.

Figure 17:
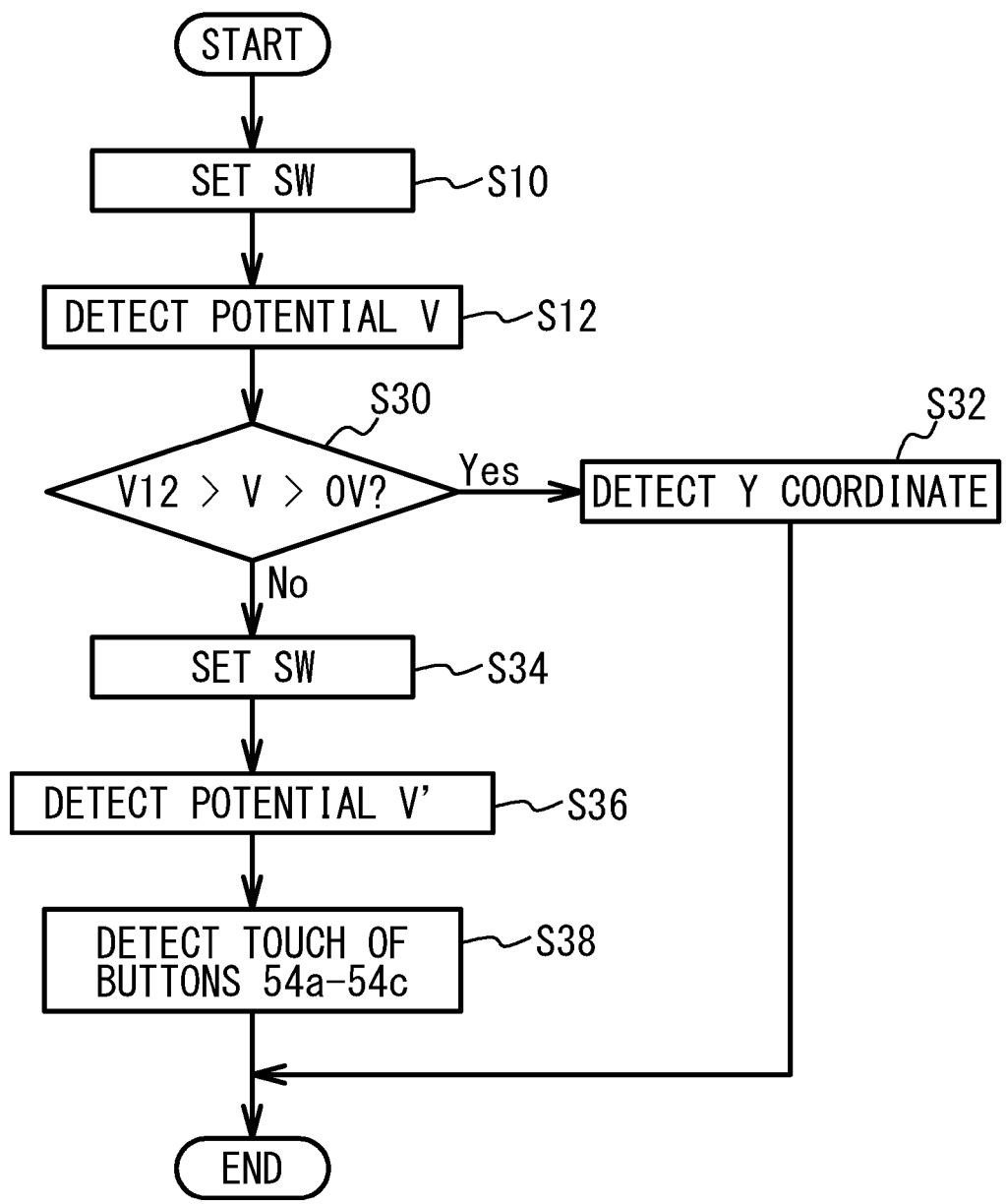
FIG. 17 is a flowchart illustrating a process of the control unit according to the second embodiment.

FIG. 17 is a flowchart illustrating a process of the control unit according to the second embodiment. As illustrated in FIG. 17, in S10, the control unit 30 connects the terminals 38a and 38b to the power supply 36 and the ground 35, respectively, and connects the electrodes 21 and 22 to the floating and the detector 32, respectively. The control unit 30 causes the detector 32 to detect the potential V of the conductive film 20 and acquires the detection result (S12). The control unit 30 determines whether the potential V is lower than the potential V12 of the electrode 12a and higher than the ground potential 0V (S30). When the determination of S30 is Yes, the control unit 30 calculates the Y coordinate of the touch position in the region 40 based on the potential V (S32).

When the determination of S30 is No, the control unit 30 causes the switch SW1 to connect the terminal 38a to the detector 32, the switch SW2 to float the terminal 38b, the switch SW3 to connect the terminal 38c to the power supply 36, and the switch SW4 to connect the terminal 38d to the ground 35 (S34). Thereby, the voltage of the conductive film 20 decreases linearly from the electrode 21 to the electrode 22. The control unit 30 causes the detector 32 to detect a potential V' of the conductive film 10 and acquires the detection result (S36). The control unit 30 determines which of the buttons 54a to 54c is pressed based on the potential V' of the conductive film 10 (S38). That is, when the control unit 30 determines that the potential V' is the potentials of the electrodes 24a to 24c, it determines that the buttons 54a to 54c are pressed, respectively. Then, the process ends.

In the second embodiment, whether the region 40 is pressed or the buttons 54a to 54c are pressed can be determined based on the potential V of the conductive film 20, and which of the buttons 54a to 54c is pressed can be determined based on the potential V' of the conductive film 10.

According to the second embodiment, as illustrated in FIGS. 15 and 16, one end of the resistor R1 (i.e., first resistor) is connected to the electrode 12a (i.e., third electrode). The electrode 14c (i.e., second electrode) is provided in the region 42 (i.e., second region) in the conductive film 10 in the Y direction of the electrode 12a, and is electrically connected to the other end of the resistor R1 and the terminal 38a (i.e., second terminal). The plurality of buttons 54a to 54c (i.e., regions 33a to 33c in FIG. 15) of FIG. 1 are provided in the region 42 (i.e., region 52 in FIG. 1), are arranged in the X direction, and can electrically connect the conductive films 10 and 20. In the buttons 54a to 54c, the connection between the conductive films 10 and 20 can be detected. The conductive film 10 between the regions 40 and 42 like the slit 18 is removed. Thereby, by providing the two terminals 38a and 38b, it is possible to detect the Y coordinate in the region 40 and the on/off of the button 54a. Since only two terminals 38a and 38b can be used to electrically connect to the electrodes 11a, 12a and 14a to 14g, the cost can be reduced. Further, it is not necessary to provide the wirings and the resistors on the upper and lower substrates as in Patent Document 1. Therefore, the cost can be further reduced.

As in S10 of FIG. 17, the control unit 30 applies the voltage between the terminals 38a and 38b. As in S30 and S32, when the potential V of the conductive film 20 is closer to the potential 0V of the terminal 38b than the potential V12 of the electrode 12a, the control unit 30 detects the contact position of the conductive films 10 and 20 in the Y direction in the region 40 based on the potential of the conductive film 20. Thereby, the Y coordinate of the touch position can be detected. In S30, when the potential V of the conductive film 20 is closer to the potential VDD of the terminal 38a than the potential V12 of the electrode 12a, the voltage is applied between the electrodes 21 and 22, and the on/off of the plurality of buttons 54a to 54c is detected based on the potential of the region 42 of the conductive film 10, as in S34 to S38. Thereby, the touch of the button 54a can be detected.

First Variation

Figure 18:
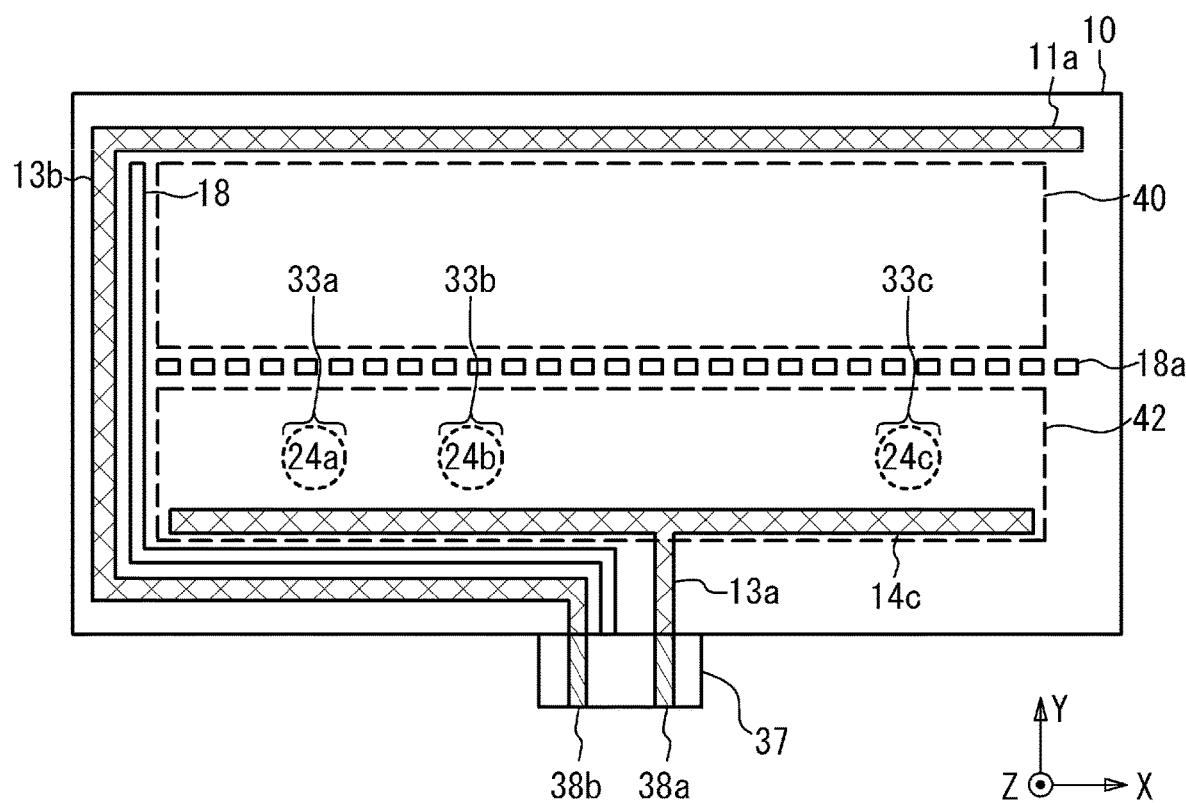
FIG. 18 is an enlarged plan view illustrating of a vicinity of the region 42 according to a first variation of the second embodiment.

FIG. 18 is an enlarged plan view illustrating a vicinity of the region 42 of the conductive film 10 according to a first variation of the second embodiment. As illustrated in FIG. 18, the electrode 12a is not provided. The electrode 14c extending in the X direction is provided. The electrode 13b connected to the electrode 11a is connected to the terminal 38b, and the electrode 14c is connected to the terminal 38a via the electrode 13a. A broken line or dotted line slit 18a is provided between the regions 40 and 42. The regions 33a to 33c are arranged in the X direction in the region 42. Other configurations are the same as those in FIG. 15 of the second embodiment, and the description thereof will be omitted. The plan view of the conductive film 20 is the same as that of FIG. 2B of the first embodiment.

Figure 19A:
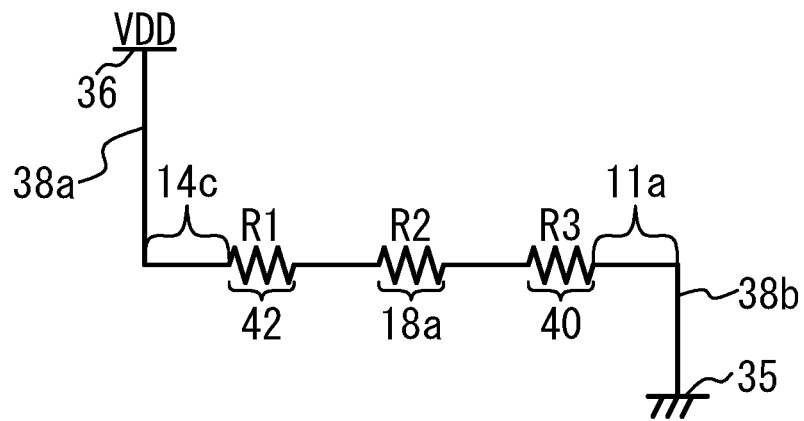
FIG. 19A is a diagram illustrating an equivalent circuit of the conductive film 10 according to the first variation of the second embodiment.

FIG. 19A is a diagram illustrating an equivalent circuit of the conductive film 10 according to the first variation of the second embodiment. As illustrated in FIG. 19A, the resistors R1 to R3 are connected in series between the power supply 36 and the ground 35. The resistors R1, R2 and R3 correspond to the resistance components of the conductive film 10 in the region 42, the slit 18a and the region 40, respectively. A line between the power supply 36 and the resistor R1 corresponds to the electrode 14c, and a line between the resistor R3 and the ground 35 corresponds to the electrode 11a.

Figure 19B:
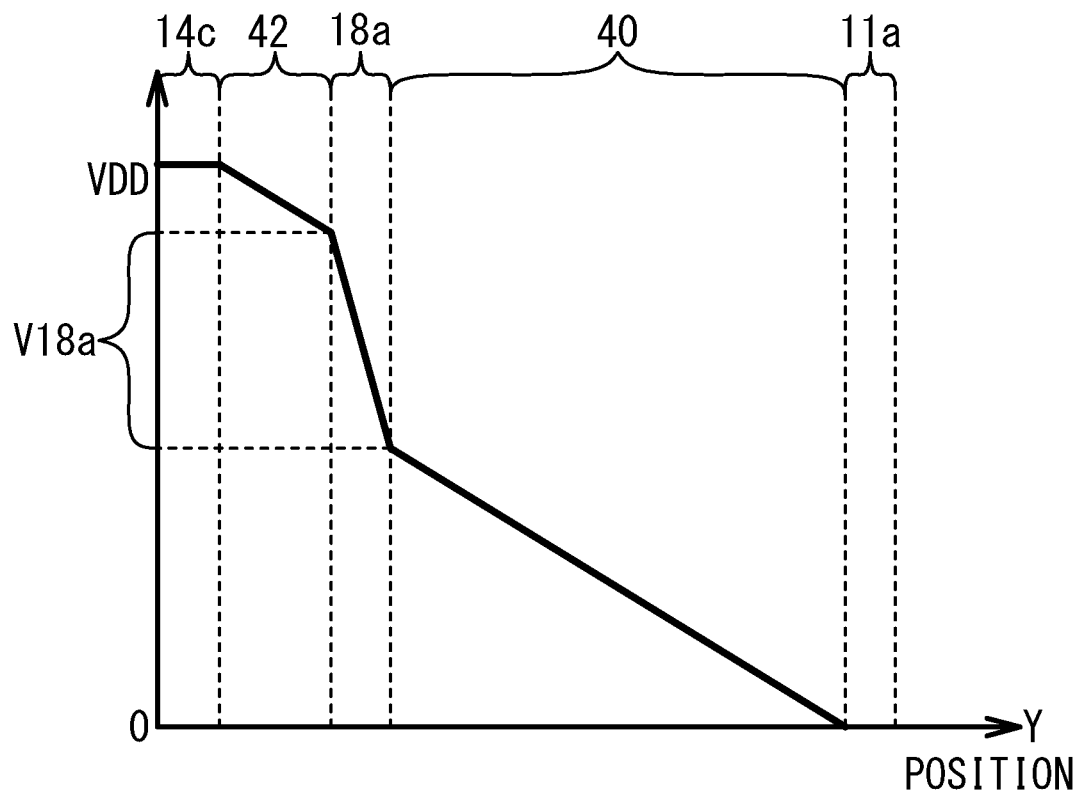
FIG. 19B is a diagram illustrating an electric potential with respect to a position in the series path.

FIG. 19B is a diagram illustrating an electric potential with respect to a position in the series path in the first variation of the second embodiment. As illustrated in FIG. 19B, the potential of the electrode 14c is VDD, and the potential of the electrode 11a is 0V. The slope of the voltage drop with respect to the position Y in the regions 40 and 42 is constant. In the slit 18a, the voltage drops sharply with respect to the position Y. The potential in the slit 18a is V18a.

In S30 of FIG. 17 of the second embodiment, the control unit 30 determines whether V18a<V<0V is satisfied. Other controls are the same as in those of FIG. 17. By providing the slit 18a as in the first variation of the second embodiment, a potential difference between the regions 40 and 42 becomes large as illustrated in FIG. 19B. Therefore, by setting V18a appropriately in S30, erroneous determination in S30 can be suppressed.

Second Variation

Figure 20:
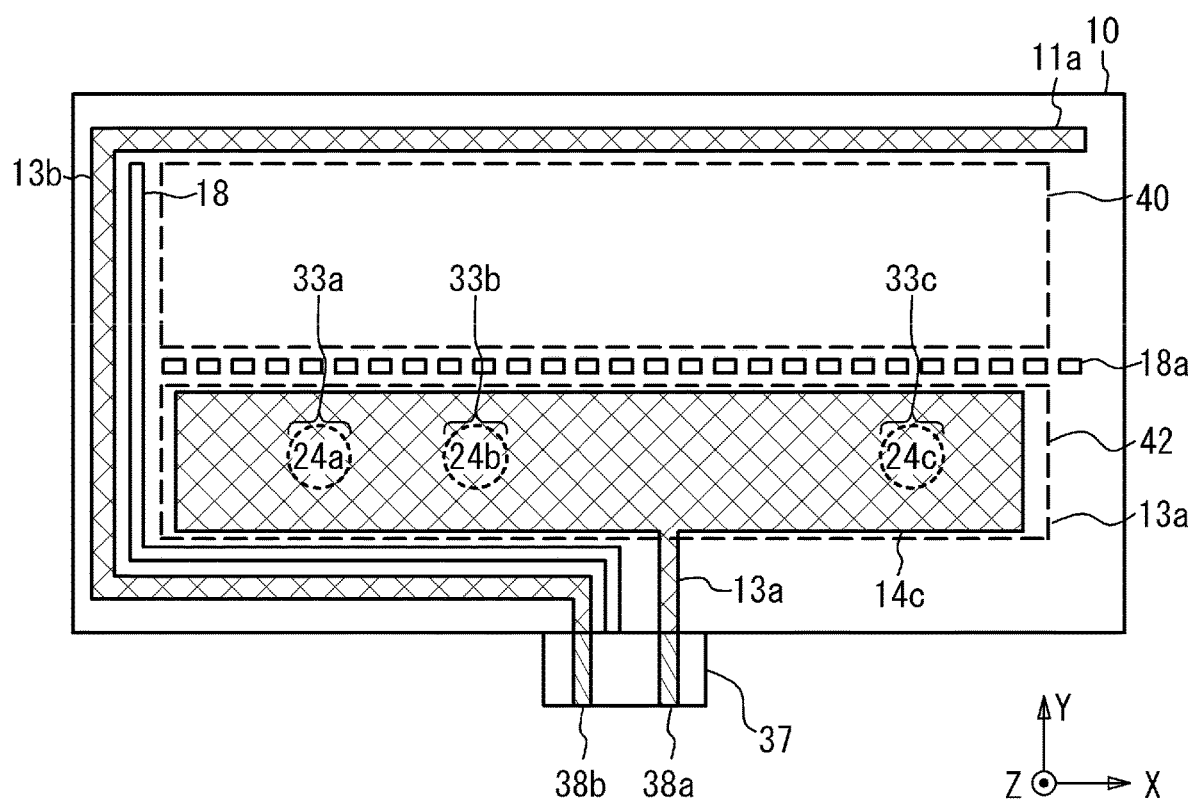
FIG. 20 is an enlarged plan view illustrating of a vicinity of the region 42 according to a second variation of the second embodiment.

FIG. 20 is an enlarged plan view illustrating of a vicinity of the region 42 of the conductive film 10 according to a second variation of the second embodiment. As illustrated in FIG. 20, the width of the electrodes 14c in the Y direction may be widened, and the regions 33a to 33c with which the electrodes 24a to 24c come into contact, respectively, may be provided in the electrodes 14c. Other configurations are the same as those in FIG. 18 of the first variation of the second embodiment, and the description thereof will be omitted. The plan view of the conductive film 20 is the same as that of FIG. 2B of the first embodiment.

According to a variation of the second embodiment, as illustrated in FIGS. 18 and 20, the slit 18a (i.e., remover) in which the conductive film 10 is locally removed in the form of a dashed or dotted line is provided in the conductive film 10, extends in the X direction, and faces the electrode 11a (i.e., first electrode) across the region 40 (i.e., first region) in the conductive film 10 in the Y direction. The electrode 14c (i.e., second electrode) is provided in the region 42 (i.e., second region) in the conductive film 10 located on an opposite side of the region 40 with respect to the slit 18a, extends in the X direction, faces the slit 18a in the Y direction, and is connected to the terminal 38a (i.e., first terminal). The buttons 54a to 54c of FIG. 1 and the regions 33a to 33c of FIGS. 18 and 20 are provided in the region 42, and arranged in the X direction. In the buttons 54a to 54c, the conductive films 10 and 20 can be electrically connected to each other. Thereby, by providing the two terminals 38a and 38b, it is possible to detect the Y coordinate in the region 40 and the on/off of the button 54a. Since only two terminals 38a and 38b can be used to electrically connect to the electrodes 11a, and 14a, the cost can be reduced. Further, it is not necessary to provide the wirings and the resistors on the upper and lower substrates as in Patent Document 1. Therefore, the cost can be further reduced.

In S30 of FIG. 17, when the potential of the conductive film 20 is closer to the potential of the terminal 38b than the potential of the conductive film 10 in the slit 18a, the control unit 30 detects the Y coordinate as in S32. When the potential of the conductive film 20 is closer to the potential of the terminal 38a than the potential of the conductive film 10 in the slit 18a, the control unit 30 detects the touch of the buttons 54a to 54c as in S34 to S38. In this way, the control unit 30 can detect the Y coordinate and the touch of the buttons 54a to 54c using the same method as in the second embodiment.

Third Embodiment

Figure 21:
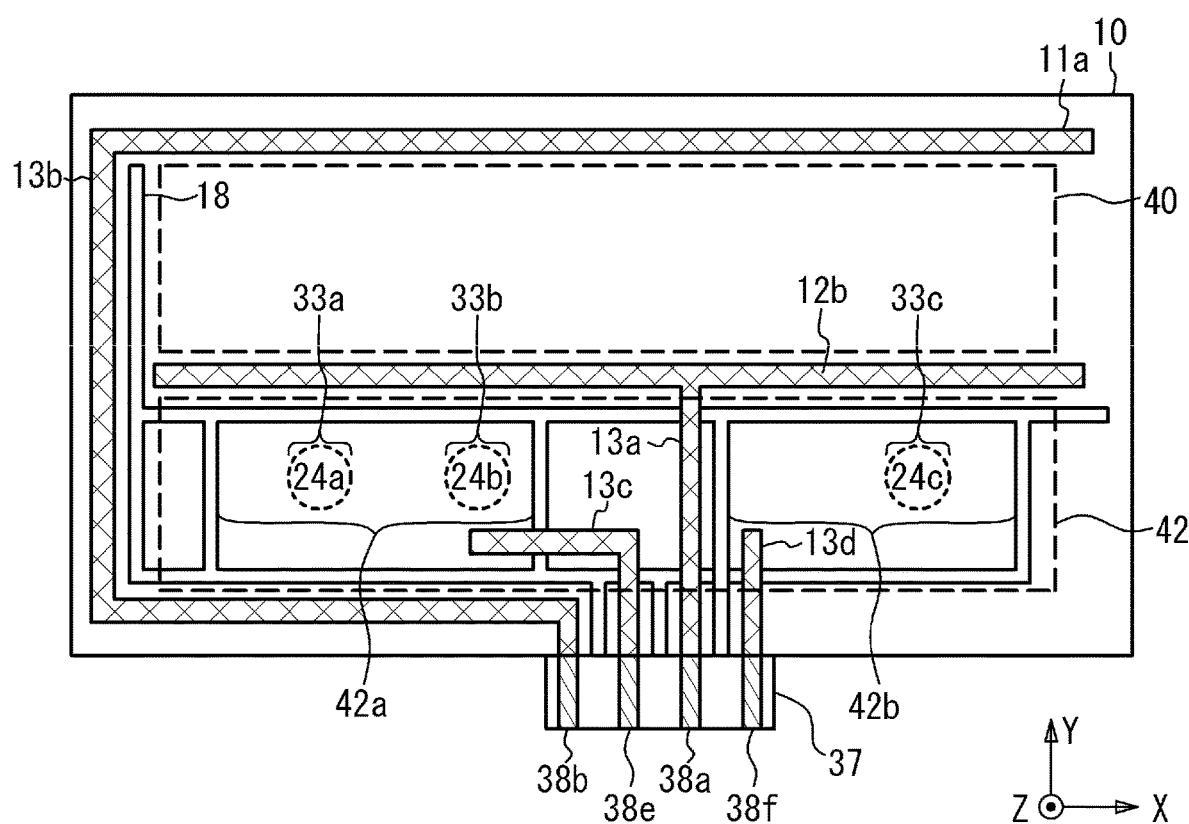
FIG. 21 is an enlarged plan view illustrating of a vicinity of the region 42 according to a third embodiment.

FIG. 21 is an enlarged plan view illustrating of a vicinity of the region 42 of the conductive film 10 according to a third embodiment. As illustrated in FIG. 21, the electrodes 11a and 12b are provided so as to face each other across the region 40. The region 42 includes regions 42a and 42b. The regions 42a and 42b are surrounded by the slit 18, and the conductive film 10 in the regions 42a and 42b is electrically separated from the conductive film 10 in the region 40. The regions 33a and 33b with which the electrodes 24a and 24b are in contact are provided in the region 42a, and the region 33c with which the electrode 24c is in contact is provided in the region 42b. The conductive film 10 in the regions 42a and 42b is connected to terminals 38e and 38f via the electrodes 13c and 13d, respectively. Other configurations are the same as those in FIG. 15 of the second embodiment, and the description thereof will be omitted. The plan view of the conductive film 20 is the same as that of FIG. 2B of the first embodiment.

Figure 22:
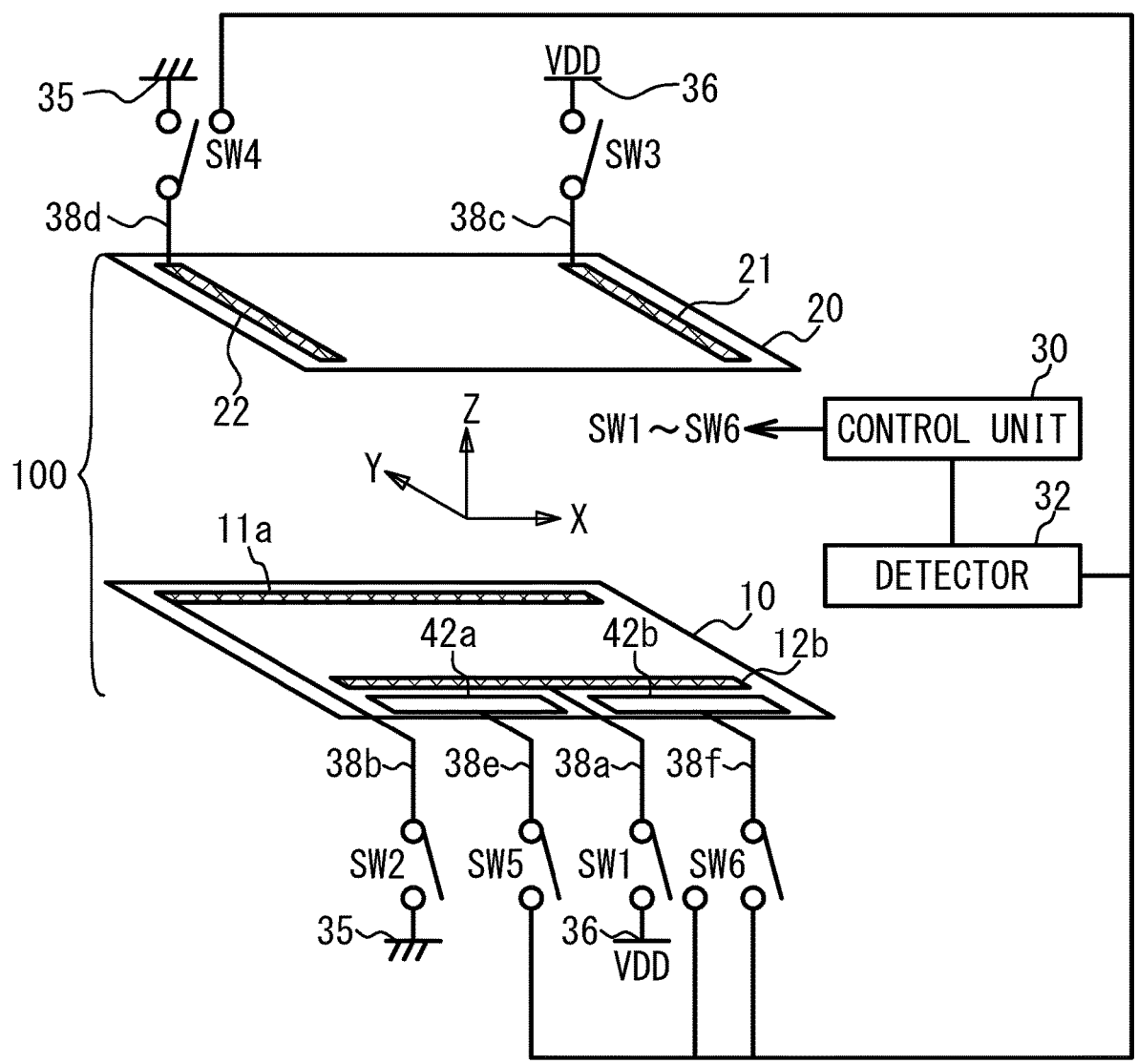
FIG. 22 is a schematic diagram of the touch panel device according to the third embodiment.

FIG. 22 is a schematic diagram of the touch panel device according to the third embodiment. As illustrated in FIG. 22, switches SW5 and SW6 are provided in addition to FIG. 5 of the first embodiment. The switch SW5 connects the terminal 38e to the detector 32. The switch SW6 connects the terminal 38f to the detector 32. Other configurations are the same as those in FIG. 5 of the first embodiment, and the description thereof will be omitted.

Figure 23:
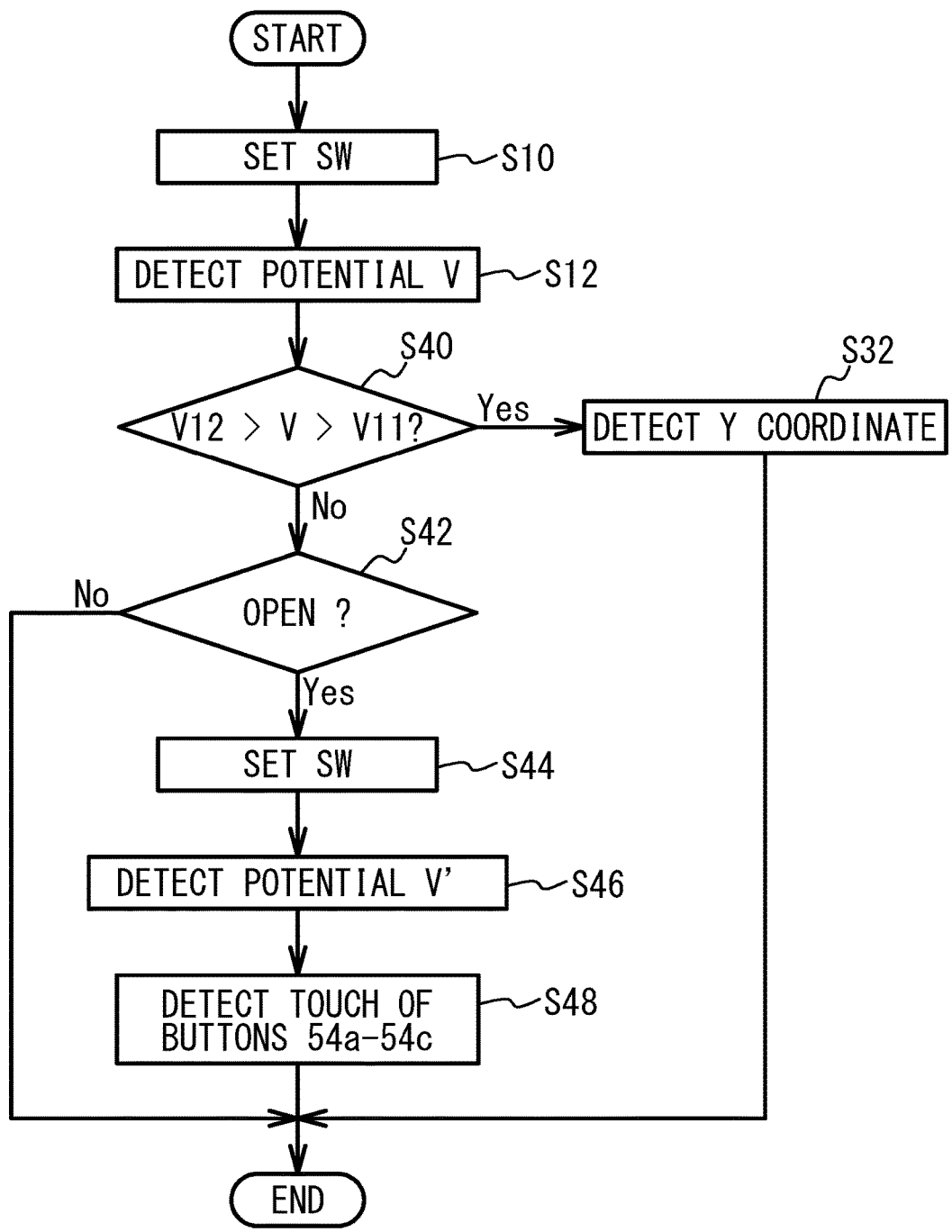
FIG. 23 is a flowchart illustrating a process of the control unit according to the third embodiment.

FIG. 23 is a flowchart illustrating a process of the control unit according to the third embodiment. As illustrated in FIG. 23, in S10, the control unit 30 connects the terminals 38a and 38b to the power supply 36 and the ground 35, respectively, and connects the terminals 38c and 38d to the floating and the detector 32, respectively. Further, the control unit 30 causes the switches SW5 and SW6 to float the terminals 38e and 38f. The control unit 30 causes the detector 32 to detect the potential V of the conductive film 20 and acquires the detection result (S12). The control unit 30 determines whether the potential V satisfies V12>V>V11 (S40). When the determination of S40 is Yes, the control unit 30 detects the Y coordinate of the touch position in the region 40 based on the potential V (S32).

When the determination of S40 is Yes, the control unit 30 determines whether the potential V is opened (S42). When the determination of S42 is No, the process ends. When the determination of S42 is Yes, the control unit 30 causes the switches SW1 and SW2 to float the terminals 38a and 38b, the switch SW3 to connect the terminal 38c to the power supply 36, the switch SW4 to connect the terminal 38d to the ground 35, and the switches SW5 and SW6 to connect the terminals 38e and 38f to the detector 32 (S44). The control unit 30 causes the detector 32 to detect the potential V' of the conductive film 10 in the region 42a or 42b, and acquires the detection result (S46). The control unit 30 determines which of the buttons 54a to 54c is pressed based on the potential V' of the conductive film 10 (S48). That is, when the control unit 30 determines that the potential V' is the potential of the electrodes 24a to 24c, it determines that the buttons 54a to 54c are pressed, respectively. Then, the process ends.

As in the third embodiment, the regions 33a to 33c are provided in the conductive films 10 in the regions 42a and 42b electrically separated from the conductive film 10 in the region 40, and the control unit 30 may determine which of the buttons 54a to 54c is pressed based on the potential of the conductive film 10 in the regions 42a and 42b.

According to the third embodiment, the region 42 is provided on the opposite side of the region 40 (i.e., first region) with respect to the electrode 12b, and is electrically separated from the region 40, as shown in FIG. 21. The buttons 54a to 54c of FIG. 1 (i.e., regions 33a to 33c of FIG. 21) are provided in the region 42, and the conductive films 10 and 20 can be electrically connected to each other. The electrodes 13c and 13d are provided on the conductive film 10 in the regions 42a and 42b and are connected to the terminals 38e and 38f. That is, the buttons 54a and 54b (i.e., first switch) are provided in the region 42a (i.e., second region), and the buttons 54c (i.e., second switch) are provided in the region 42b (i.e., third region). The electrode 13c (i.e., third electrode) is provided in the region 42a and is connected to the terminal 38e (i.e., third terminal), and the electrode 13d (i.e., fourth electrode) is provided in the region 42b and is connected to the terminal 38f (i.e., fourth terminal).

As in S10 of FIG. 23, the control unit 30 applies the voltage between the terminals 38a and 38b. As in S40 and S32, when the potential V of the conductive film 20 is a range between the potential V11 of the electrode 11a (i.e., first electrode) and the potential V12 of the electrode 12b (i.e., second electrode), the control unit 30 detects the contact position of the conductive films 10 and 20 in the Y direction in the region 40 based on the potential V of the conductive film 20. When the conductive film 20 is opened as in S42, the control unit 30 applies the voltage between the electrodes 21 and 22 (i.e., fifth electrode), and detects on/off of the buttons 54a to 54c based on the potentials of the terminals 38e and 38f (i.e., third electrode), as in S44 to S48. This makes it possible to detect the touch of the buttons 54a to 54c using the terminals 38e and 38f.

Fourth Embodiment

Figure 24A:
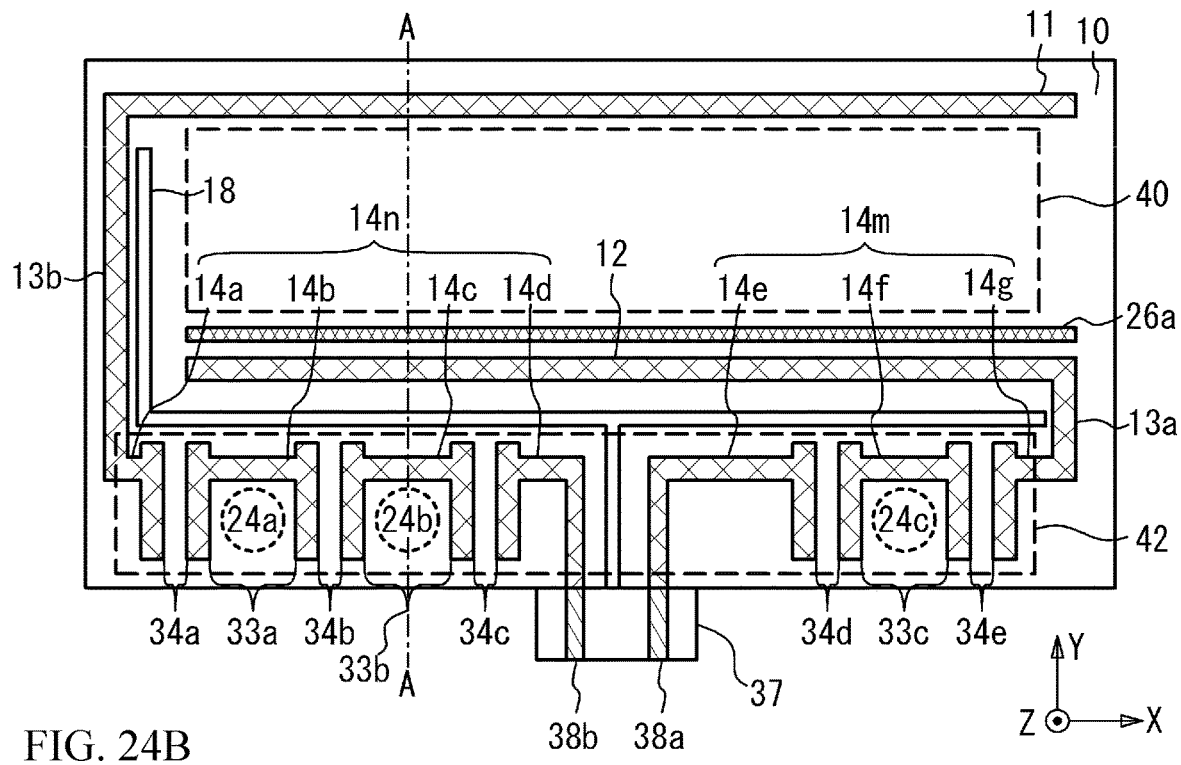
FIG. 24A is a plan view of the conductive film 10 according to a fourth embodiment.
Figure 24B:
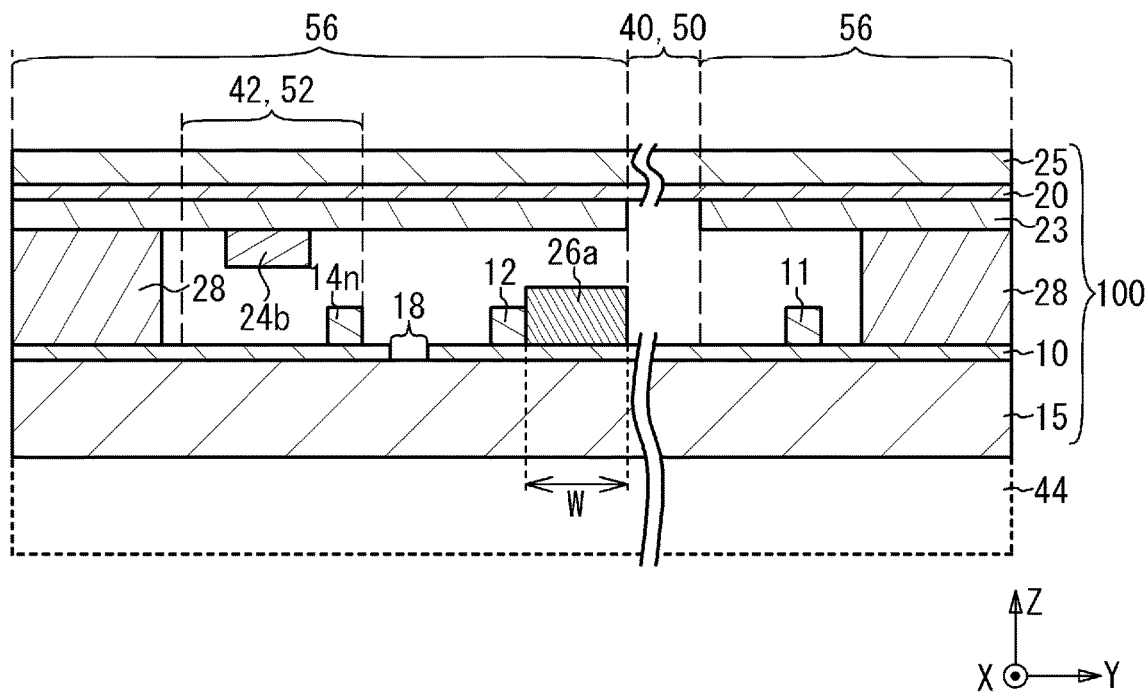
FIG. 24B is a cross-sectional view taken along line A-A of FIG. 24A.

FIG. 24A is a plan view of the conductive film 10 according to a fourth embodiment. FIG. 24B is a cross-sectional view taken along line A-A of FIG. 24A. As illustrated in FIGS. 24A and 24b, an insulating layer 26a may be provided between the regions 40 and 42. The conductive film 20 is not electrically connected to a region where the insulating layer 26a is provided. Therefore, it is possible to suppress erroneous detection as to which of the regions 40 and 42 is pressed. The insulating layer 26a is, for example, a resin insulator. The insulating layer 26a may be provided on the electrode 12, or may be provided between the electrode 12, and the electrodes 14n and 14m. A width W of the insulating layer 26a in the Y direction is, for example, 4 mm. Other configurations are the same as those of the first embodiment, and the description thereof will be omitted.

Variation

Figure 25A:
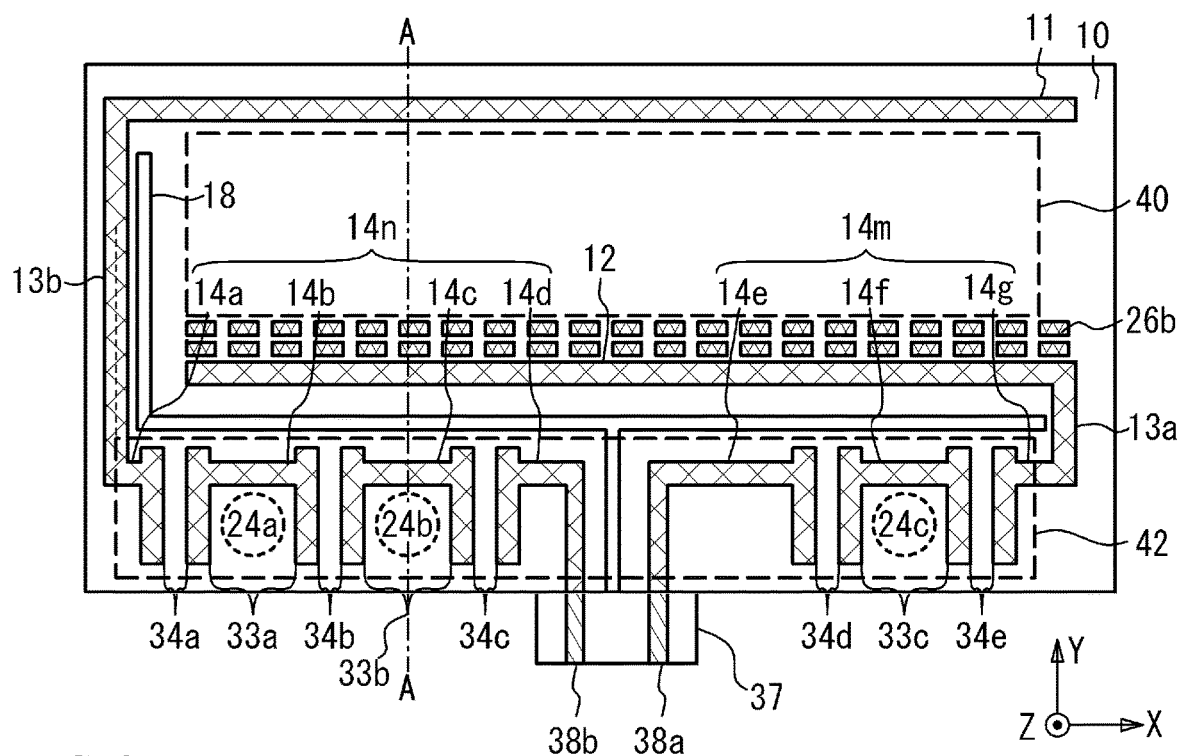
FIG. 25A is a plan view of the conductive film 10 according to a variation of the fourth embodiment.
Figure 25B:
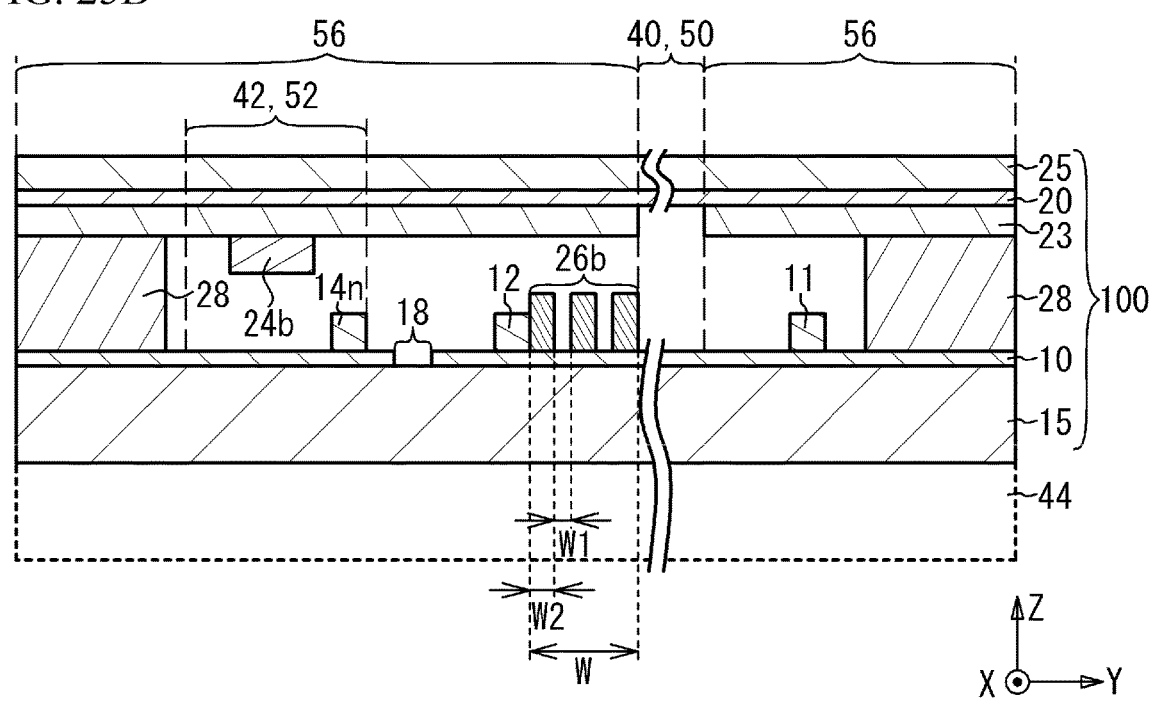
FIG. 25B is a cross-sectional view taken along line A-A of FIG. 25A.

FIG. 25A is a plan view of the conductive film 10 according to a variation of the fourth embodiment. FIG. 25B is a cross-sectional view taken along line A-A of FIG. 25A. As illustrated in FIGS. 25A and 25B, a plurality of dot-shaped insulating layers 26b may be provided between the regions 40 and 42. The number of the insulating layers 26b in the Y direction may be two as illustrated in FIG. 25A or three as illustrated in FIG. 25B. The number of the insulating layers 26b in the Y direction is one or more. The insulating layer 26b is, for example, the resin insulator. A width W of the insulating layer 26b in the Y direction is, for example, 4 mm, a width W2 of the dot is, for example, 0.2 mm, and an interval W1 between the dots is, for example, 0.2 mm to 0.5 mm. The insulating layer 26b can suppress erroneous detection as to which of the regions 40 and 42 is pressed. A center of the insulating layer 26b in the Y direction may be provided in a range of ±3 mm in the Y direction, for example, with respect to a boundary between the regions 40 and 42. Other configurations are the same as those of the fourth embodiment, and the description thereof will be omitted. The insulating layer 26a or 26b may be used in the first to third embodiments and the variations thereof.

According to the fourth embodiment and the first variation thereof, as illustrated in FIGS. 24B and 25B, any of the insulating layers 26a and 26b is provided between the conductive films 10 and 20 and between the region 42 (region 52) where the buttons 54a to 54c are provided and the region 40. Thereby, erroneous detection of the regions 40 and 42 can be suppressed.

Fifth Embodiment

Figure 26A:
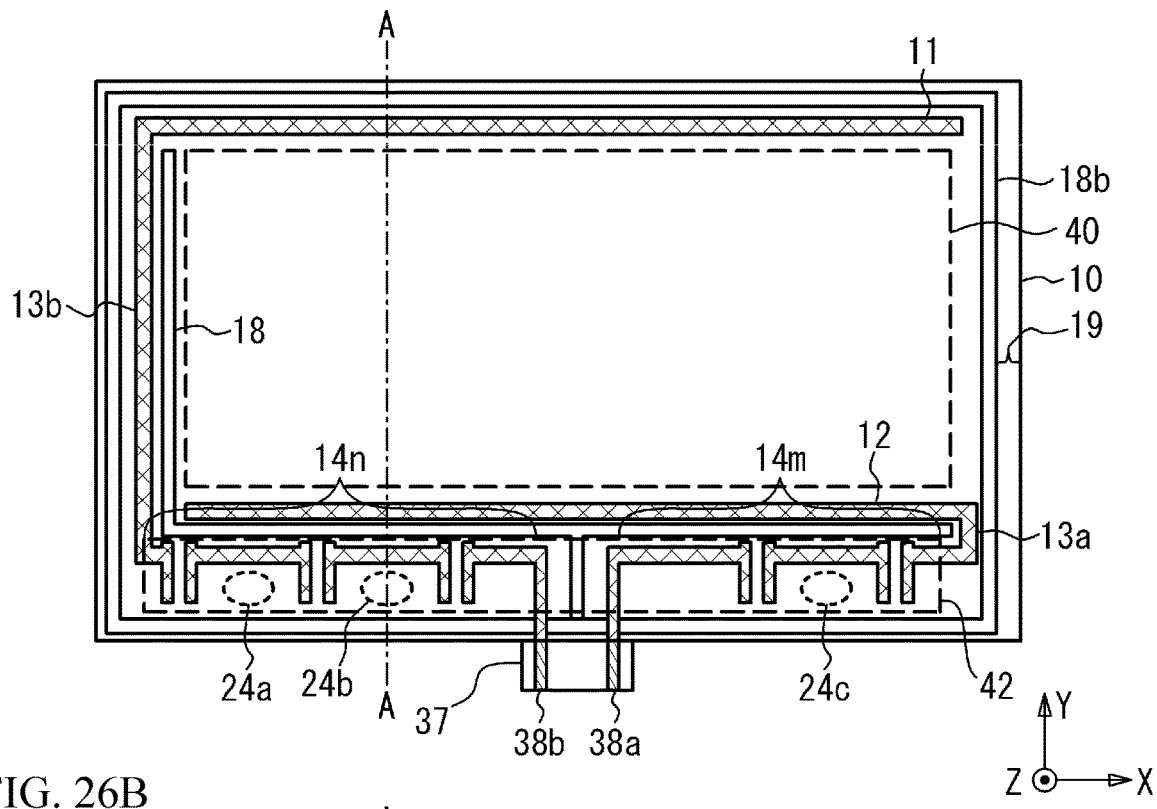
FIGS. 26A and 26B are plan views of the conductive film according to a fifth embodiment.
Figure 26B:
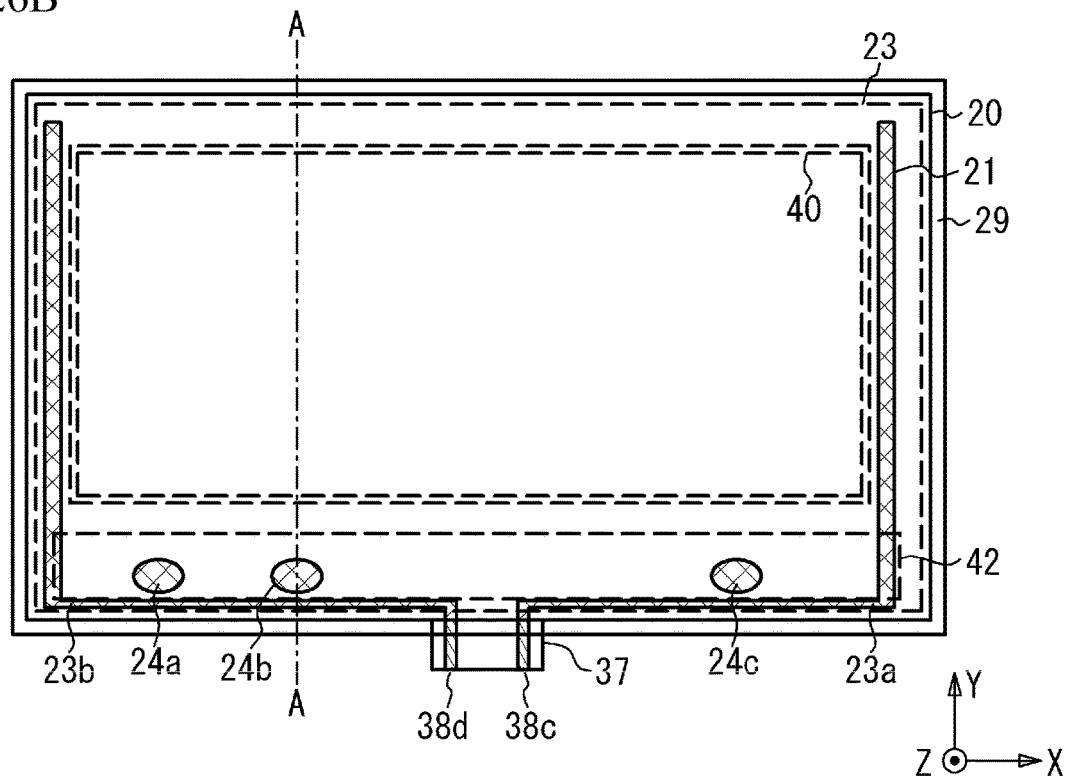
Figure 27:
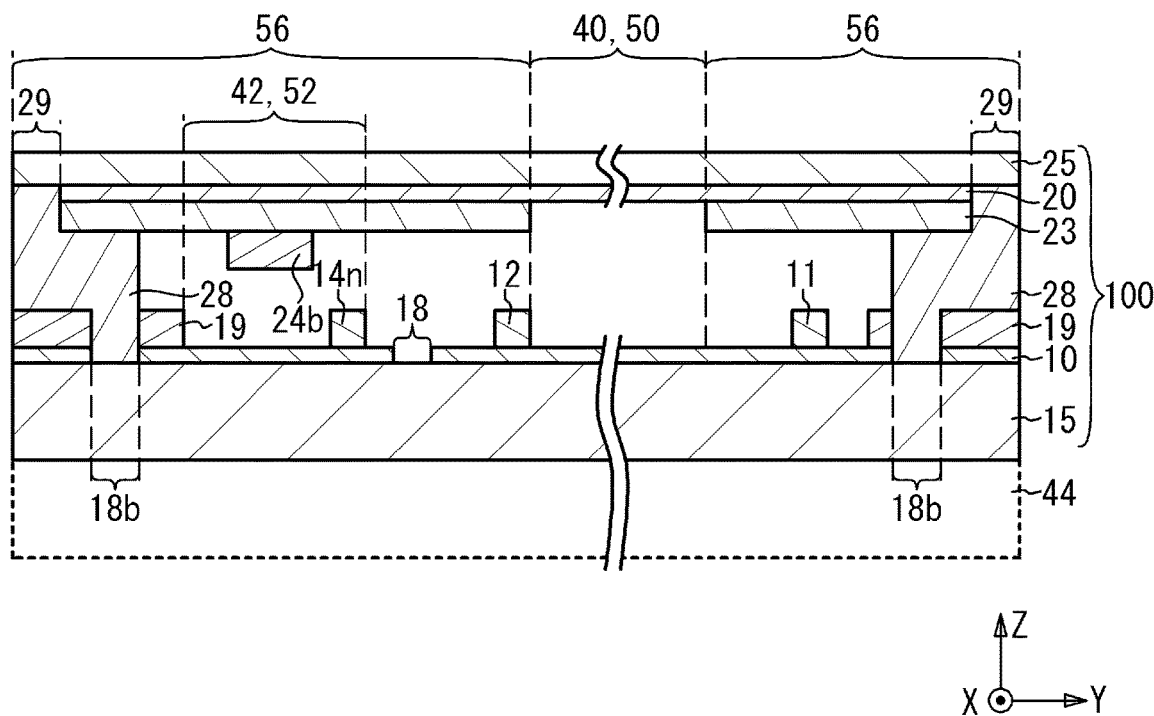
FIG. 27 is a cross-sectional view taken along line A-A of FIGS. 26A and 26B.

FIGS. 26A and 26B are plan views of the conductive film according to a fifth embodiment. FIG. 27 is a cross-sectional view taken along line A-A of FIGS. 26A and 26B. As illustrated in FIGS. 26A to 27, a decorative layer 19 is provided on the conductive film 10 on the peripheral edge of the substrate 15, and the decorative layer 23 is provided under the conductive film 20 on the peripheral edge of the substrate 25. A slit 18b from which the conductive film 10 and the decorative layer 19 are removed is provided on the peripheral edge of the substrate 15. The slit 18b is provided over the entire circumference of the peripheral edge of the substrate 15 and slightly inside an outer periphery of the substrate 15. A removal portion 29 from which the conductive film 20 and the decorative layer 23 have been removed is provided on the peripheral edge of the substrate 25. The removal portion 29 is provided on the outer periphery of the substrate 25 over the entire circumference of the periphery of the substrate 25. Other configurations are the same as those of the first embodiment, and the description thereof will be omitted.

The slit 18b and the removal portion 29 are provided as measures of anti-static electricity. When the slit 18b and the removal portion 29 are not provided, when a surge due to the static electricity such as ESD (Electro-Static Discharge) is applied to the side surfaces of the substrates 15 and 25, the surge is applied to the inside of the touch panel through the conductive films 10 and 20, and the electrodes and the like might be damaged. By providing the slit 18b and the removal portion 29, even if the surge due to the static electricity is applied to the side surfaces of the substrates 15 and 25, it is possible to suppress the surge from being applied to the electrodes inside the touch panel, and it is possible to suppress the damage caused by the static electricity.

The removal portion 29 is formed by irradiating the laser beam after forming the decorative layer 23. Therefore, the decorative layer 23 is also removed in the removal portion 29. Further, when the decorative layer 23 is conductive, the surge due to the static electricity is applied to the inside of the touch panel through the decorative layer 23. Therefore, the decorative layer 23 is also removed in the removal portion 29. When the decorative layer 19 is not provided as in the first embodiment, and the removal portion 29 is visually recognized from above, the substrate 25, the bonding layer 28, the conductive film 10 and the substrate 15 are transparent, so that the appearance is impaired. As in the fifth embodiment, the decorative layer 19 is provided so as to overlap the removal portion 29 when viewed from above, so that the decorative layer 19 can be seen at the position of the removal portion 29 when viewed from above. By making the decorative layer 19 the same opaque color (for example, black) as the decorative layer 23, it is possible to suppress the appearance from being impaired.

Variation

Figure 28A:
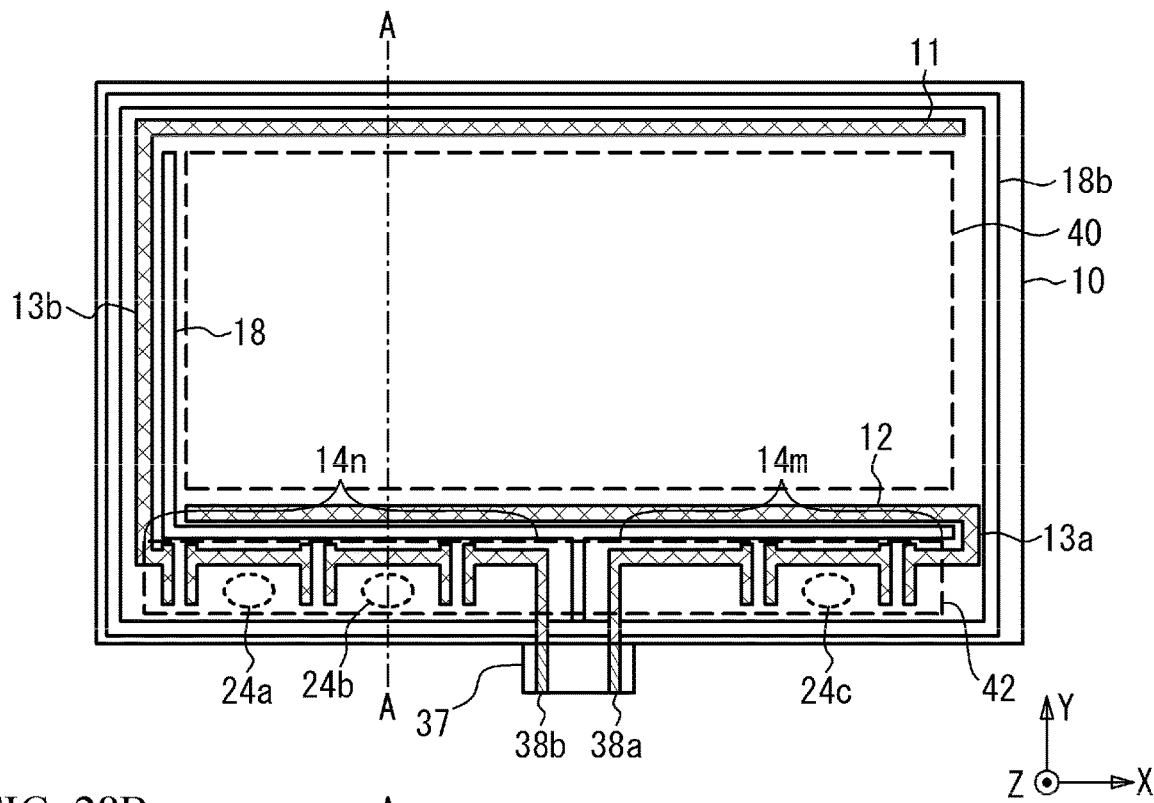
FIGS. 28A and 28B are plan views of the conductive film according to a variation of the fifth embodiment.
Figure 28B:
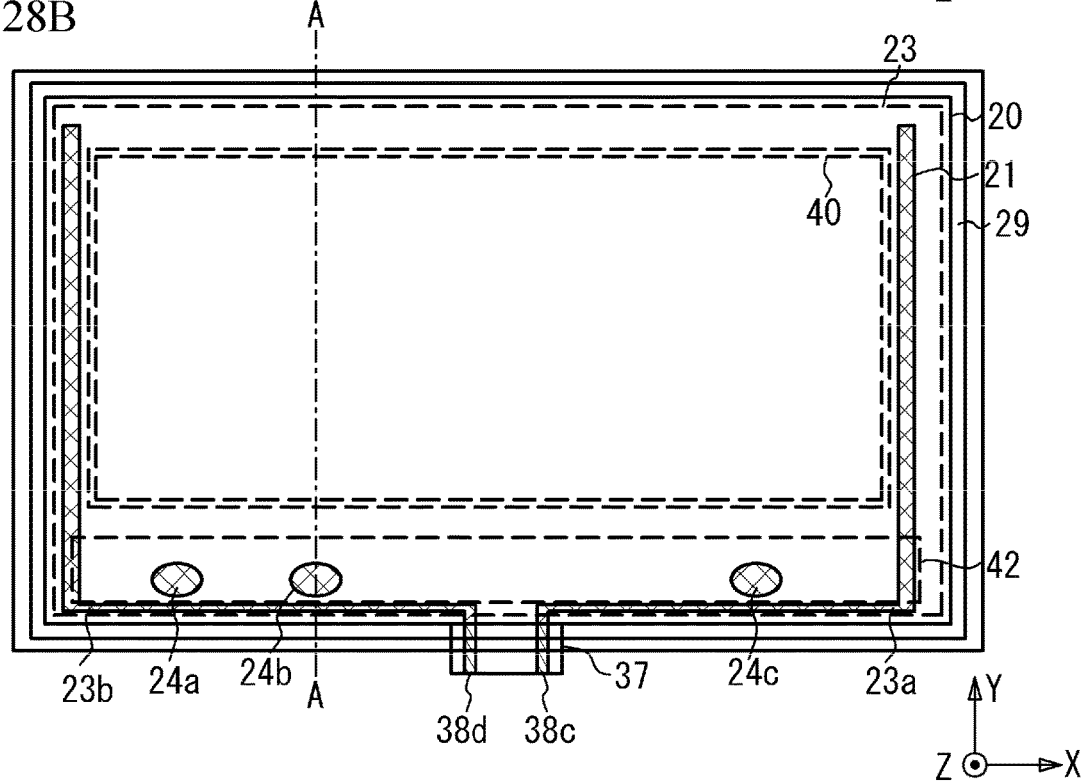
Figure 29:
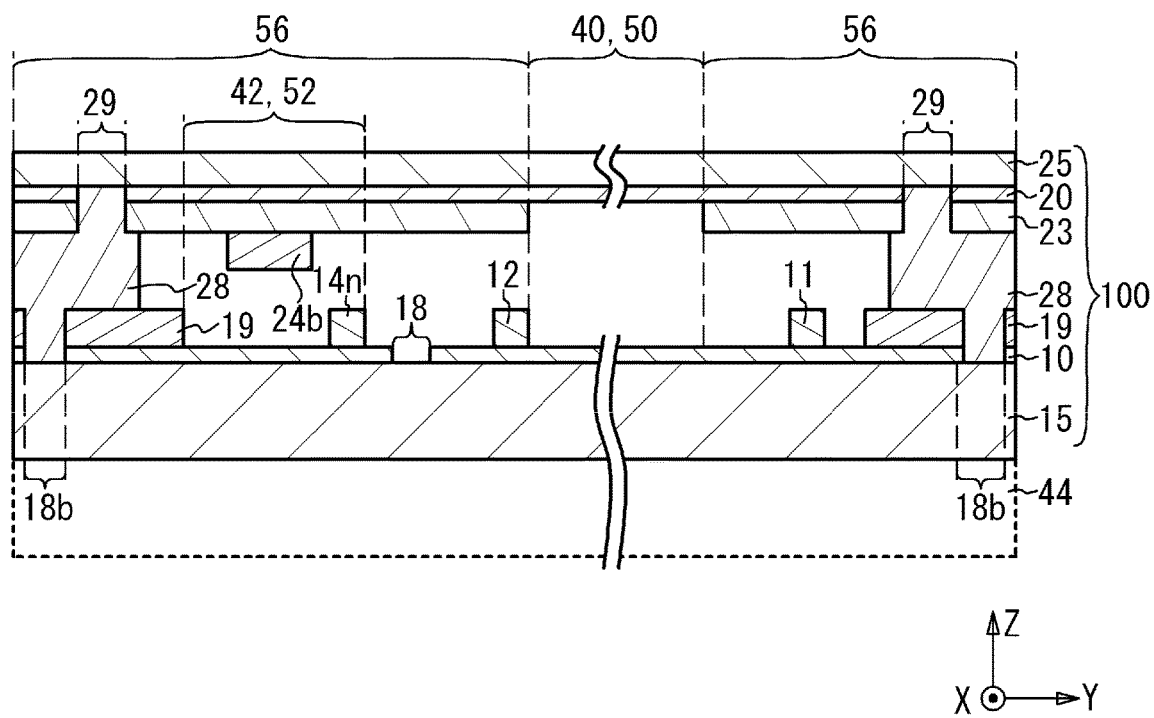
FIG. 29 is a cross-sectional view taken along line A-A of FIGS. 28A and 28B.

FIGS. 28A and 28B are plan views of the conductive film according to a variation of the fifth embodiment. FIG. 29 is a cross-sectional view taken along line A-A of FIGS. 28A and 28B. As illustrated in FIGS. 28A to 29, the removal portion 29 is provided away from the outer periphery of the substrate 25. Other configurations are the same as those of the fifth embodiment, and the description thereof will be omitted.

As in the variation of the fifth embodiment, the removal portion 29 may be separated from the outer circumference of the substrate 25. When viewed from above, the removal portion 29 overlaps with the decorative layer 19, so that the appearance can be suppressed from being impaired. The removal portion 29 and the decorative layer 19 of the fifth embodiment and the variation may be used for the first to fourth embodiment and the variations thereof.

According to the fifth embodiment and the first variation, the transparent conductive film 20 is provided under the transparent substrate 25, and the transparent bonding layer 28 bonds the conductive films 10 and 20 at the peripheral edge of the substrate 25. In order to form the frame portion 56 of FIG. 1, the opaque decorative layer 23 is provided between the conductive film 20 and the bonding layer 28 at the peripheral edge of the substrate 25. When the removal portion 29 from which the conductive film 20 and the decorative layer 23 have been removed is provided on the peripheral edge of the substrate 25 as the measure of the anti-static electricity, the bonding layer 28 and the conductive film 20 can be visually recognized via the removal portion 29 when viewed from above, and the appearance is impaired. Therefore, the opaque decorative layer 19 is provided between the bonding layer 28 and the conductive film 10 so as to overlap the removal portion 29 when viewed from above. Thereby, the decorative layer 19 can be seen through the removal portion 29, so that the appearance can be suppressed from being impaired.

In the first to fifth embodiments and the variations thereof, when a distance between the lower surface of the electrodes 24a to 24c and the upper surface of the conductive film 10 (or the electrodes 14n and 14m) in the regions 33a to 33c is large, the deflection of the conductive film 20 and the decorative layer 23 becomes large, and the conductive film 20 or the decorative layer 23 might be damaged. Therefore, the distance between the lower surface of the electrodes 24a to 24c and the upper surface of the conductive film 10 is preferably 100 μm or less. In order to suppress the electrodes 24a to 24c from unintentionally coming into contact with the conductive film 10, the distance between the lower surface of the electrodes 24a to 24c and the upper surface of the conductive film 10 is preferably 40 μm or more.

Sixth Embodiment

Figure 30:
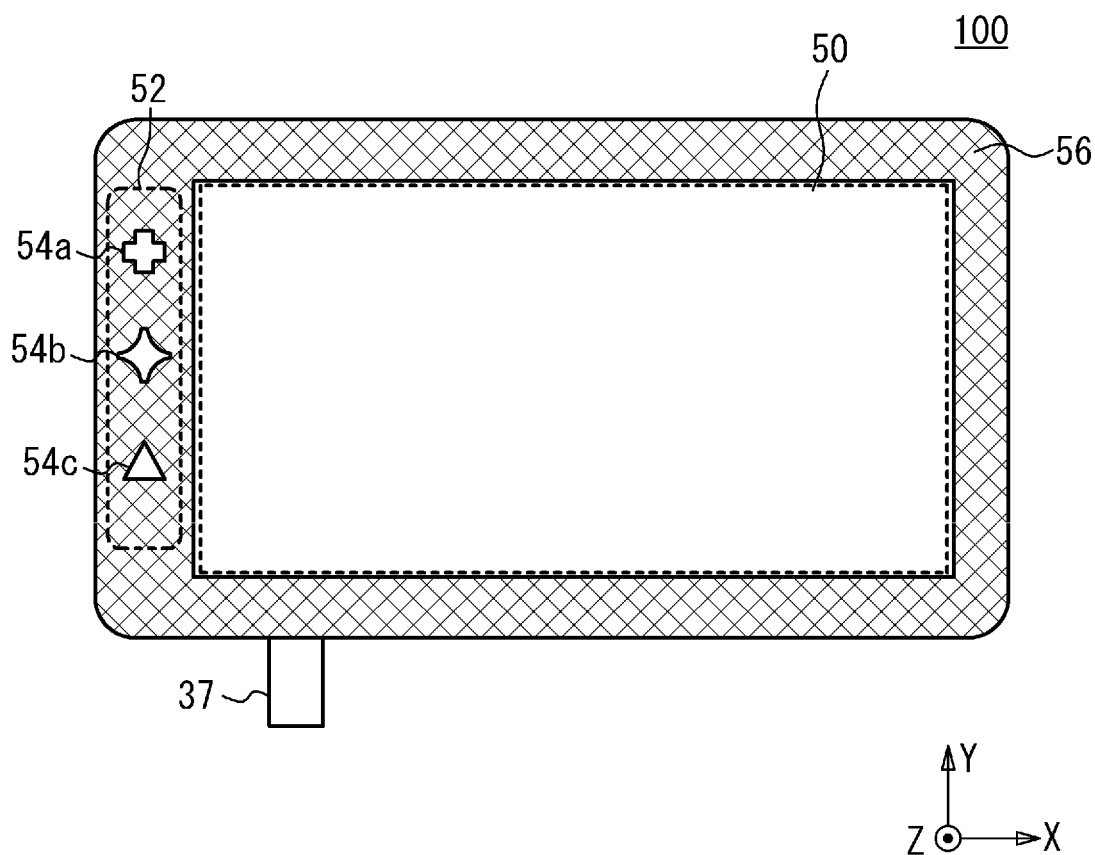
FIG. 30 is a plan view of the conductive film according to a sixth embodiment.

FIG. 30 is a plan view of the conductive film according to a sixth embodiment. It is assumed that, as illustrated in FIG. 30, an extension direction of the long side of the region 50 is the X direction, an extension direction of the short side is the Y direction, and the normal direction of the region 50 is the Z direction. The touch panel 100 includes the frame portion 56. An image is displayed on a region surrounded by the frame portion 56. By touching any part of the region 50 with the contacted portion such as the finger, the user can input the coordinates of the region 50 to the device including the touch panel 100. The region 52 is provided in the frame portion 56. The region 52 is provided with buttons 54a to 54c (i.e., switch). When the user touches any of the buttons 54a to 54c, the information about which of the buttons 54a to 54c is touched is input to the device including the touch panel 100. The FPC 37 outputs the signal from the touch panel 100.

Figure 31A:
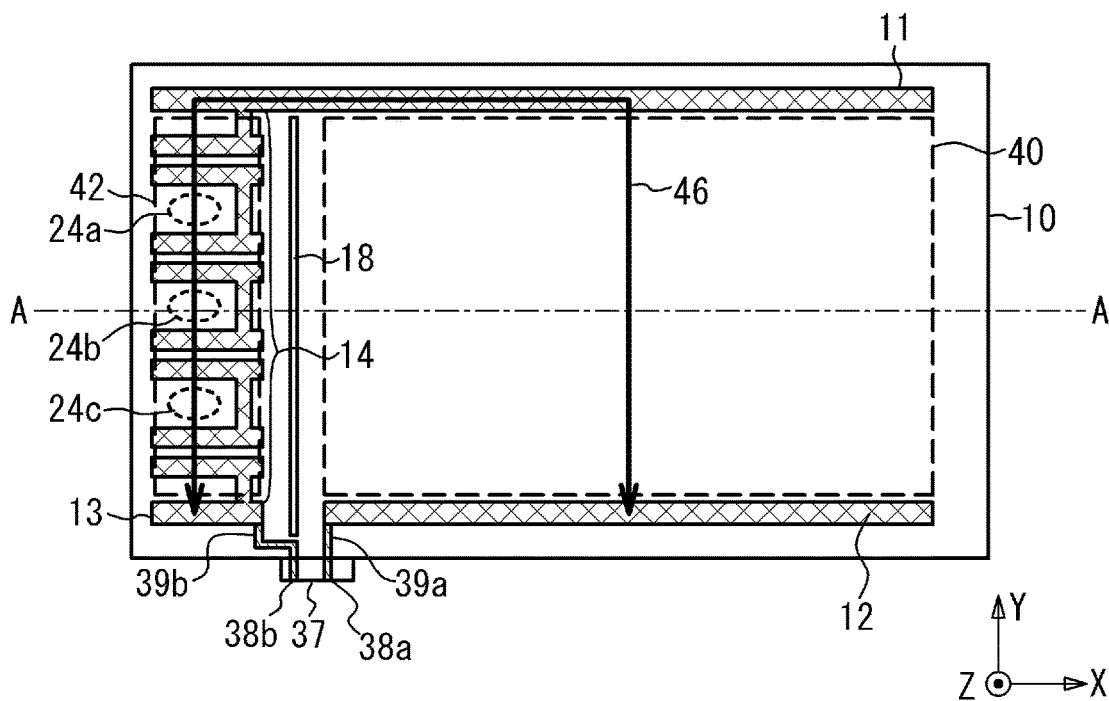
FIGS. 31A and 31B are plan views of the conductive film according to the sixth embodiment.
Figure 31B:
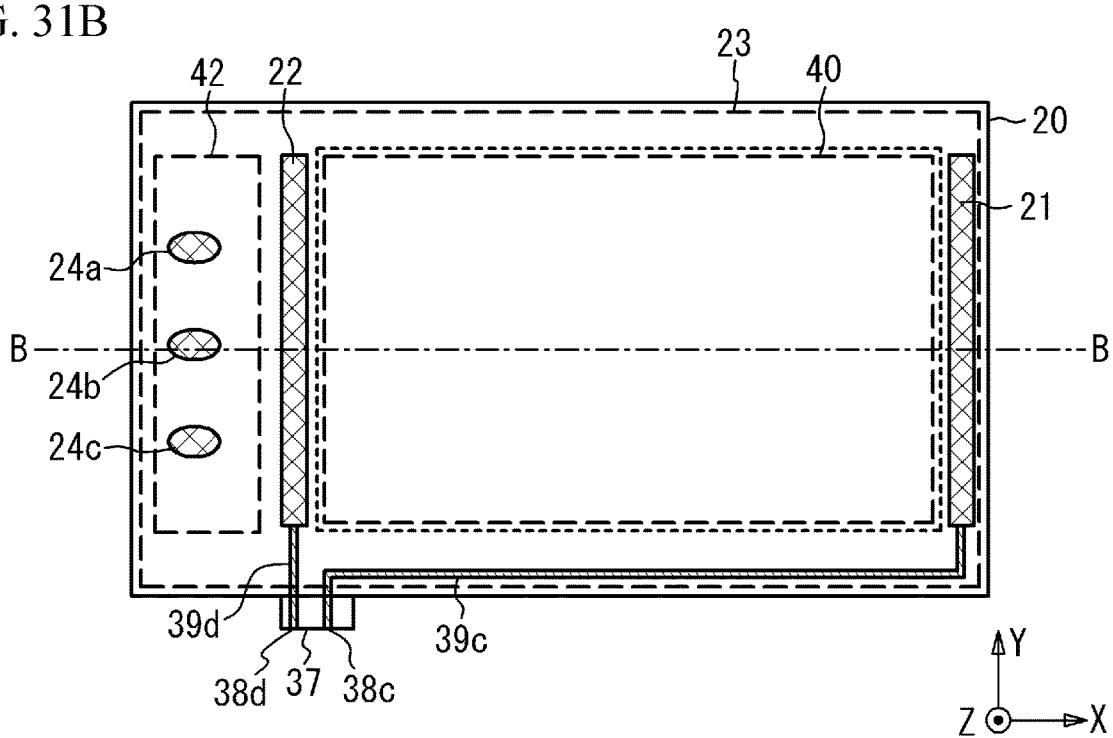
Figure 32:
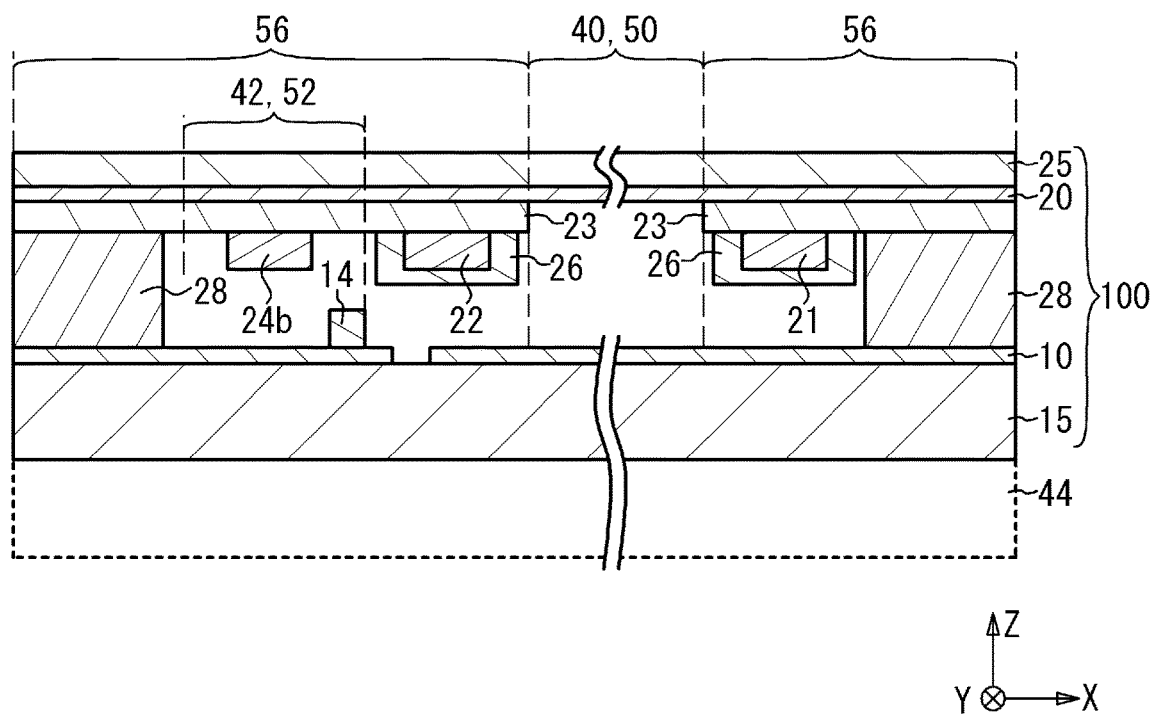
FIG. 32 is a cross-sectional view of the touch panel according to the sixth embodiment.

FIGS. 31A and 31B are plan views of the conductive film according to the sixth embodiment. FIG. 32 is a cross-sectional view of FIGS. 31A and 31B according to the sixth embodiment. As illustrated in FIGS. 31A and 32, the conductive film 10 is provided on the substrate 15. The regions 40 and 42 are arranged in the X direction. The electrodes 11 to 14 are provided on the upper surface of the conductive film 10. Wirings 39a and 39b are provided on the upper surface of the conductive film 10. The electrode 11 (i.e., second electrode) extends in the X direction along the side in the +Y direction of the conductive film 10. The electrodes 12 and 13 extend in the X direction along the side in the −Y direction of the conductive film 10. The electrode 12 (i.e., first electrode) faces the electrode 11 in the Y direction, and the electrode 11 and the electrode 12 are provided so as to sandwich the region 40 (i.e., first region). The electrode 13 (i.e., third electrode) is provided so as to sandwich the region 42 (i.e., second region) between the electrodes 11 and 13 in the Y direction.

The regions 50 and 52 in FIG. 30 correspond to the regions 40 and 42 in FIG. 31, respectively. The wirings 39a and 39b connect the electrodes 12 and 13 to the terminals 38a (i.e., first terminal) and 38b (i.e., second terminal) of the FPC 37, respectively. The slit 18 from which the conductive film 10 has been removed is provided between the regions 40 and 42. The slit 18 is formed by, for example, irradiating the laser beam. When the voltage is applied between the electrodes 12 and 13, the current flows to the electrode 12, the region 40, the electrode 11, the region 42 and the electrode 13 as indicated by the series path 46 with a bold arrow.

The substrate 25 is provided above the substrate 15. The conductive film 20 is provided on the lower surface of the substrate 25. The conductive film 20 is provided so as to face at least the regions 40 and 42 of the conductive film 10 across the gap. The decorative layer 23 is provided on the lower surface of the conductive film 20. The decorative layer 23 corresponds to the frame portion 56 in FIG. 30. The electrodes 21, 22 and 24a to 24c are provided on the conductive film 20 via the decorative layer 23 under the conductive film 20. The insulating film 26 is provided so as to cover the electrodes 21 and 22. Wirings 39c and 39d are provided on the lower surface of the conductive film 20. The electrodes 21 and 22 extend in the Y direction and are provided so as to sandwich the region 40. The electrode 21 is provided along the side in the +X direction of the conductive film 20, and the electrode 22 is provided between the regions 40 and 42. The wirings 39c and 39d connect the electrodes 21 and 22 to the terminals 38c and 38d of the FPC 37, respectively.

The peripheral edge of the conductive film 10 and the peripheral edge of the decorative layer 23 are joined by the bonding layer 28. The bonding layer 28 is the resin such as double-sided tape. The bonding layer 28 may be the double-sided tape that bonds the insulating layer provided on the upper surface of the conductive film 10 and the insulating layer provided on the lower surface of the decorative layer 23. The bonding layer 28 forms the gap between the conductive films 10 and 20 and between the conductive film 10 and the decorative layer 23. The substrate 15 is, for example, the glass substrate which is transparent and has rigidity. The substrate 25 is, for example, the resin film such as PET, which is transparent and has flexibility. Each of the conductive films 10 and 20 is, for example, an ITO which is transparent and have conductivity. The electrodes 11 to 14, 21, 22 and the wirings 39a to 39d are metal layers such as the silver layer, the gold layer or the copper layer, and are made of materials having the higher electrical conductivity than the conductive films 10 and 20. The electrodes 24a to 24c are made of the conductive material such as the metal layer or carbon, and the material having the electric conductivity close to or higher than the electric conductivity of the conductive films 10 and 20. When the electrodes 24a to 24c are made of the silver layer or the like, there is the concern that migration may occur. This concern can be eliminated by forming the electrodes 24a to 24c with carbon. The decorative layer 23 is the resin containing carbon, for example, is opaque, and has flexibility and conductivity. The upper surface of the decorative layer 23 is decorated with characters, symbols, patterns, and the like.

The display 44 is provided below the substrate 15, for example. When the user views the touch panel 100 from above, the image of the display 44 can be visually recognized in the regions 40 and 50. In the regions 42 and 52, the upper surface of the decorative layer 23 can be visually recognized. The electrodes 11 to 14, 21, 22, and 24a to 24c are hidden behind the decorative layer 23 and cannot be visually recognized. Since the substrate 25 is flexible, when the user touches the upper surface of the substrate 25 in the region 40, the conductive films 10 and 20 come into contact with each other. When the user touches any of the buttons 54a to 54c in the region 42, the conductive film 10 and any of the electrodes 24a to 24c come into contact with each other.

Figure 33:
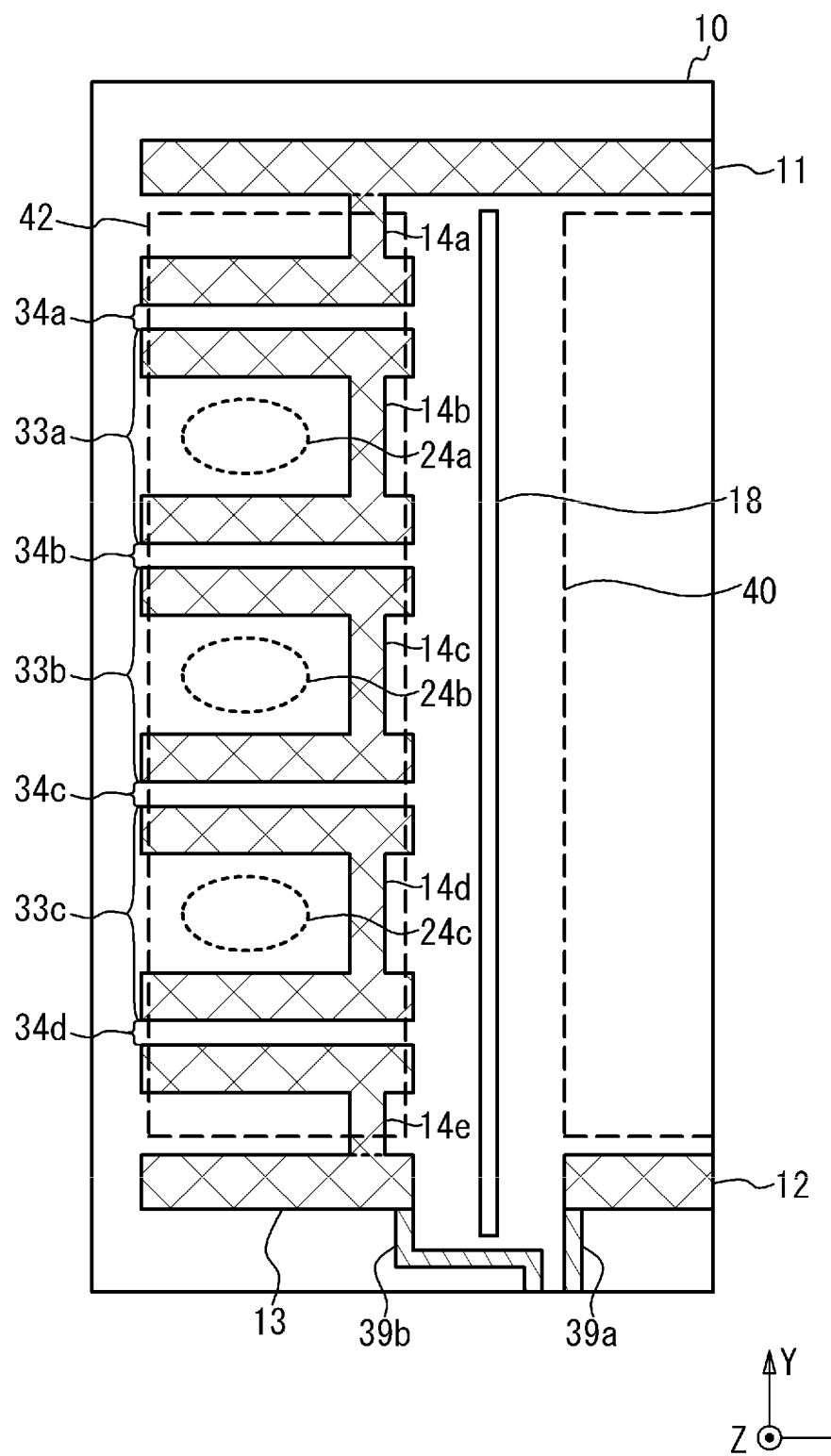
FIG. 33 is an enlarged plan view of an electrode 14 according to the sixth embodiment.

FIG. 33 is an enlarged plan view of the electrode 14 according to the sixth embodiment. As illustrated in FIG. 33, the electrode 14 include the electrodes 14a to 14e. The gaps 34a, 34b, 34c and 34d are provided between the electrodes 14a and 14b, between the electrodes 14b and 14c, between the electrodes 14c and 14d, and between the electrodes 14d and 14e, respectively. The regions between gaps 34a and 34b, between gaps 34b and 34c, and between gaps 34c and 34d are the regions 33a, 33b, and 33c, respectively. The current flowing between the electrodes 11 and 13 flows through the conductive film 10 at the gaps 34a to 34d. Therefore, the voltage drop occurs due to the resistance component of the conductive film 10. Since the resistance components of the electrodes 14a to 14e are sufficiently lower than the resistance component of the conductive film 10, the voltage drop hardly occurs in the electrodes 14a to 14e. In the regions 33a to 33c, the locations where the electrodes 24a to 24c come into contact with the conductive film 10 are surrounded by three sides of the electrodes 14b to 14d, respectively. The potentials of the conductive film 10 surrounded by the electrodes 14b to 14d are approximately the potentials of the electrodes 14b to 14d, respectively.

Figure 34:
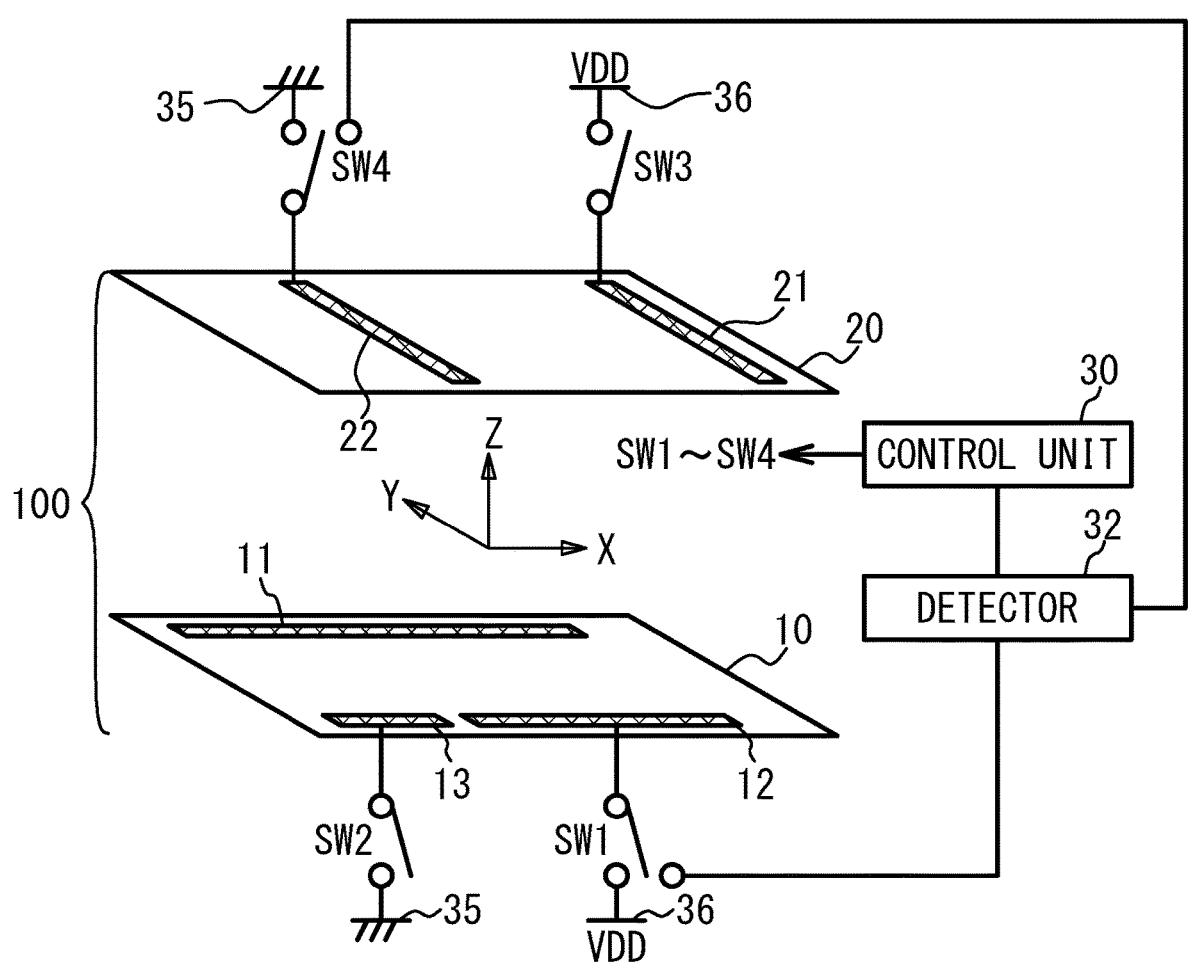
FIG. 34 is a schematic diagram of the touch panel device according to the sixth embodiment.

FIG. 34 is a schematic diagram of the touch panel device according to the sixth embodiment. As illustrated in FIG. 34, the touch panel device 102 includes the touch panel 100, the control unit 30, the switches SW1 to SW4, and the detector 32. The control unit 30, the switches SW1 to SW4, and the detector 32 are provided, for example, below the display 44 in FIG. 3 (along the −Z direction). The electrodes 12, 13, 21 and 22 and the switches SW1 to SW4 are connected by the FPC 37. The switch SW1 connects the electrode 12 to any one of the power supply 36 of the potential VDD and the detector 32. The switch SW2 connects the electrode 13 to the ground 35. The switch SW3 connects the electrode 21 to the power supply 36. The switch SW4 connects the electrode 22 to any one of the ground 35 and the detector 32. The detector 32 detects the voltages of the electrodes 12 and 22. The control unit 30 controls the switches SW1 to SW4 to acquire the voltage value detected from the detector 32. The control unit 30 detects the X and Y coordinates of the touch position where the user touches the upper surface of the substrate 25 in the region 40, and the touch of the buttons 54a to 54c, based on the voltage value detected by the detector 32. The control unit 30 is, for example, the processor such as the CPU, and functions as the detection unit or the detector in cooperation with software.

A detection method of the touch position will be described. First, the detection of the Y coordinate of the touch position in the region 40 and the detection of the touch of the buttons 54a to 54c will be described. The control unit 30 causes the switch SW1 to connect the electrode 12 to the power supply 36, the switch SW2 to connect the electrode 13 to the ground 35, the switch SW3 to float the electrode 21, and the switch SW4 to connect the electrode 22 to the detector 32.

Figure 35:
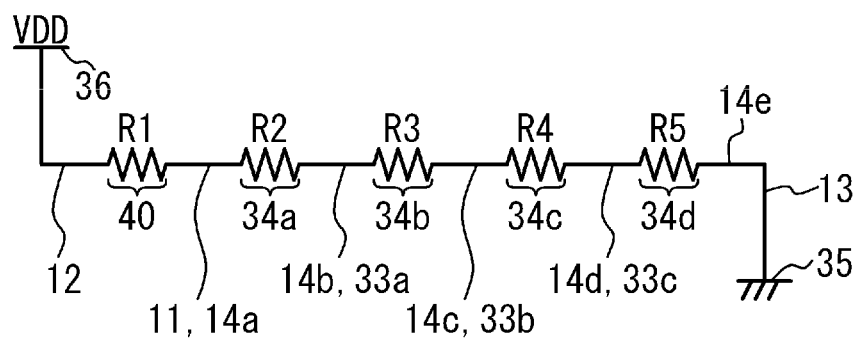
FIG. 35 is a diagram illustrating an equivalent circuit of the conductive film 10 according to the sixth embodiment.

FIG. 35 is a diagram illustrating an equivalent circuit of the conductive film 10 according to the sixth embodiment. FIG. 35 illustrates the equivalent circuit of the series path 46 from the electrode 12 to the electrode 13 in FIG. 31A. As illustrated in FIG. 35, the resistors R1 to R5 are connected in series between the power supply 36 and the ground 35. The resistors R1, R2, R3, R4, and R5 correspond to the resistance components of the conductive film 10 in the region 40, and the gaps 34a, 34b, 34c and 34d, respectively. A line between the power supply 36 and the resistor R1 corresponds to the electrode 12, a line between the resistors R1 and R2 corresponds to the electrodes 11 and 14a, a line between the resistors R2 and R3 corresponds to the electrode 14b and the region 33a, a line between the resistors R3 and R4 corresponds to the electrode 14c and the region 33b, a line between the resistors R4 and R5 corresponds to the electrode 14d and the region 33c, and a line between the resistor R5 and the ground 35 corresponds to the electrodes 14e and 13.

Figure 36:
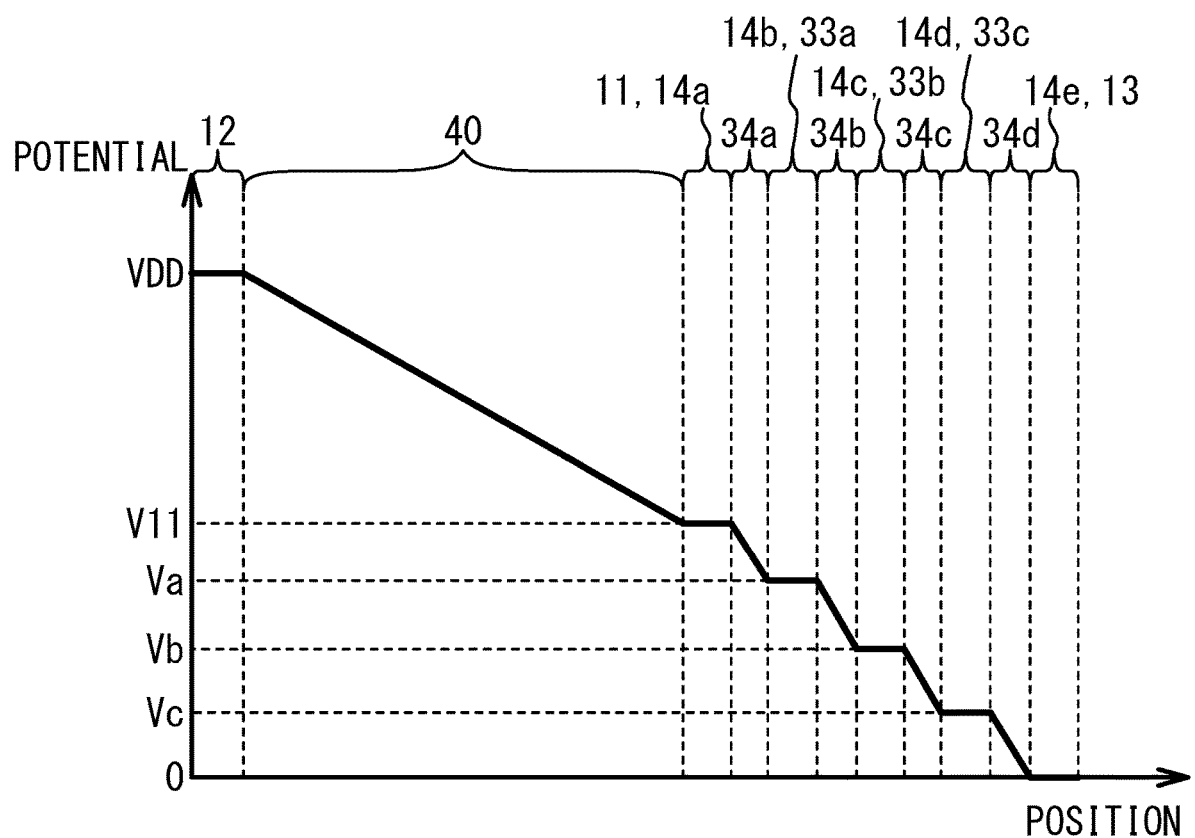
FIG. 36 is a diagram illustrating an electric potential with respect to a position in the series path in the sixth embodiment.

FIG. 36 is a diagram illustrating an electric potential with respect to a position in the series path in the sixth embodiment. As illustrated in FIG. 36, the potential of the electrode 12 is VDD, and the potential of the electrodes 14e and 13 is 0V. Since the electrical conductivity of the conductive film 10 is much lower than that of the electrodes 11 to 13 and 14a to 14e (for example, the former is equal to or less than 1/100 of the latter), the voltage drop occurs mostly in the region 40 and the gaps 34a to 34d, and the voltage drop hardly occurs in the electrode 11, 12 and 14a, the regions 33a to 33c and the electrode 14e and 13. The potentials of the electrodes 12 and 11, the regions 33a, 33b and 33c, and the electrode 13 are VDD, V11, Va, Vb and 0V, respectively.

Figure 37:
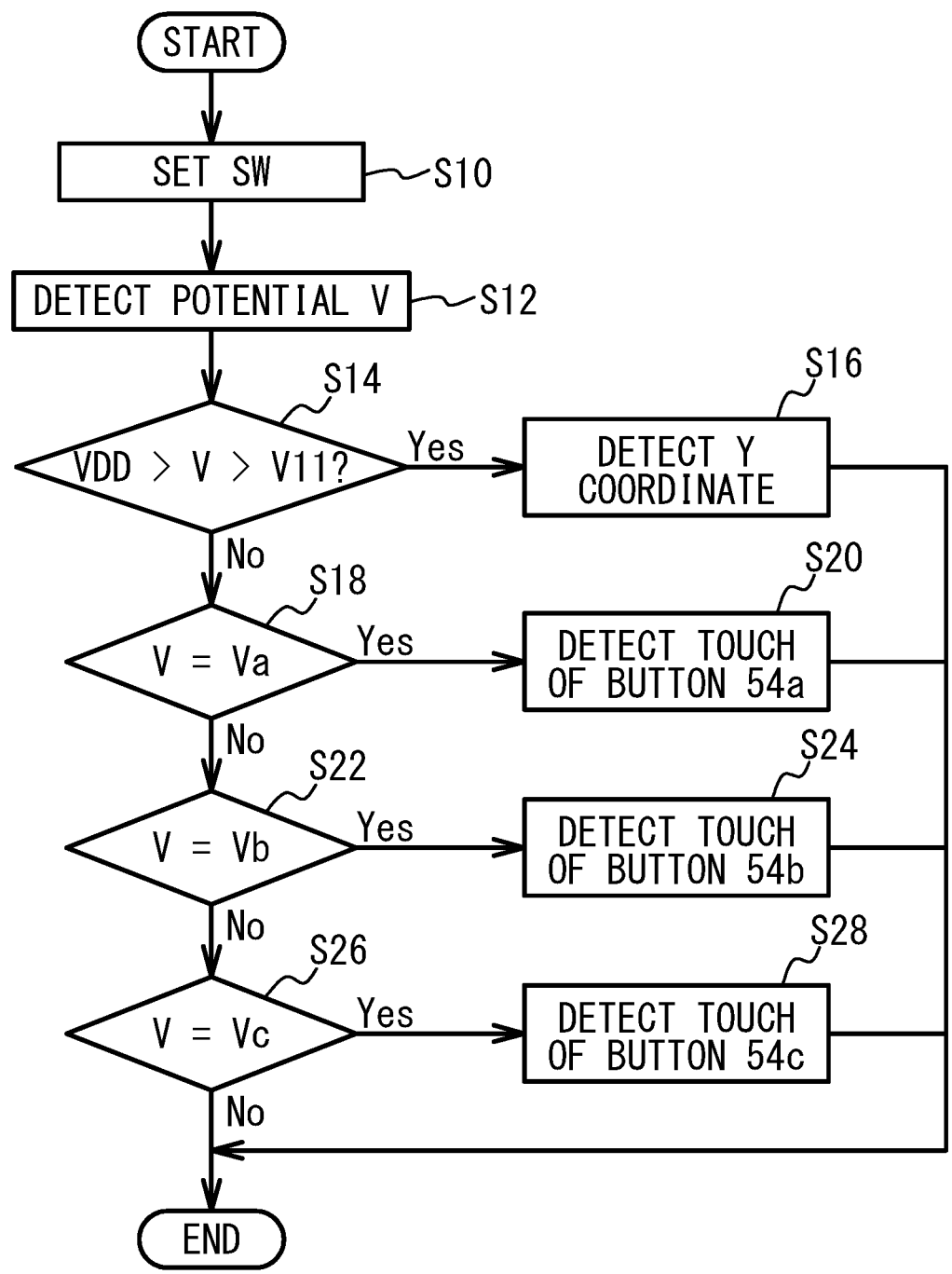
FIG. 37 is a flowchart illustrating a process of the control unit according to the sixth embodiment.

FIG. 37 is a flowchart illustrating a process of the control unit according to the sixth embodiment. As illustrated in FIG. 37, the control unit 30 sets the switches SW1 to SW4 (S10). Thereby, the electrodes 12 and 13 are connected to the power supply 36 and the ground 35, respectively. The electrodes 21 and 22 are connected to the floating and the detector 32, respectively. The control unit 30 causes the detector 32 to detect the voltage of the electrode 22 (the potential V of the conductive film 20), and acquires the detection result from the detector 32 (S12). The control unit 30 determines whether the potential V is lower than the potential V12 and higher than the potential V11 (S14). When the determination of S14 is Yes, the control unit 30 detects the Y coordinate of the touch position in the region 40 based on the potential V (S16).

When the determination of S14 is No, the control unit 30 determines whether the potential V is the potential Va or within an error range of the potential Va (S18). When the determination of S18 is Yes, the control unit 30 determines that the button 54a is touched (S20). When the determination of S18 is No, the control unit 30 determines whether the potential V is the potential Vb or within an error range of the potential Vb (S22). When the determination of S22 is Yes, the control unit 30 determines that the button 54b is touched (S24). When the determination of S22 is No, the control unit 30 determines whether the potential V is the potential Vc or within an error range of the potential Vc (S26). When the determination of S26 is Yes, the control unit 30 determines that the button 54c is touched (S28). When the determination of S26 is No, the process is completed. Here, the order of steps S14, S18, S22 and S26 can be set freely.

Next, the detection of the X coordinate of the touch position in the region 40 will be described. The control unit 30 causes the switch SW1 to connect the electrode 12 to the detector 32, the switch SW2 to float the electrode 13, the switch SW3 to connect the electrode 21 to the power supply 36, and the switch SW4 to connect the electrode 22 to the ground 35. Thereby, the voltage of the conductive film 20 decreases linearly from the electrode 21 to the electrode 22. The control unit 30 can detect the X coordinate of the touch position in the region 40 based on the potential detected by the detector 32.

Figure 38:
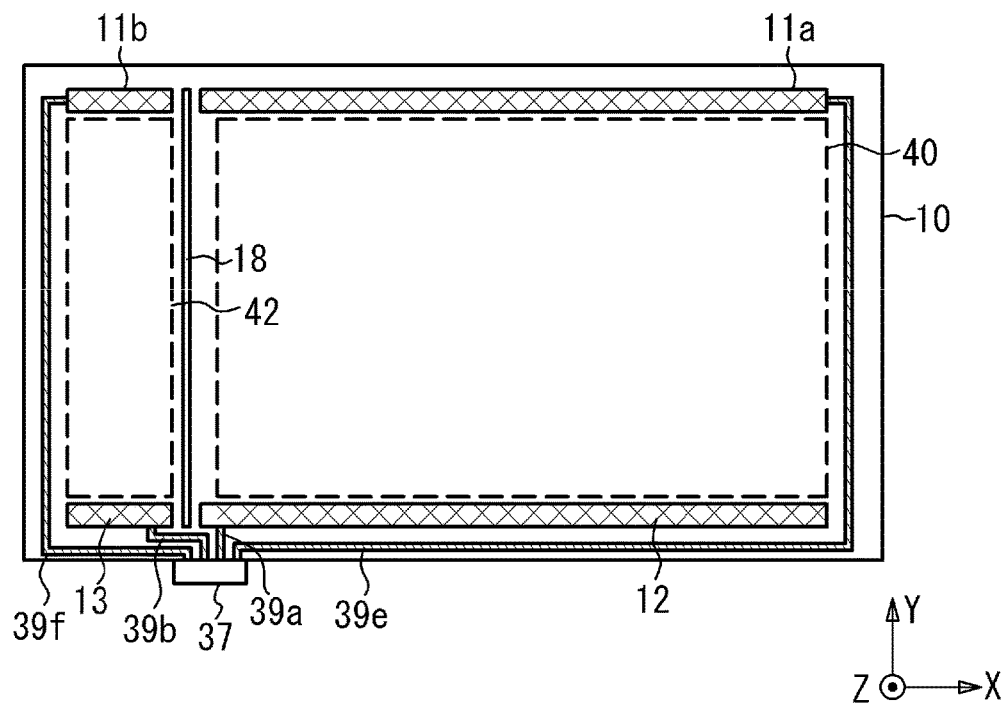
FIG. 38 is a plan view of the conductive film according to a comparative example.

FIG. 38 is a plan view of the conductive film according to a first comparative example. As illustrated in FIG. 38, the conductive film 10 is provided with the electrodes 11a and 12 so as to sandwich the region 40, and the electrodes 11b and 13 so as to sandwich the region 42. The conductive film 20 is the same as that of FIG. 31B of the sixth embodiment. The control unit detects the Y coordinate of the touch position in the region 40 using the electrodes 11a and 12, and detects the touch of buttons 54a to 54c in the region 42 using the electrodes 11b and 13. However, wirings 39e and 39f connected to the electrodes 11a and 11b are provided. Therefore, the size of the touch panel increases and the cost of the touch panel increases.

According to the sixth embodiment, the regions 40 and 42 are connected in series between the electrodes 12 and 13. Thereby, the potential of the conductive film 20 differs depending on which of the regions 40 and 42 is touched, as illustrated in FIG. 36. Therefore, it is possible to determine whether the touch position is in the region 40 or 42. As illustrated in FIG. 31A, the number of wirings 39a and 39b can be reduced compared with the wirings 39a, 39b, 39e, and 39f in FIG. 38, thus reducing the size and the cost of the touch panel.

As illustrated in FIG. 33, the plurality of electrodes 14a to 14e are connected in series between the electrodes 11 and 13 in the region 42 via the conductive film 10 in the plurality of gaps 34a to 34d. The buttons 54a to 54c electrically connect the conductive film 10 in the regions 33a to 33c between the two adjacent gaps 34a and 34b, between the two adjacent gaps 34b and 34c, and between the two adjacent gaps 34c and 34d among the gaps 34a to 34d, to the electrode 12, respectively. Thereby, the conductive film 20 in the gaps 34a to 34d functions as the resistors R2 to R5 in FIG. 35. As illustrated in FIG. 36, the regions 33a to 33c are regions in which the potential is substantially constant. Therefore, by providing the buttons 54a to 54c in the regions 33a to 33c, the touch of the buttons 54a to 54c can be detected with high accuracy.

Even if one or more buttons 54a to 54c are provided, the touch of the buttons 54a to 54c can be detected by connecting the regions 33a to 33c in series between the electrodes 11 and 13 via the conductive film 10 in three or more gaps 34a to 34d.

As in S10 of FIG. 37, the control unit 30 applies the voltage between the electrodes 12 and 13. As in S14 and S16, when the potential of the conductive film 20 is closer to the potential of the electrode 12 than the potential of the electrode 11, the control unit 30 detects the contact position of the conductive films 10 and 20 in the Y direction in the region 40 based on the potential of the conductive film 20. Thereby, the control unit 30 can detect the Y coordinate of the contact position. As in S18 to S28, when the potential of the conductive film 20 is closer to the potential of the electrode 13 than the potential of the electrode 11, the control unit 30 detects the on/off of the buttons 54a to 54c based on the potential of the conductive film 20. Thereby, the control unit 30 can detect the touch of the buttons 54a to 54c. The predetermined values can be used as the potentials of the electrodes 11, 12 and 13 in FIG. 37.

As illustrated in FIG. 31A, the slit 18 in which the conductive film 10 is not provided is provided between the regions 40 and 42. Thereby, the regions 40 and 42 can be connected in series between the electrodes 12 and 13. From the viewpoint of connecting the regions 40 and 42 in series, it is preferable that the slit 18 is provided from the electrode 11 to the side of the conductive film 10 in the −Y direction. However, the slit 18 may not reach the electrode 11 from the viewpoint of the alignment of the electrode 11 and the slit 18. Further, from the viewpoint of providing the wiring 39a or 39b on the conductive film 10, the slit 18 may not reach the side of the conductive film 10 in the −Y direction. The current flowing between the electrodes 12 and 13 via the series path 46 of FIG. 31A should be sufficiently larger than the current flowing between the electrodes 12 and 13 other than the series path 46.

As illustrated in FIG. 31B, the pair of electrodes 21 and 22 are provided so as to sandwich the region 40. Thereby, the potential of the conductive film 20 can be detected. In addition, the X coordinate of the touch position in the region 40 can be detected. The electrode 22 may be provided on the −X side of the region 42. However, if the electrode 22 is provided on the −X side of the region 42, the buttons 54a to 54c cannot be provided so as to overlap the electrode 22. For this reason, the buttons 54a to 54c are separated from an end of the −X side of the conductive film 10, and hence the size of the touch panel increases. Therefore, it is preferable to provide the electrode 22 between the regions 40 and 42. In this case, since the electrode 22 may overlap the slit 18 in a plan view, the touch panel 100 can be made smaller.

The resistance value between the electrodes 11 and 13 is preferably equal to or less than the resistance value between the electrodes 11 and 12. This makes it possible to increase a difference between the potential V11 of the electrode 11 and the potential VDD of the electrode 12 in FIG. 36. Therefore, the detection accuracy of the Y coordinate in the region 40 can be improved. The resistance value between the electrodes 11 and 13 is preferably ¹/₁₀ or more of the resistance value between the electrodes 11 and 12. This is because if the potential V11 is too low, the detection accuracy of the buttons 54a to 54c is reduced. Therefore, the resistance value between the electrodes 11 and 13 is preferably equal to or less than and 1/10 or more of the resistance value between the electrodes 11 and 12.

First Variation

FIG. 39 is an enlarged plan view of the touch panel according to a first variation of the sixth embodiment. As illustrated in FIG. 39, the planar shape of the gaps 34a to 34d is a V shape. In order to reduce the potential of the electrode 11 and improve the detection accuracy of the Y coordinate of the region 40, it is preferable to reduce the resistance value of the conductive film 10 in the gaps 34a to 34d. However, the distance of each of the gaps 34a to 34d in the Y direction is determined by the manufacturing accuracy of the electrode 14, and is 0.2 mm in one example. Further, the dimension of the region 42 in the X direction is determined by the dimension of the frame portion 56 in the X direction and cannot be unnecessarily increased. Therefore, the extension direction of each of the gaps 34a to 34d is tilted from the X direction. Thereby, the resistance value of the conductive film 10 in the gaps 34a to 34d can be reduced without narrowing the distance of each of the gaps 34a to 34d in the Y direction. An angle θ between the extension direction of each of the gaps 34a to 34d and the X direction is preferably 30 degrees or more, and preferably 45 degrees or less. The planar shape of the gaps 34a to 34d may be a straight line inclined with respect to the X direction, or may be a W shape.

Figure 40:
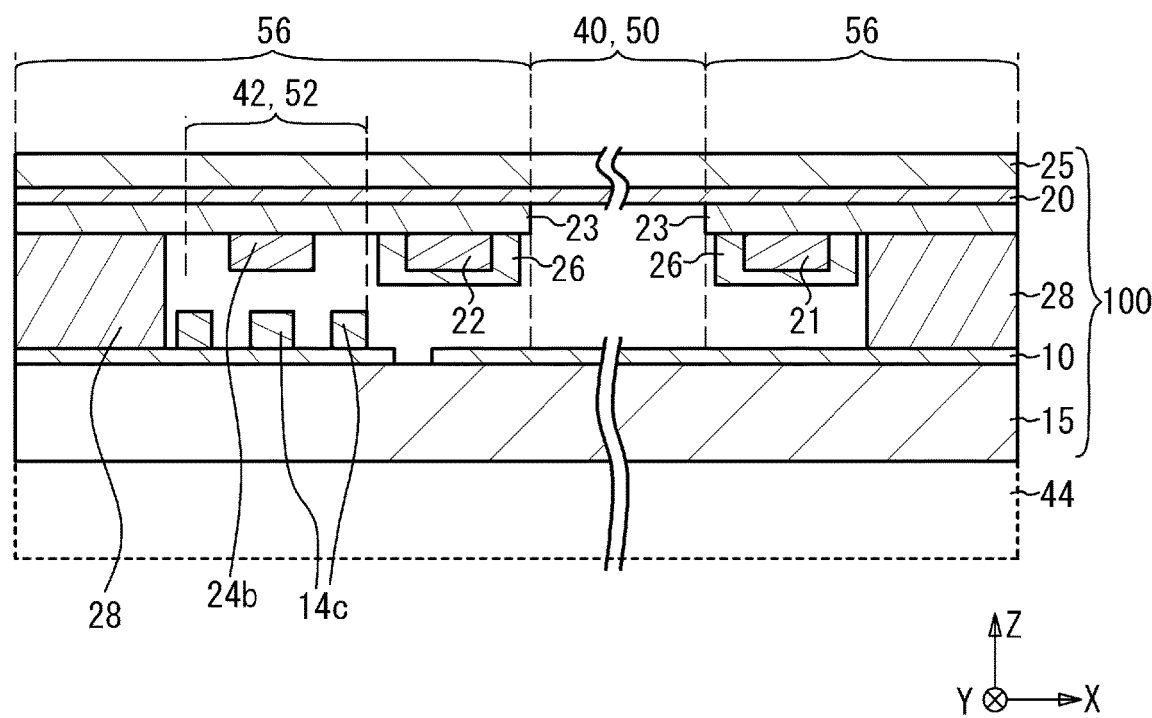
FIG. 40 is a cross-sectional view of the touch panel according to the first variation of the sixth embodiment.

FIG. 40 is a cross-sectional view of the touch panel according to the first variation of the sixth embodiment. FIG. 40 is a cross-sectional view taken along the line A-A of FIG. 39. As illustrated in FIG. 40, when the button 54b is touched, the electrode 24b comes into contact with the electrode 14c. Thus, in the buttons 54a to 54c, the electrodes 24a to 24c may come into contact with the electrodes 14b to 14d, respectively. If the curvature of the conductive film 20 is increased in the vicinity of the bonding layer 28, the conductive film 20 may be damaged. When the touch panel is made smaller, the buttons 54a to 54c are provided in the vicinity of the bonding layer 28. Therefore, the conductive film 20 might be damaged by pressing the buttons 54a to 54c. In the first variation of the sixth embodiment, the electrodes 24a to 24c come in contact with the electrodes 14b to 14d, so that the deformation of the conductive film 20 becomes small as compared with the case where the electrodes 24a to 24c come in contact with the conductive film 10 as in the sixth embodiment, and damage to the conductive film 20 can be suppressed. Other configurations are the same as those of the sixth embodiment, and the description thereof will be omitted.

Second Variation

Figure 41:
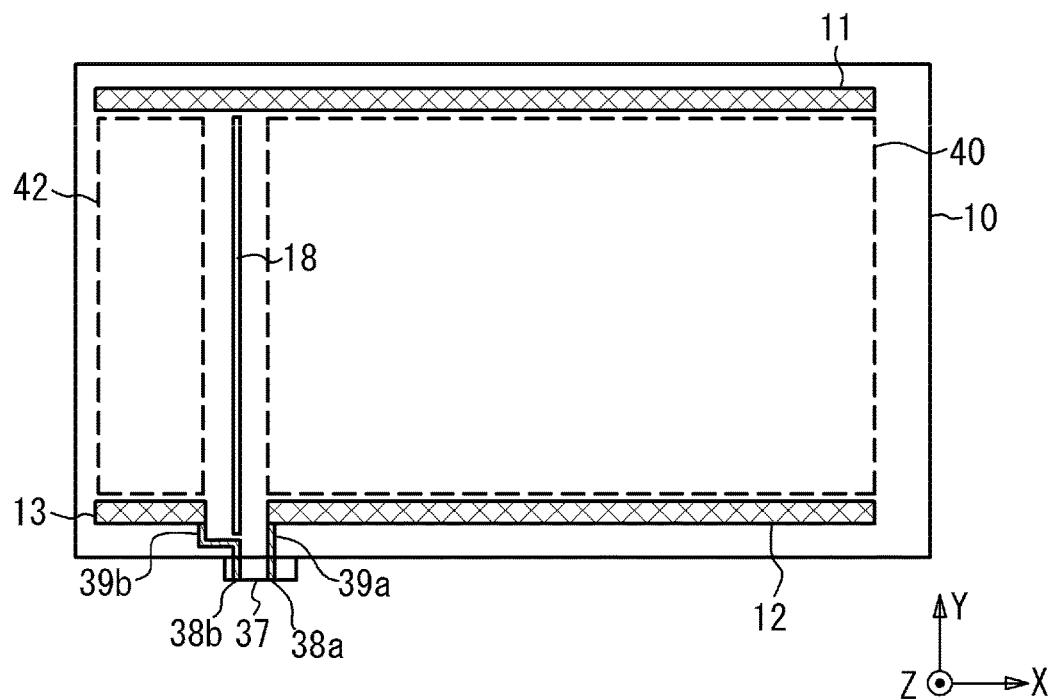
FIG. 41 is a plan view of the conductive film 10 according to a second variation of the sixth embodiment.

FIG. 41 is a plan view of the conductive film 10 according to a second variation of the sixth embodiment. As illustrated in FIG. 41, the electrode 14 is not provided in the second variation of the sixth embodiment. Even when the electrode 14 is not provided on the conductive film 10, the potential of the conductive film 10 between the electrodes 11 and 13 is inclined in the Y direction. Therefore, when the potential of the conductive film 20 is closer to the potential of the electrode 13 than the potential of the electrode 11, it is possible to detect which of the electrodes 24a to 24c come in contact with the conductive film 10 by detecting the potential of the conductive film 20. Other configurations are the same as those of the sixth embodiment, and the description thereof will be omitted.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various change, substitutions, and alterations could be made hereto without departing from the spirit and scope of the invention.

What is claimed is:

1. A touch panel device comprising:
    a first conductive film having a first region, a second region and a third region electrically separated from each other;
    a second conductive film laminated on the first conductive film across a gap;
    a first electrode formed on the first conductive film and electrically connected to a first terminal;
    a second electrode formed on the first conductive film, facing the first electrode across the first region, and electrically connected to a second terminal;
    a first switch in the second region and electrically connecting the first conductive film and the second conductive film;
    a second switch provided in the third region and electrically connecting the first conductive film and the second conductive film;
    a third electrode formed in the second region and electrically connected to a third terminal; and
    a fourth electrode formed in the third region and electrically connected to a fourth terminal.

2. A touch panel device comprising:
    a first conductive film having a first region and a second region arranged in a first direction;
    a first electrode formed on the first conductive film;
    a second electrode formed on the first conductive film and facing the first electrode across the first region in a second direction intersecting the first electrode;
    a third electrode formed on the first conductive film and facing the second electrode across the second region in the second direction; and
    a second conductive film laminated on the first conductive film across a gap;
    wherein the first region and the second region are electrically connected in series between the first electrode and the third electrode.

* * * * *